(12) United States Patent
Torii et al.

(10) Patent No.: US 9,349,600 B2
(45) Date of Patent: May 24, 2016

(54) SEMICONDUCTOR DEVICE MANUFACTURING METHOD AND SEMICONDUCTOR DEVICE

(71) Applicant: FUJITSU SEMICONDUCTOR LIMITED, Yokohama-shi, Kanagawa (JP)

(72) Inventors: Satoshi Torii, Kuwana (JP); Hideaki Matsumura, Kuwana (JP); Hikaru Kokura, Kuwana (JP); Etsuro Kawaguchi, Kuwana (JP); Katsuaki Ookoshi, Kuwana (JP); Yuka Kase, Kuwana (JP); Kengo Inoue, Mie (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/547,859

(22) Filed: Nov. 19, 2014

(65) Prior Publication Data

US 2015/0137211 A1 May 21, 2015

(30) Foreign Application Priority Data

Nov. 20, 2013 (JP) .................. 2013-240272

(51) Int. Cl.
*H01L 21/8242* (2006.01)
*H01L 31/00* (2006.01)
*H01L 21/28* (2006.01)
*H01L 29/423* (2006.01)
*H01L 29/66* (2006.01)
*H01L 27/115* (2006.01)

(52) U.S. Cl.
CPC ...... *H01L 21/28282* (2013.01); *H01L 27/1157* (2013.01); *H01L 27/11573* (2013.01); *H01L 27/11575* (2013.01); *H01L 29/4234* (2013.01); *H01L 29/66833* (2013.01)

(58) Field of Classification Search
CPC ............ H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
USPC ........... 257/20, 194, 135–136, 213–413, 900, 257/902–903; 438/136, 137, 156, 173, 192, 438/206, 212, 424, 427, 428, 591
See application file for complete search history.

(56) References Cited

U.S. PATENT DOCUMENTS

2007/0054453 A1 * 3/2007 Buh et al. ...................... 438/261

FOREIGN PATENT DOCUMENTS

JP 2010-258250 A 11/2010

*Primary Examiner* — Selim Ahmed
*Assistant Examiner* — Moin Rahman
(74) *Attorney, Agent, or Firm* — Westerman, Hattori, Daniels & Adrian, LLP

(57) ABSTRACT

A semiconductor device manufacturing method includes: forming an element isolation insulating film in a semiconductor substrate; forming a first film on a surface of the semiconductor substrate; forming a second film on the element isolation insulating film and on the first film; forming a first resist pattern that includes a first open above the element isolation insulating film in a first region; removing the second film on the element isolation insulating film in the first region to separate the second film in the first region into a plurality of parts by performing first etching; forming a third film on the second film in the first region; forming a first gate electrode on the third film in the first region; and forming a first insulating film that includes the first to third films under the first gate electrode by patterning the first to third films.

8 Claims, 45 Drawing Sheets

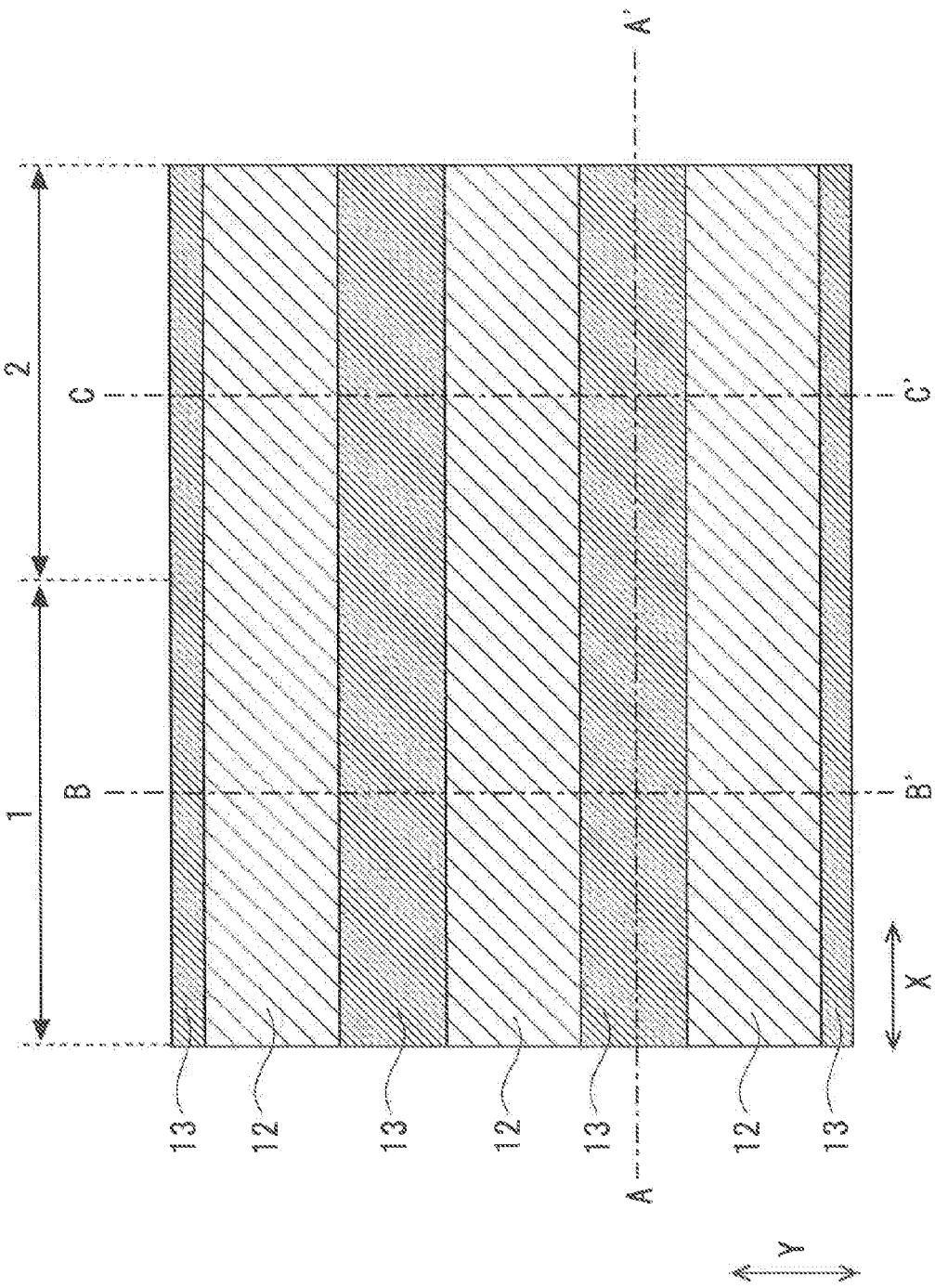

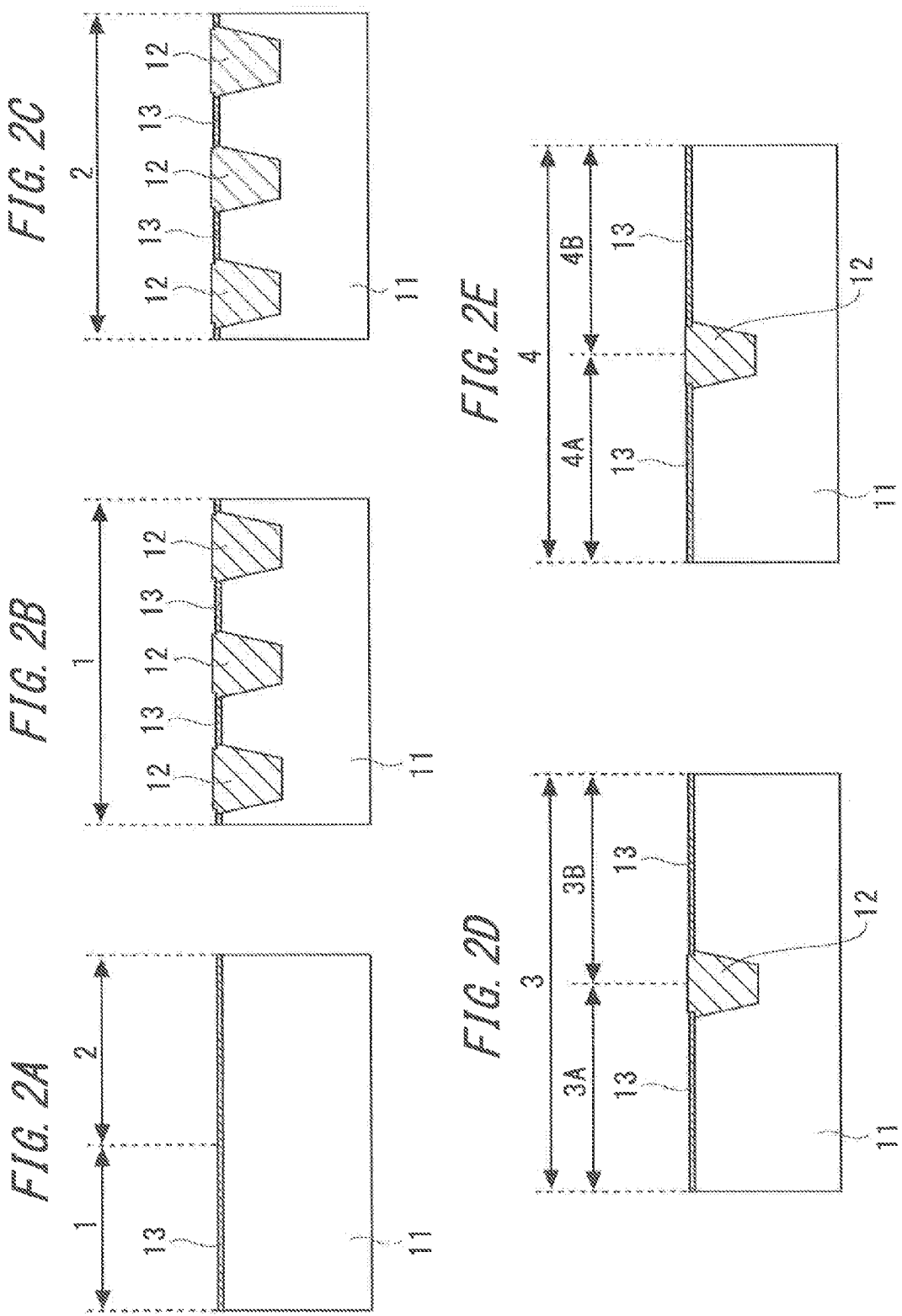

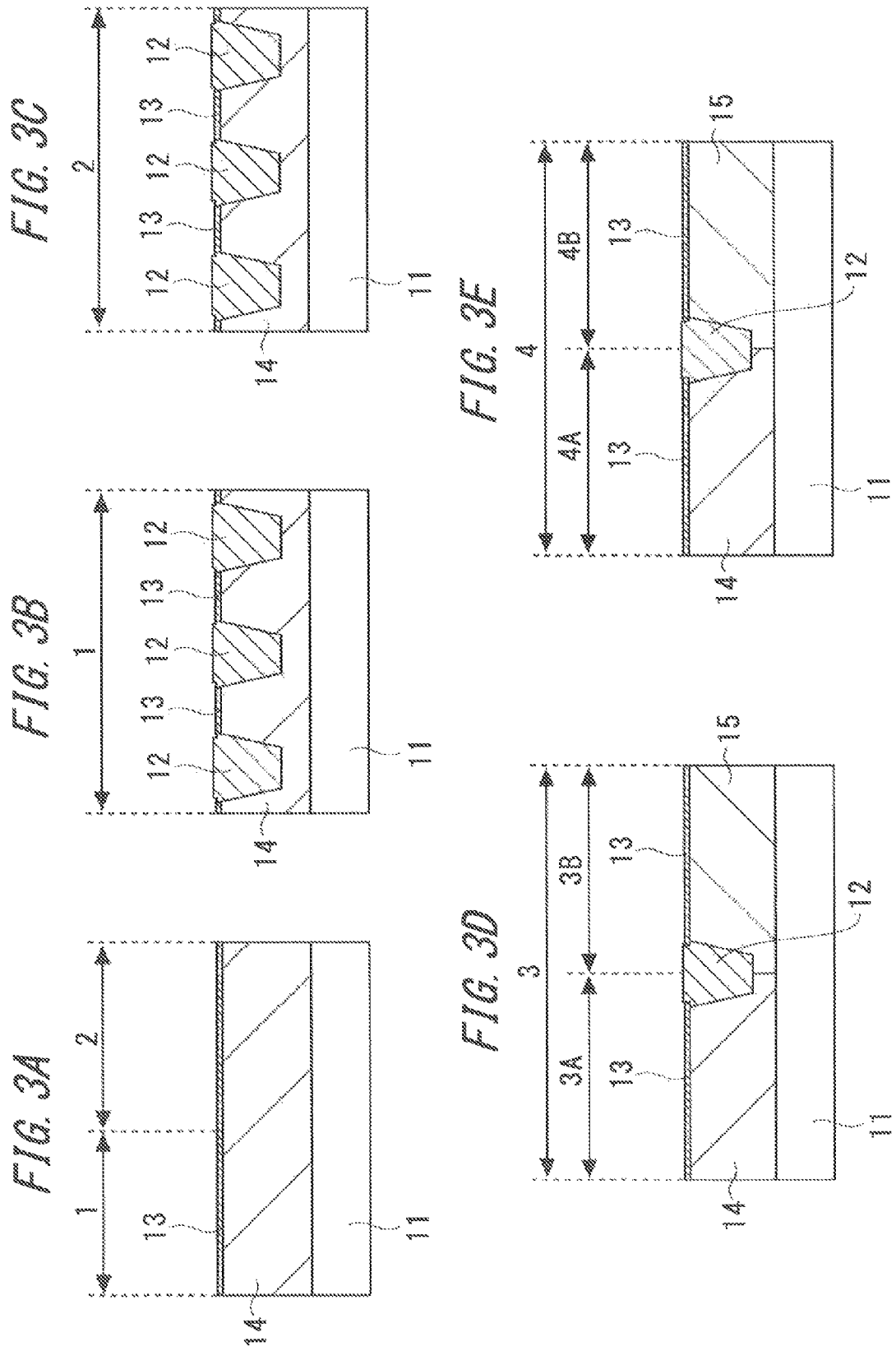

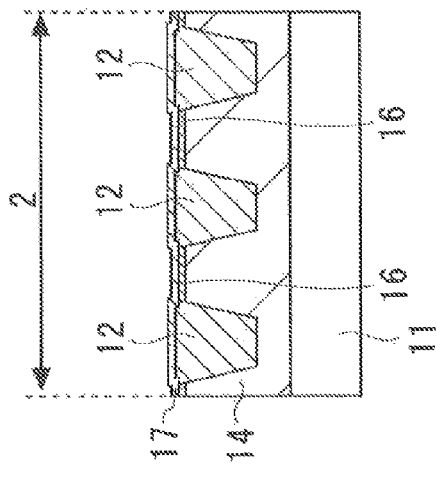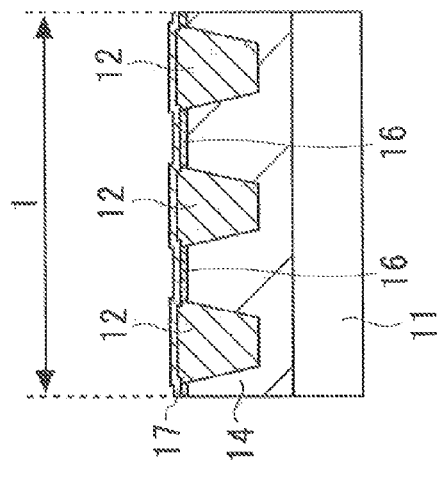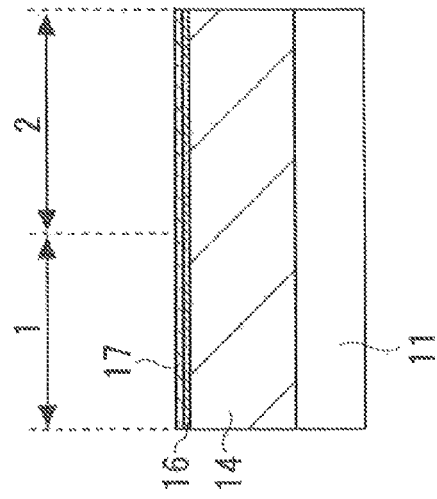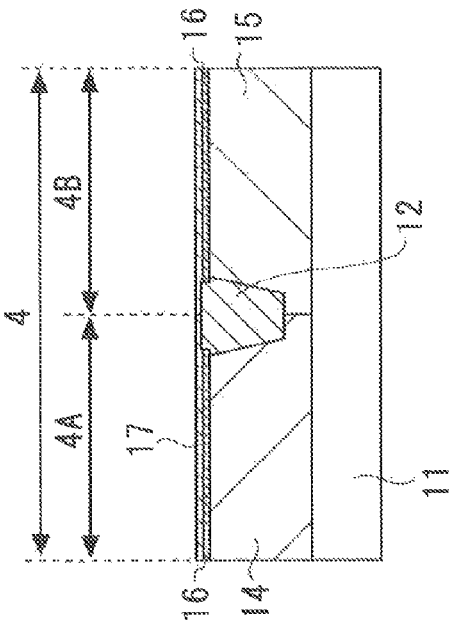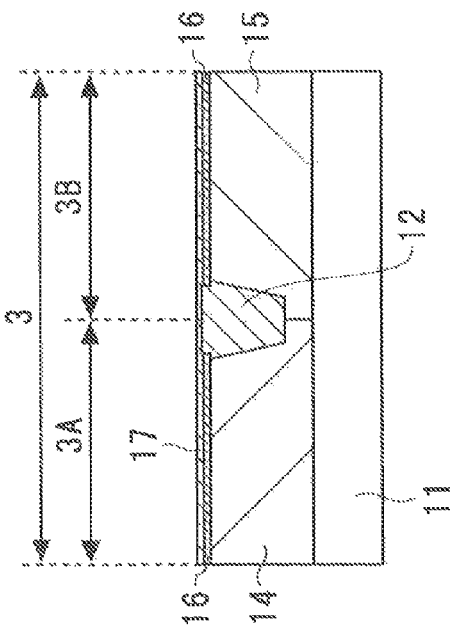

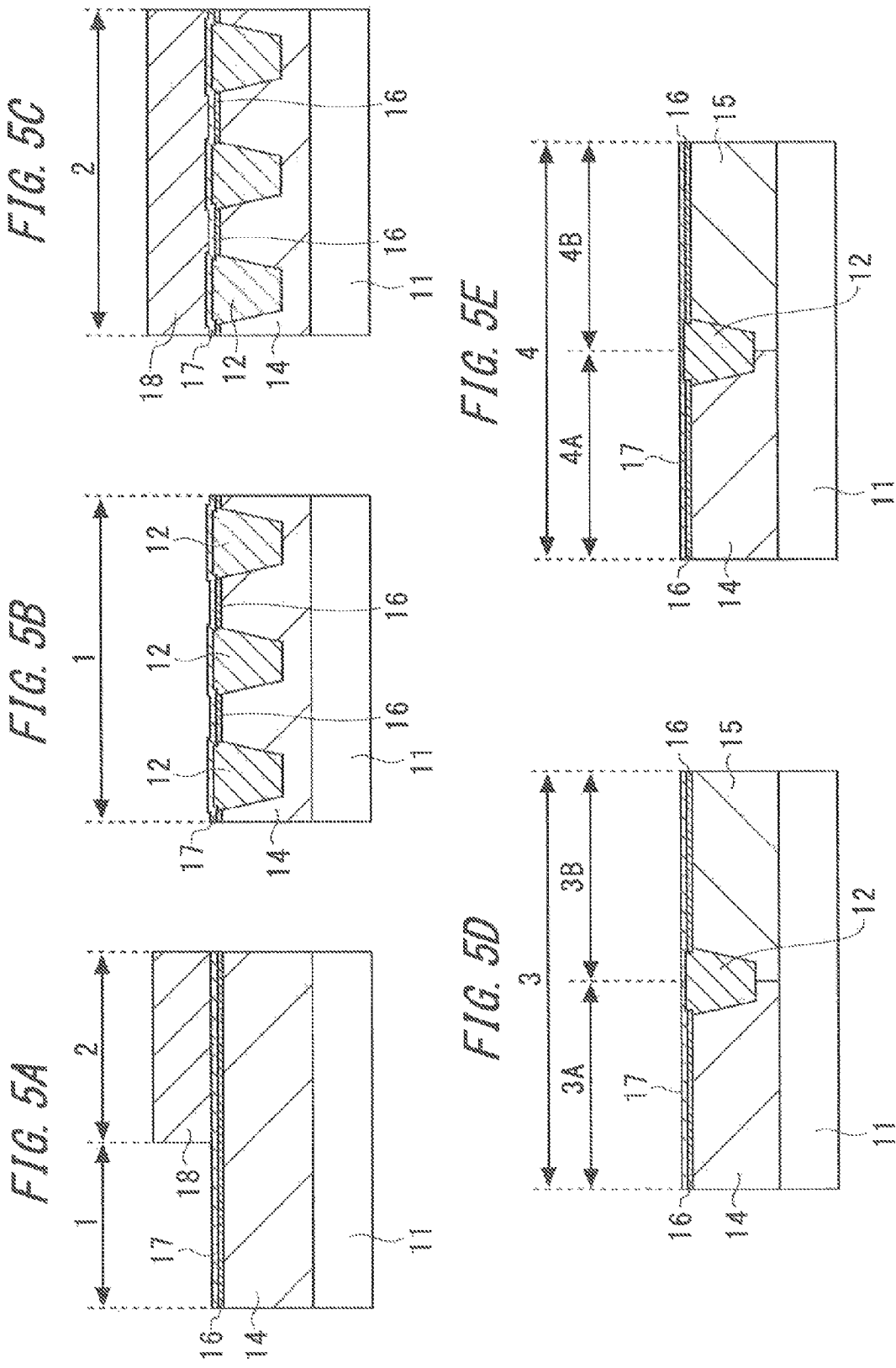

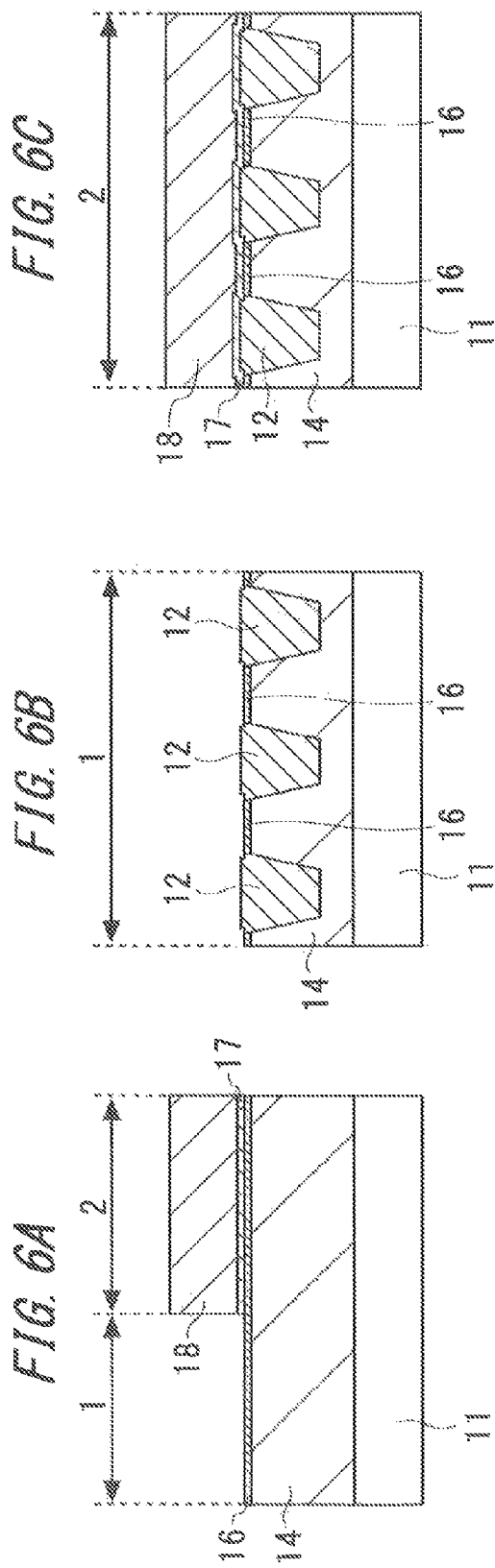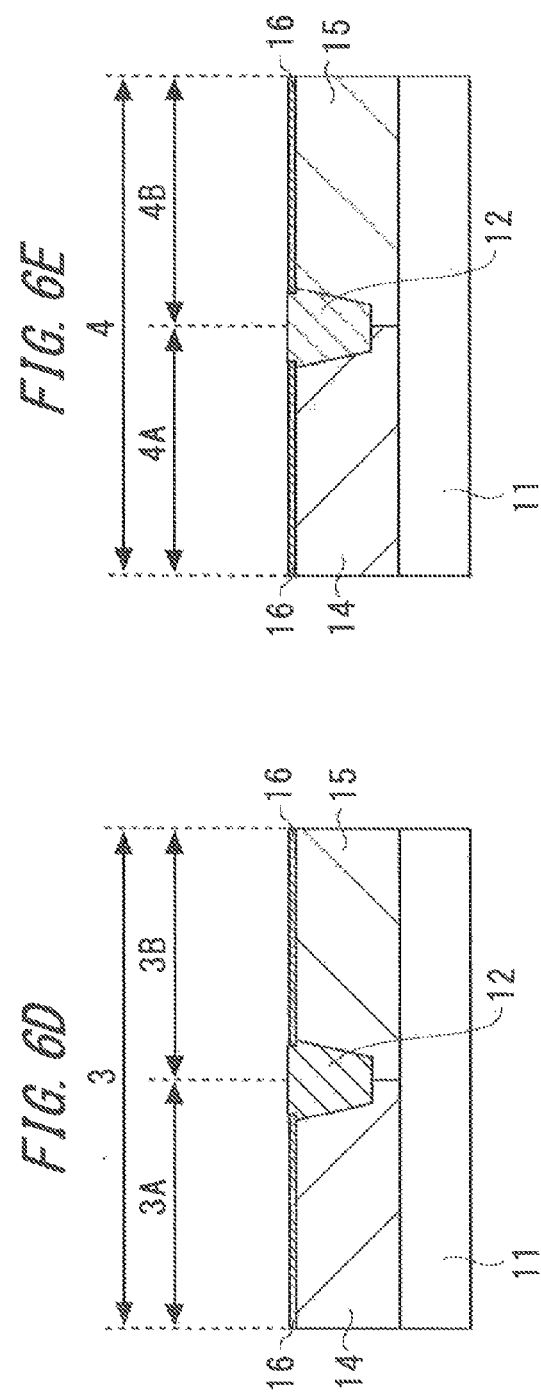

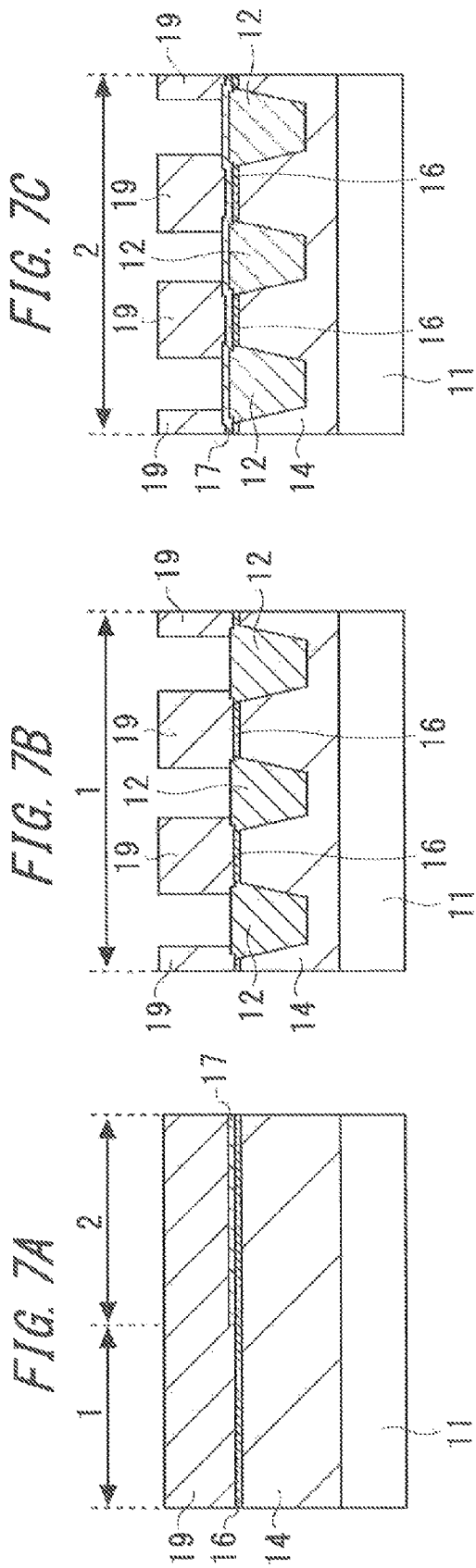

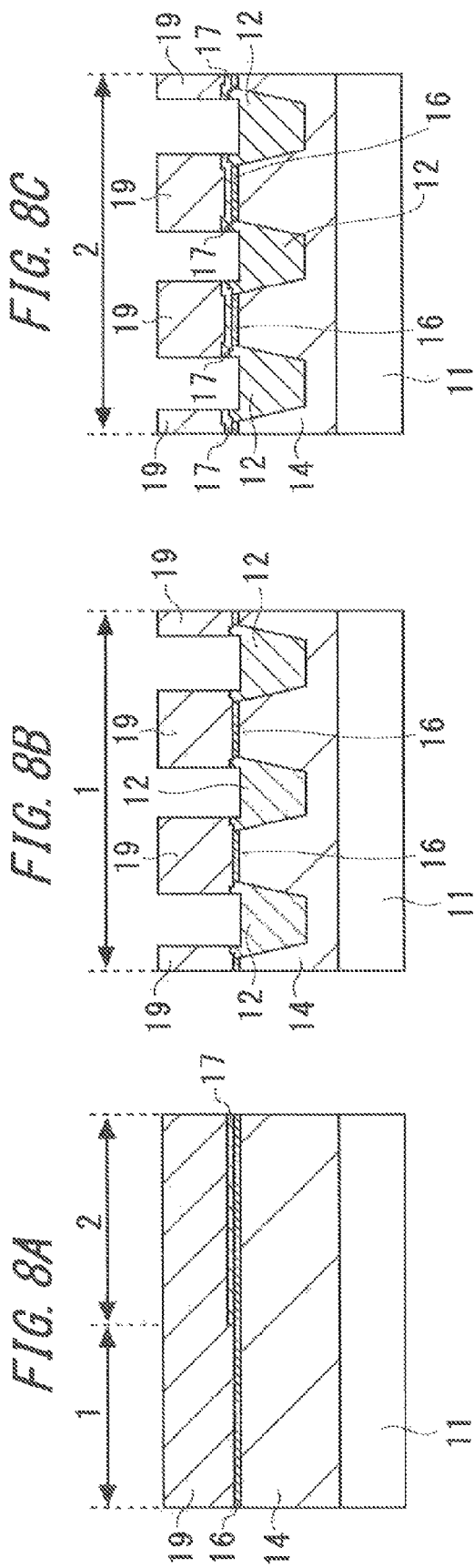

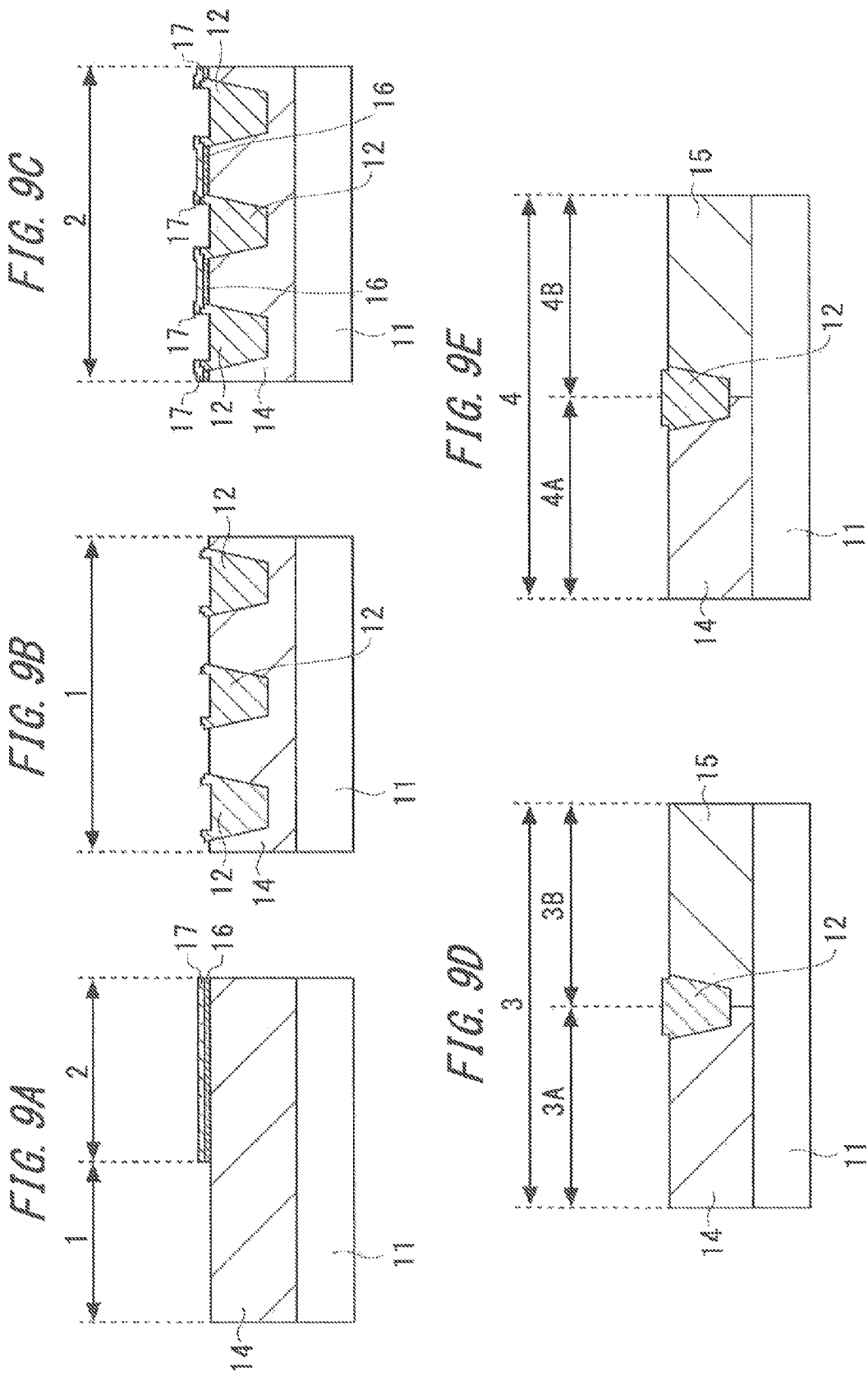

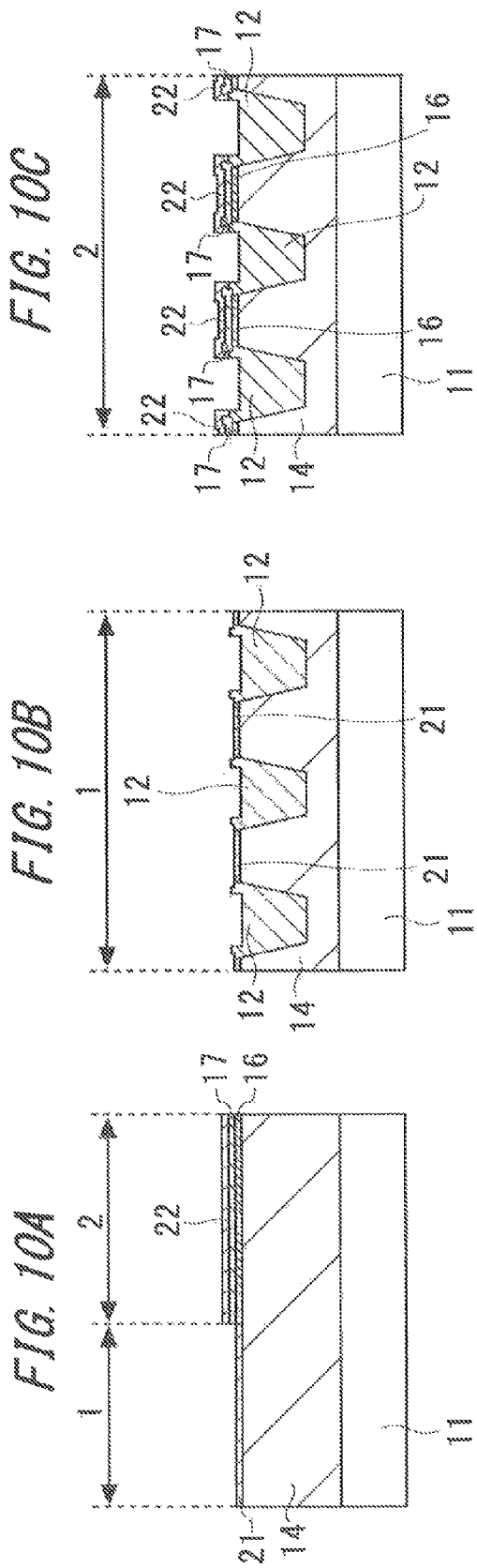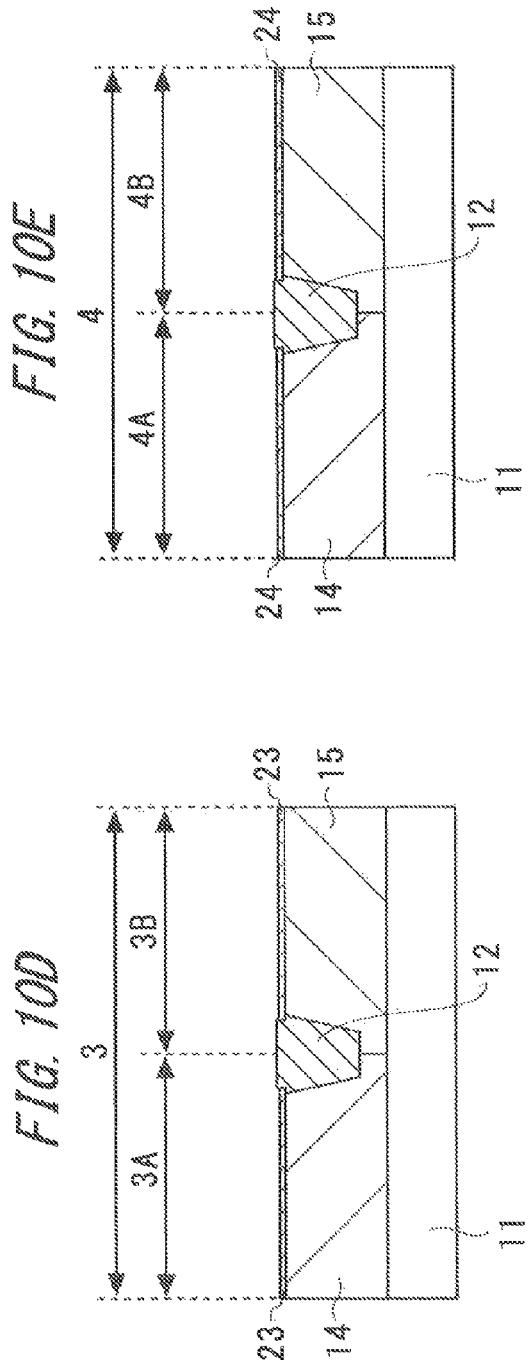

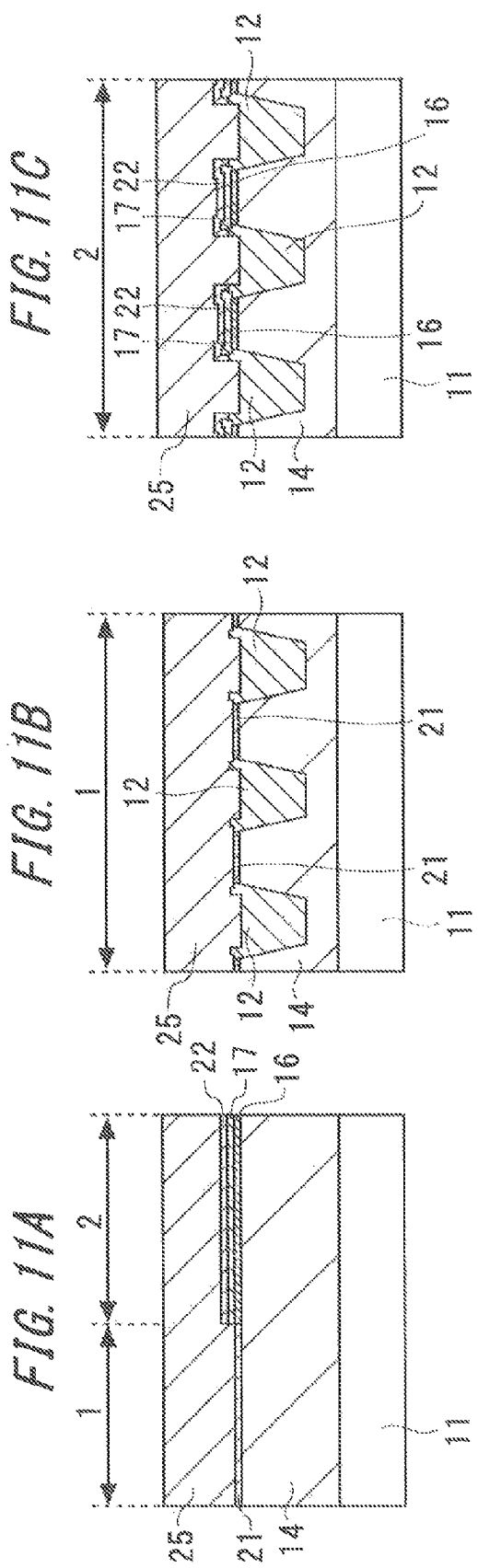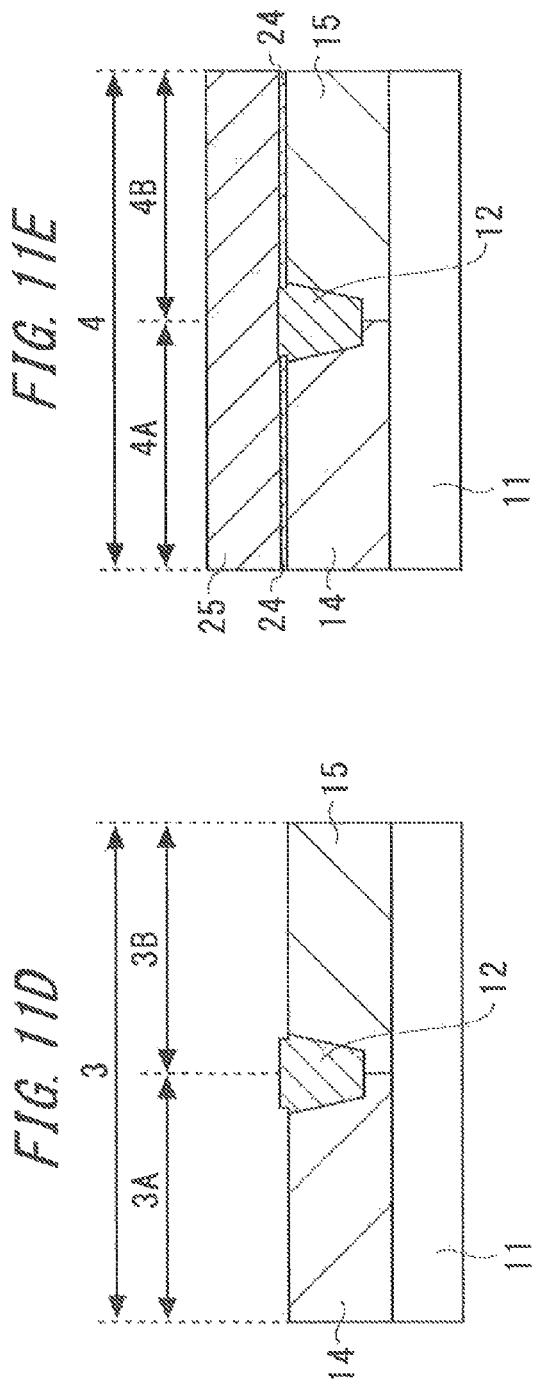

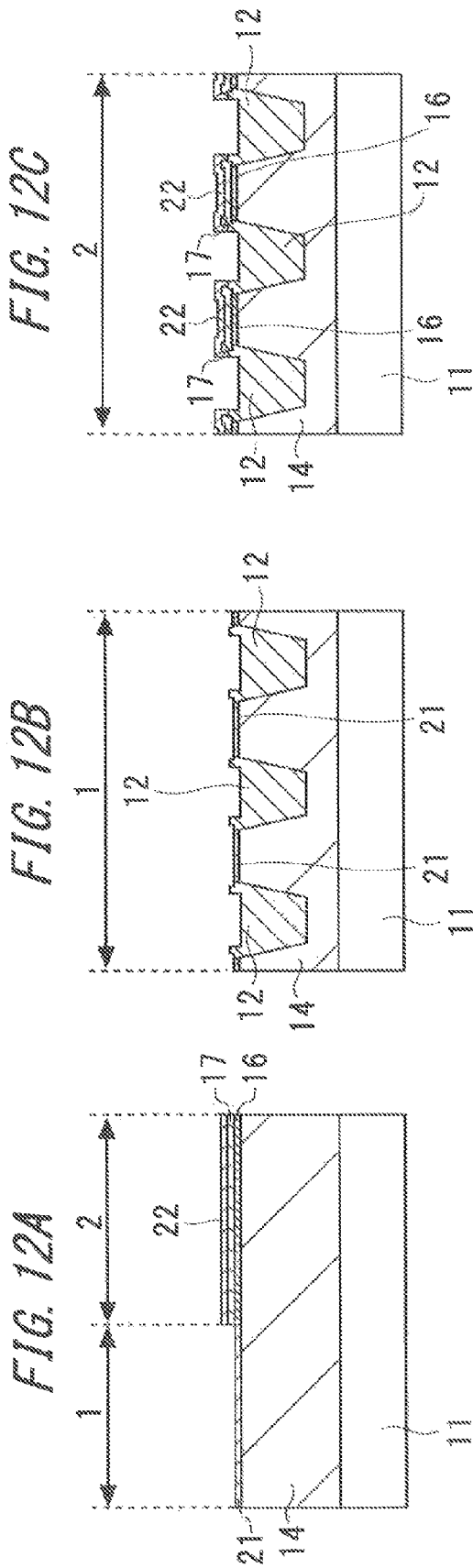

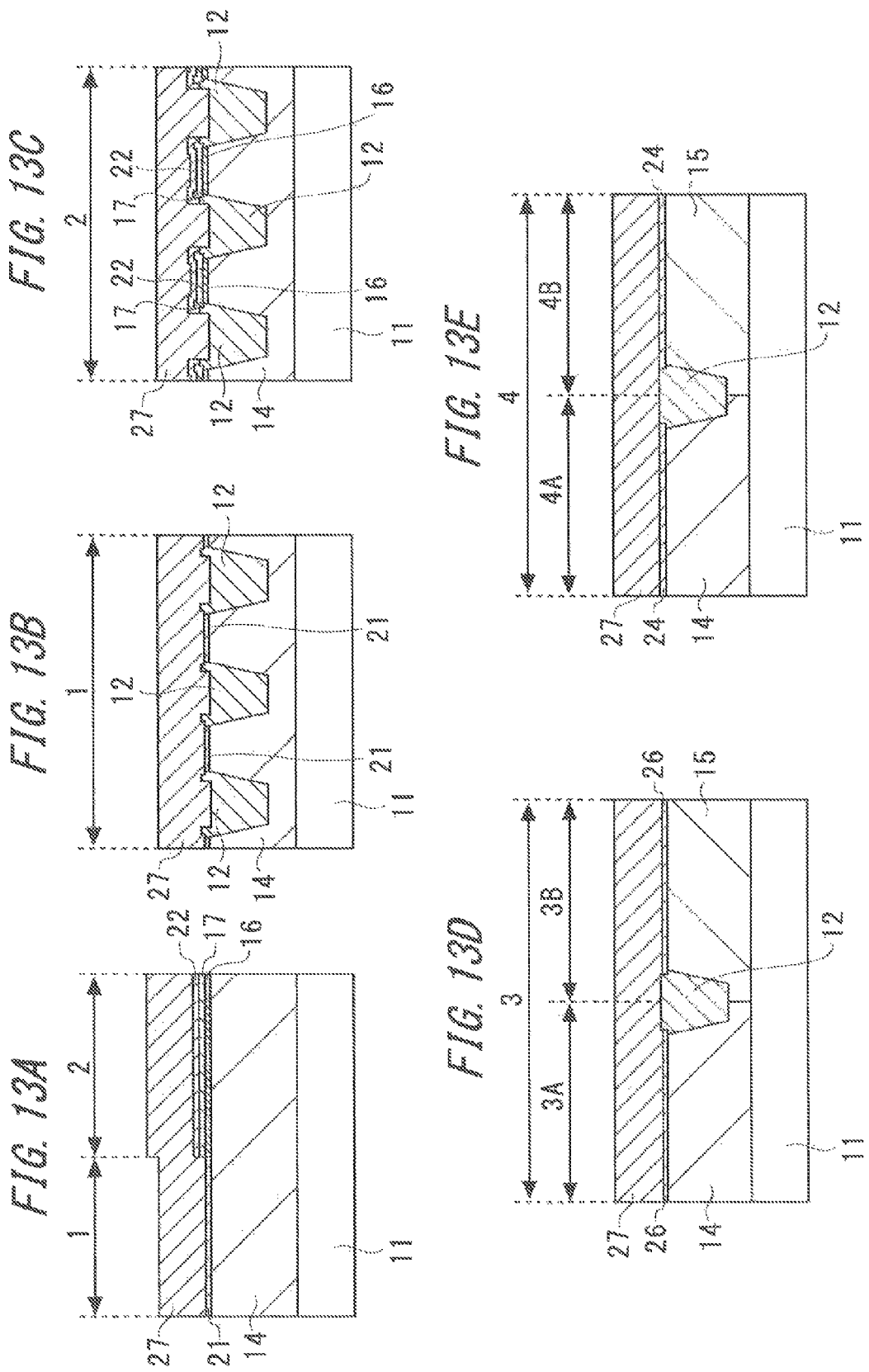

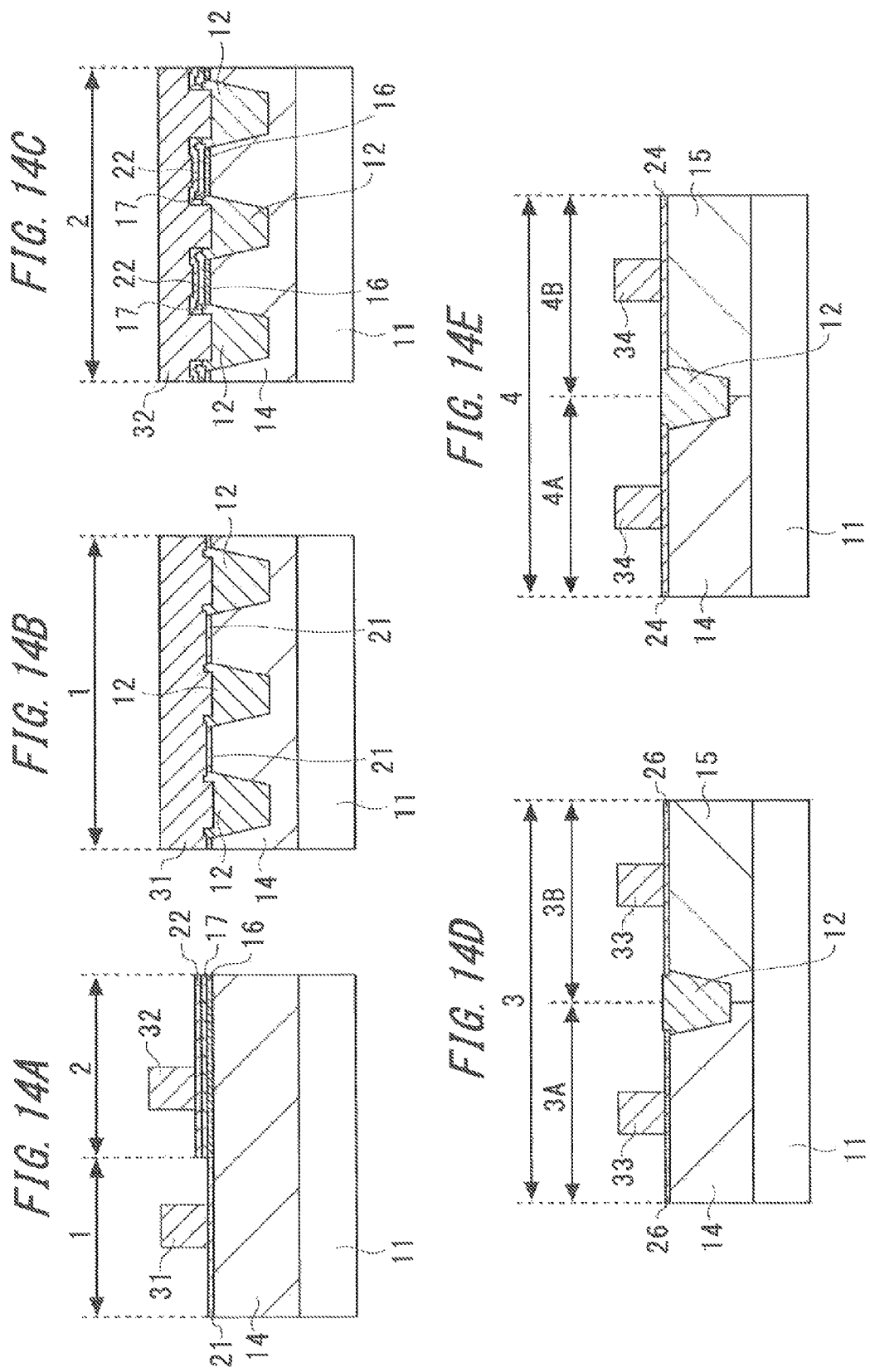

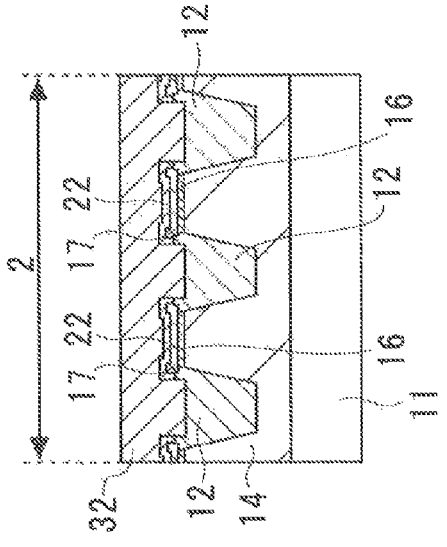
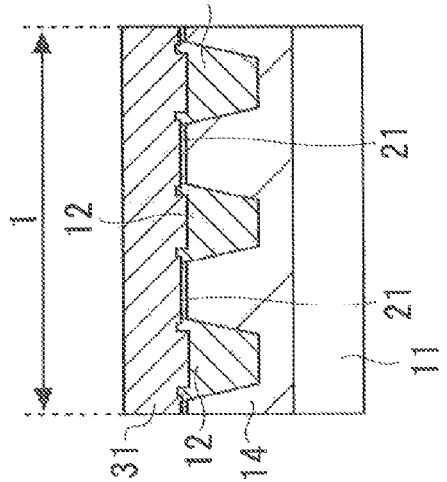
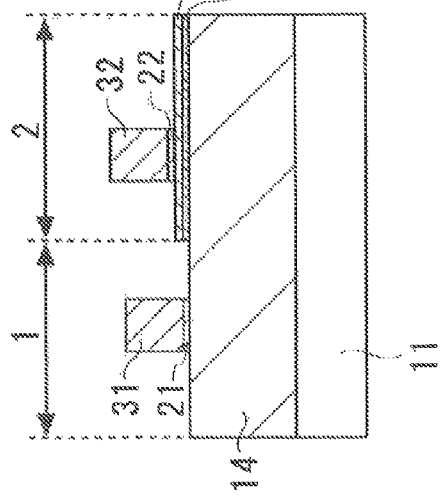
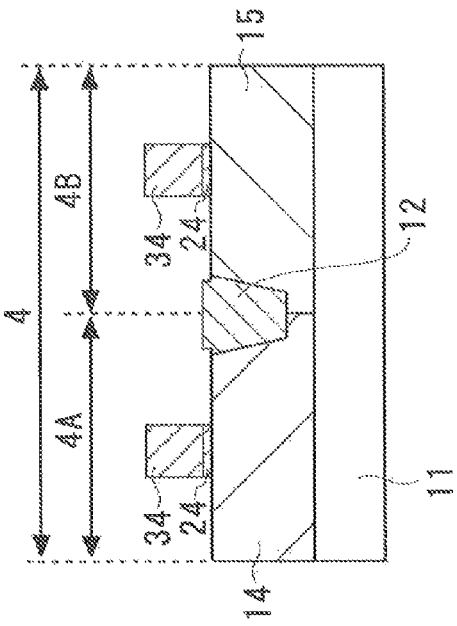
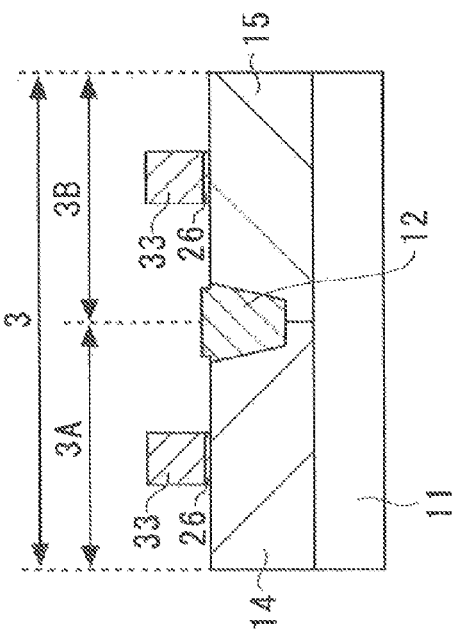

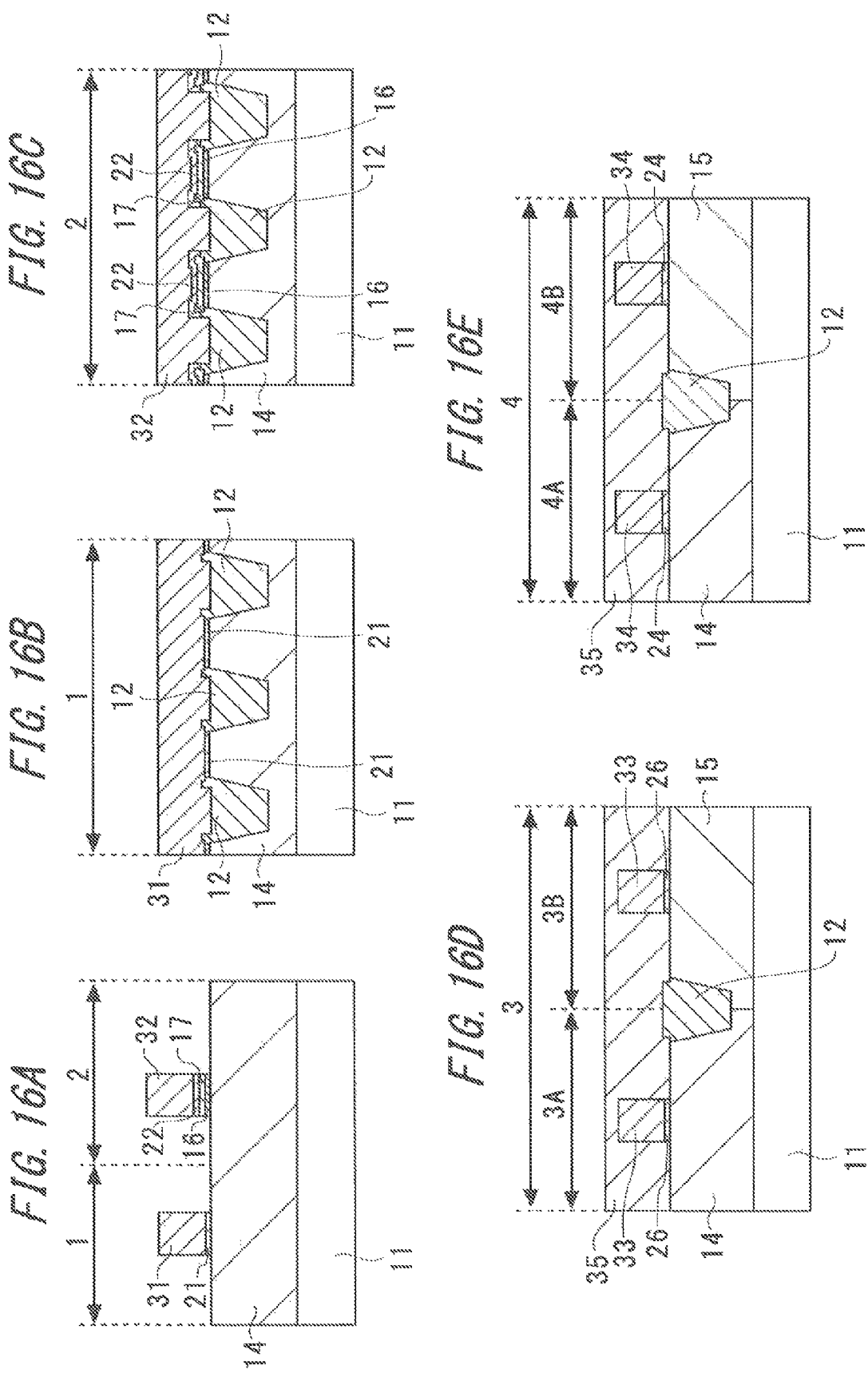

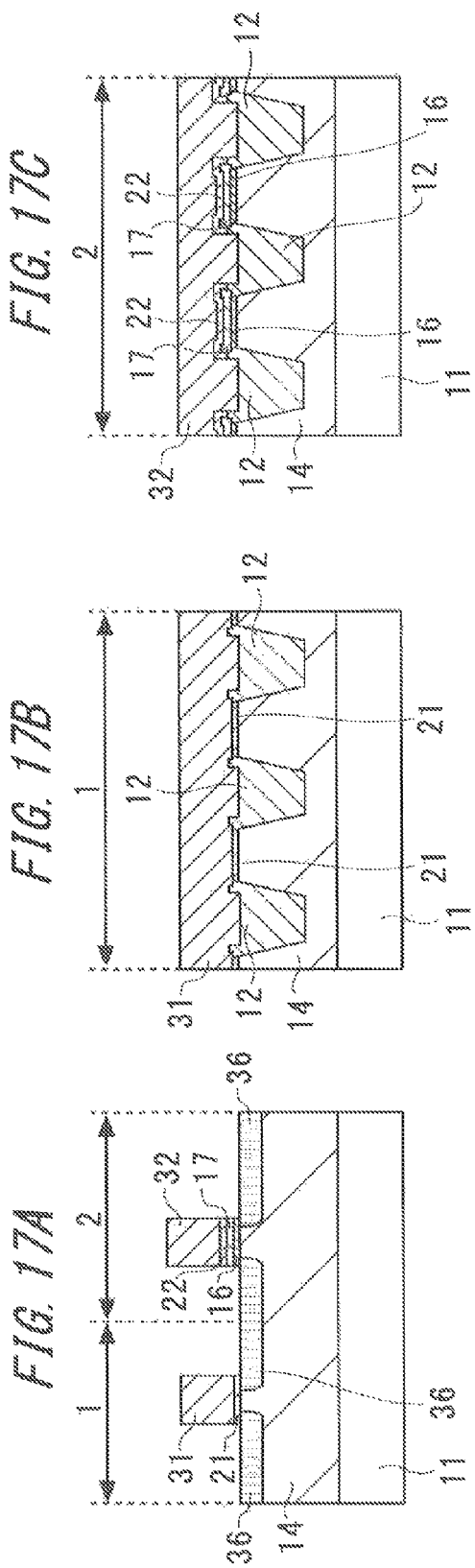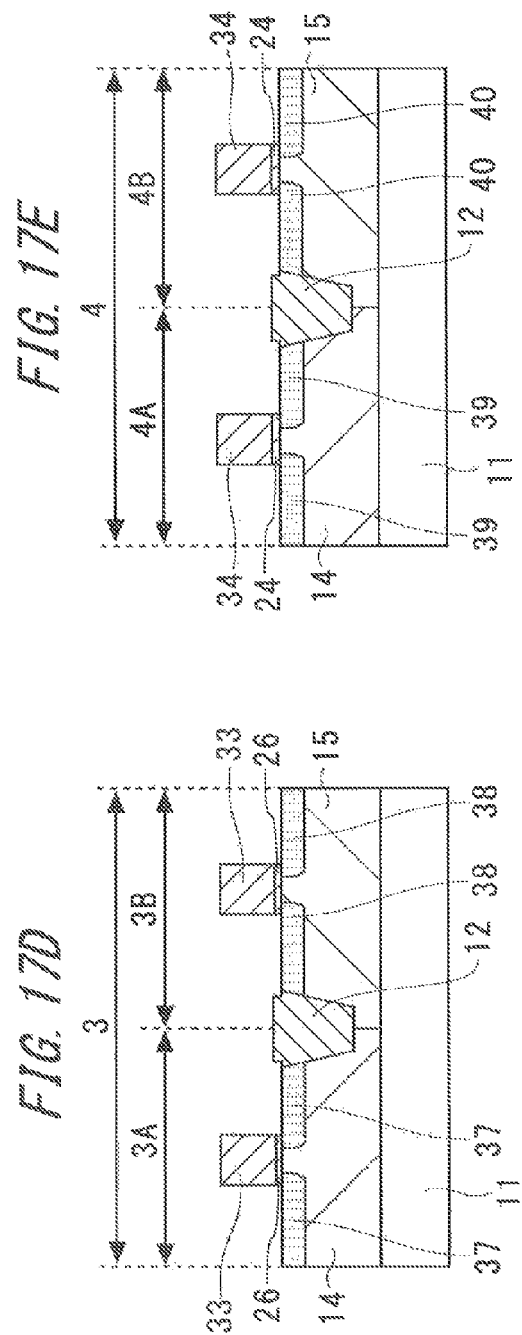

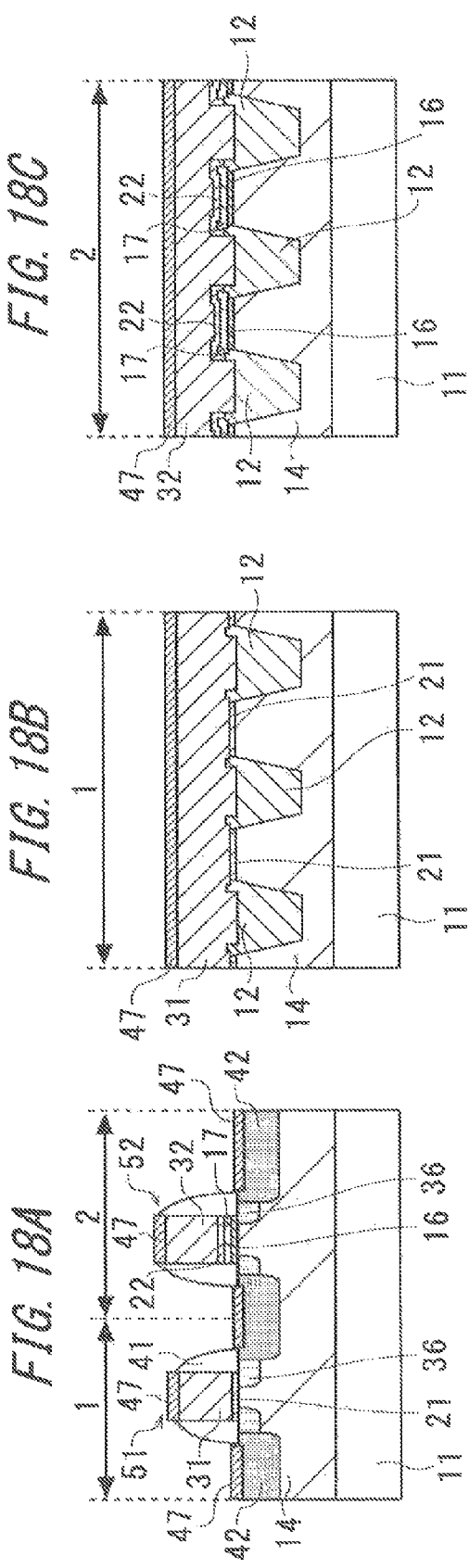
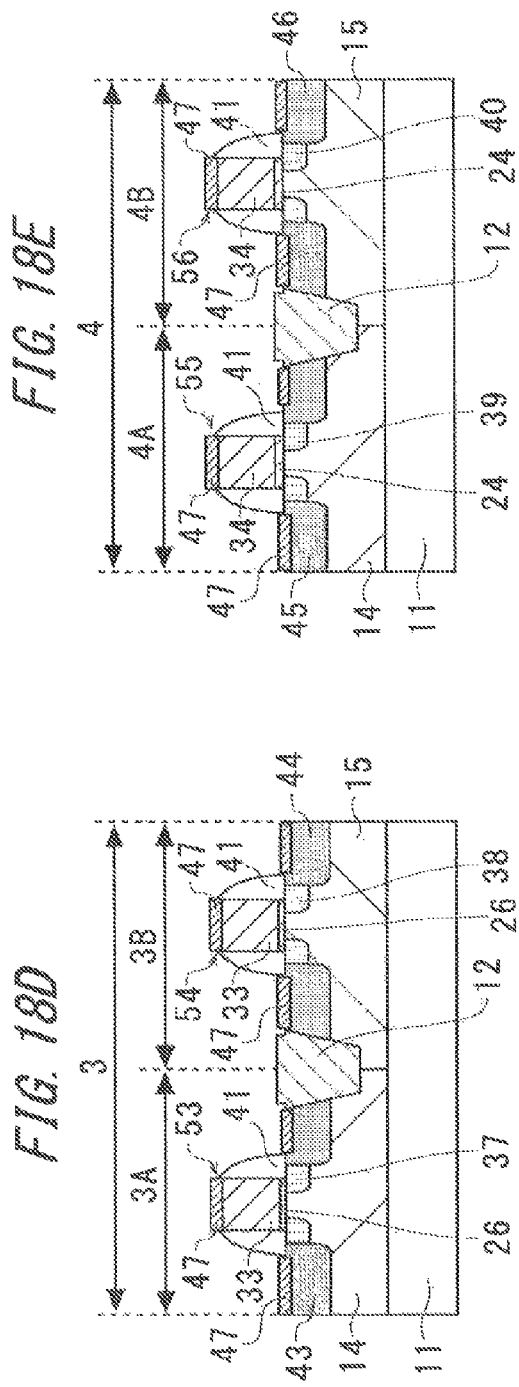

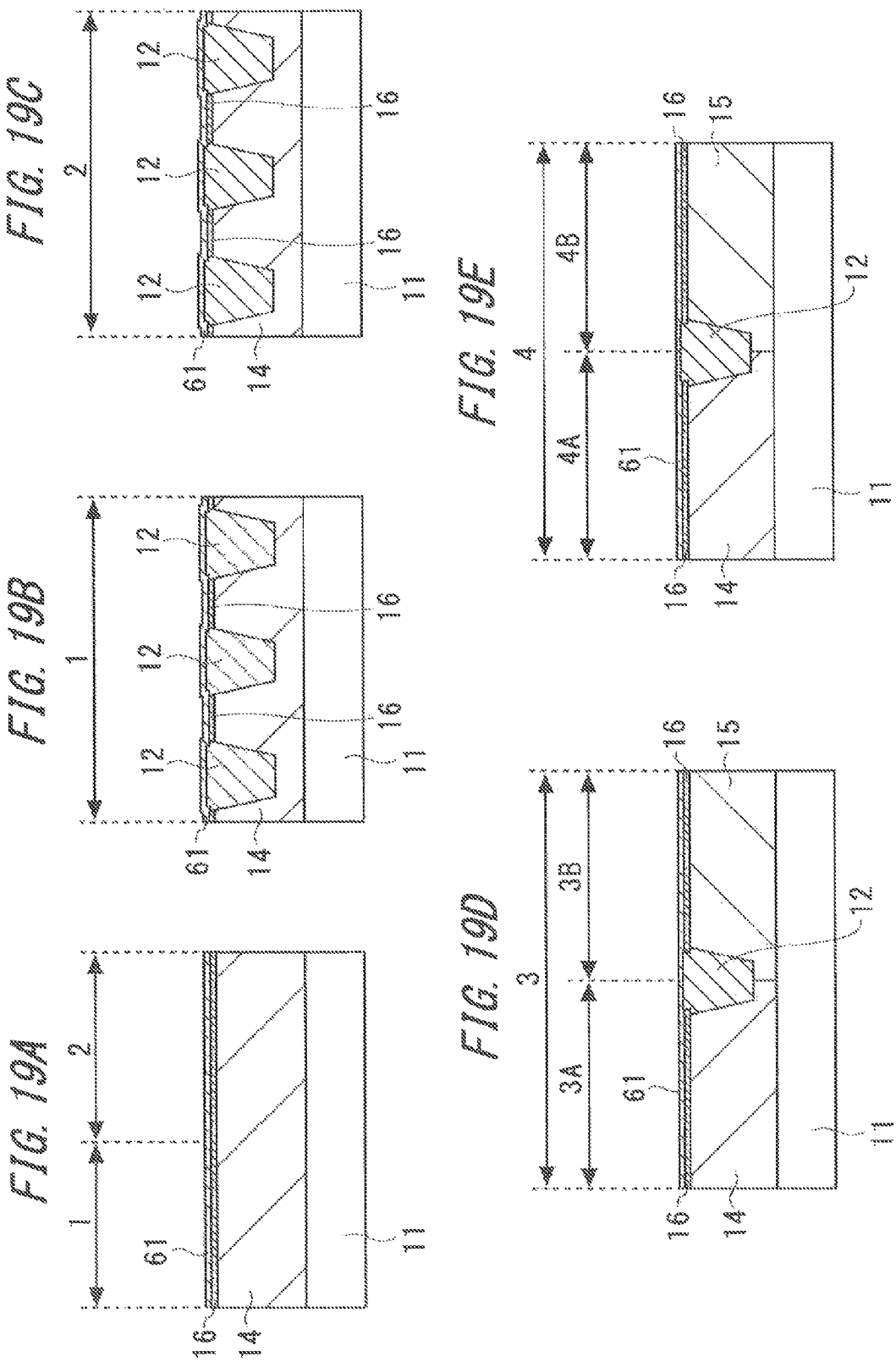

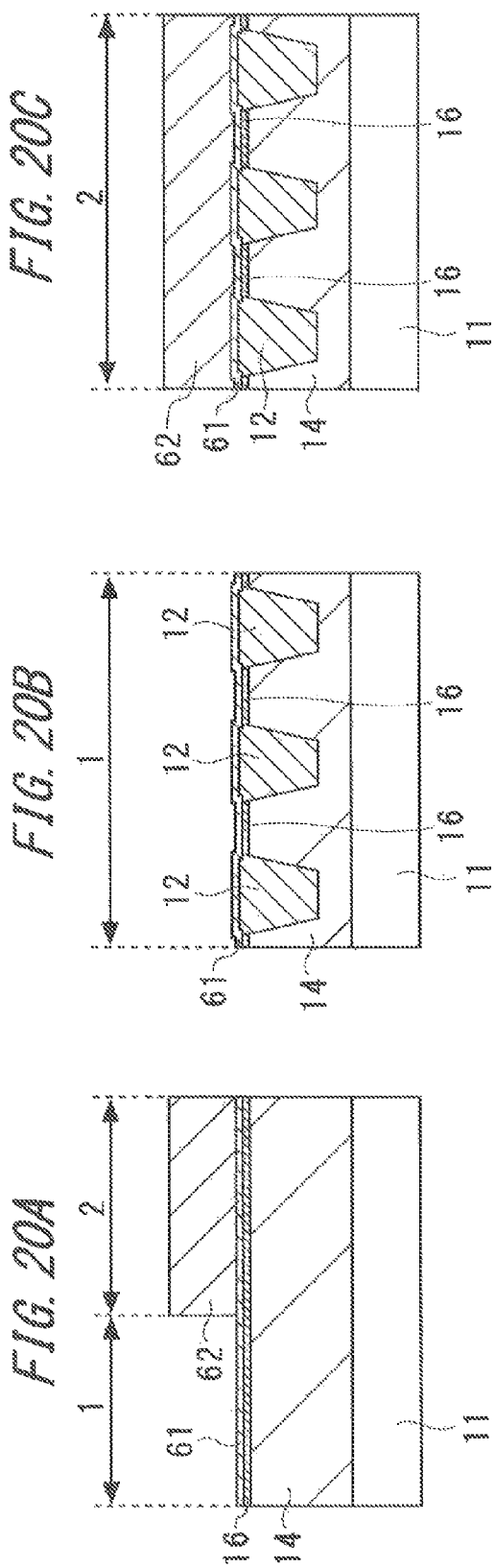
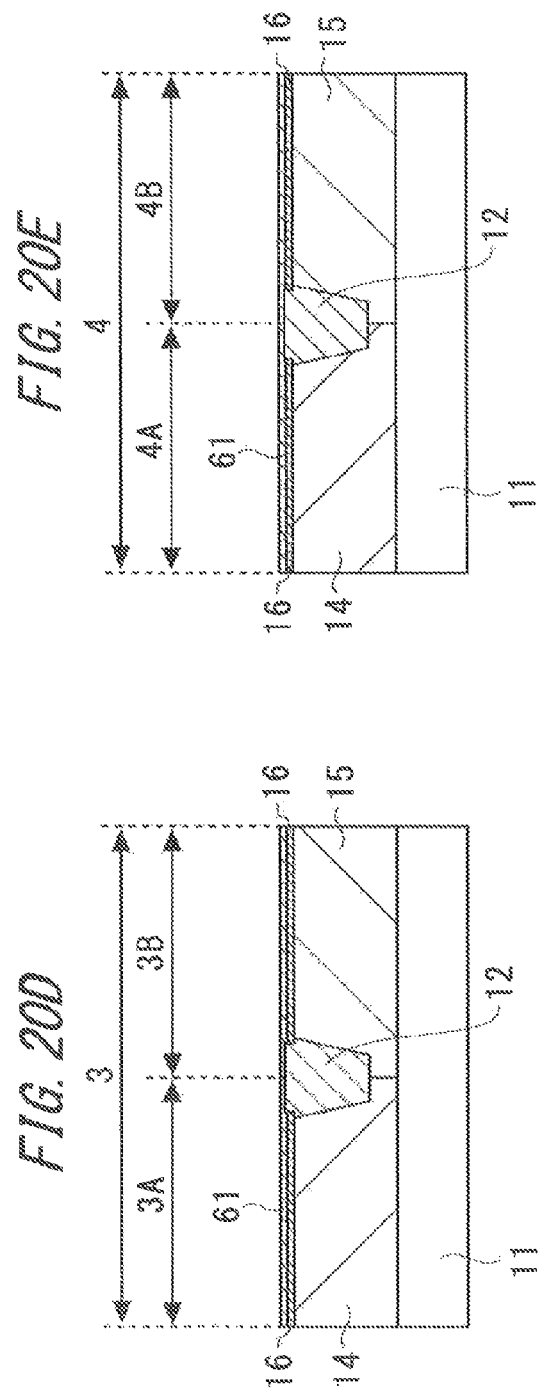

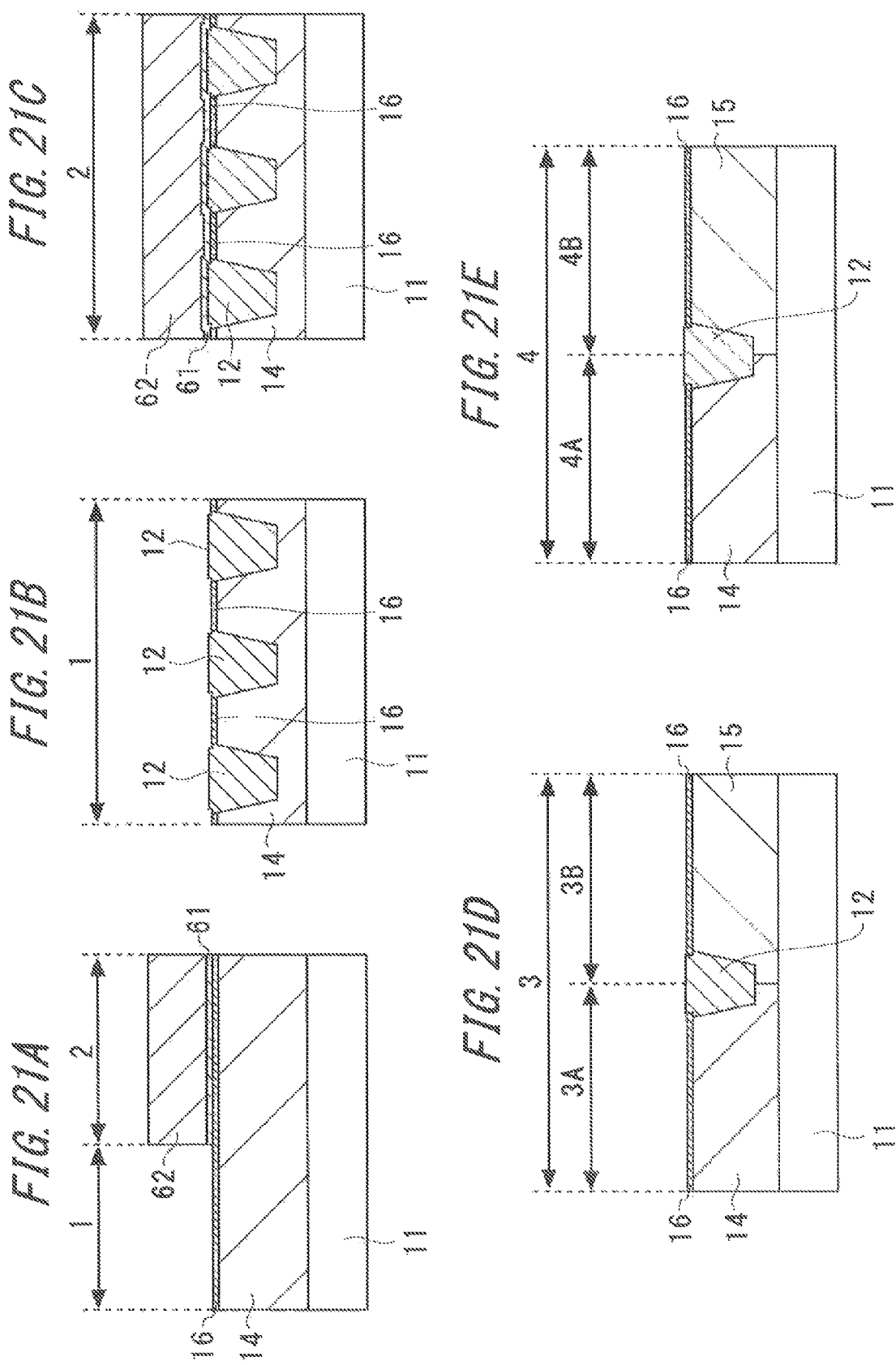

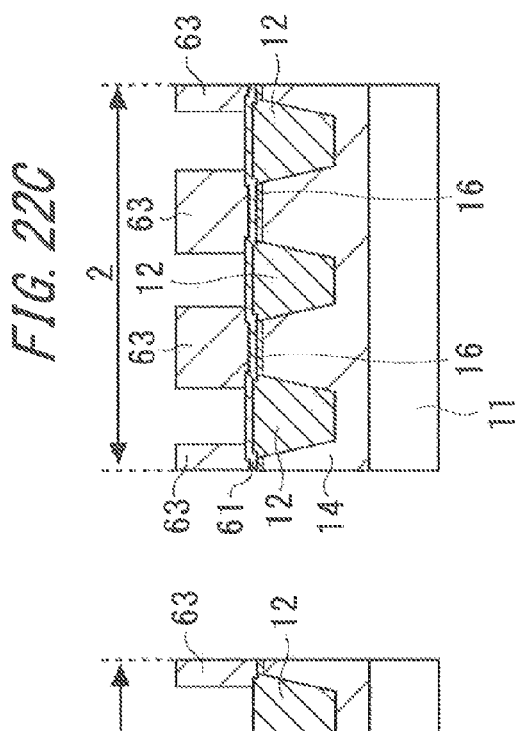
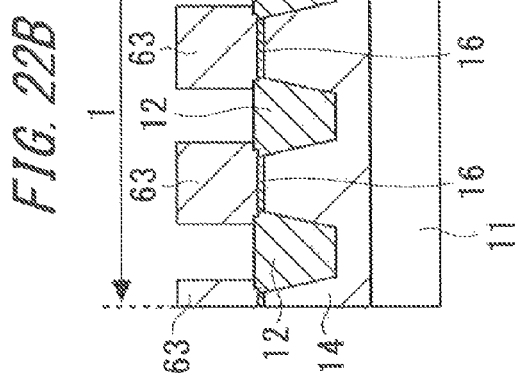
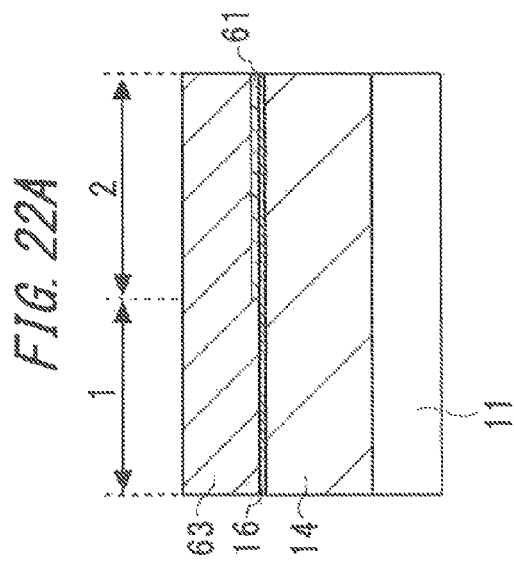
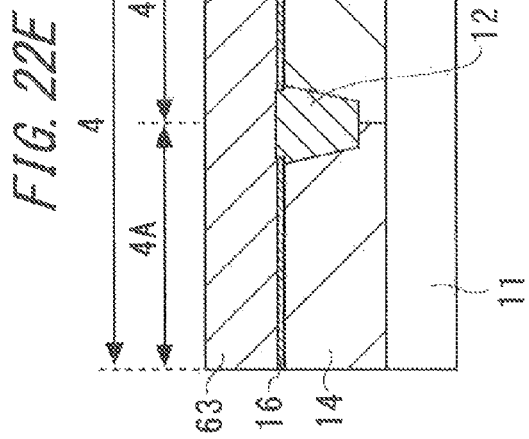
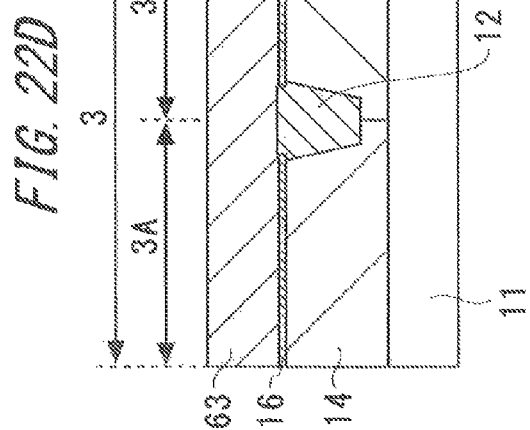

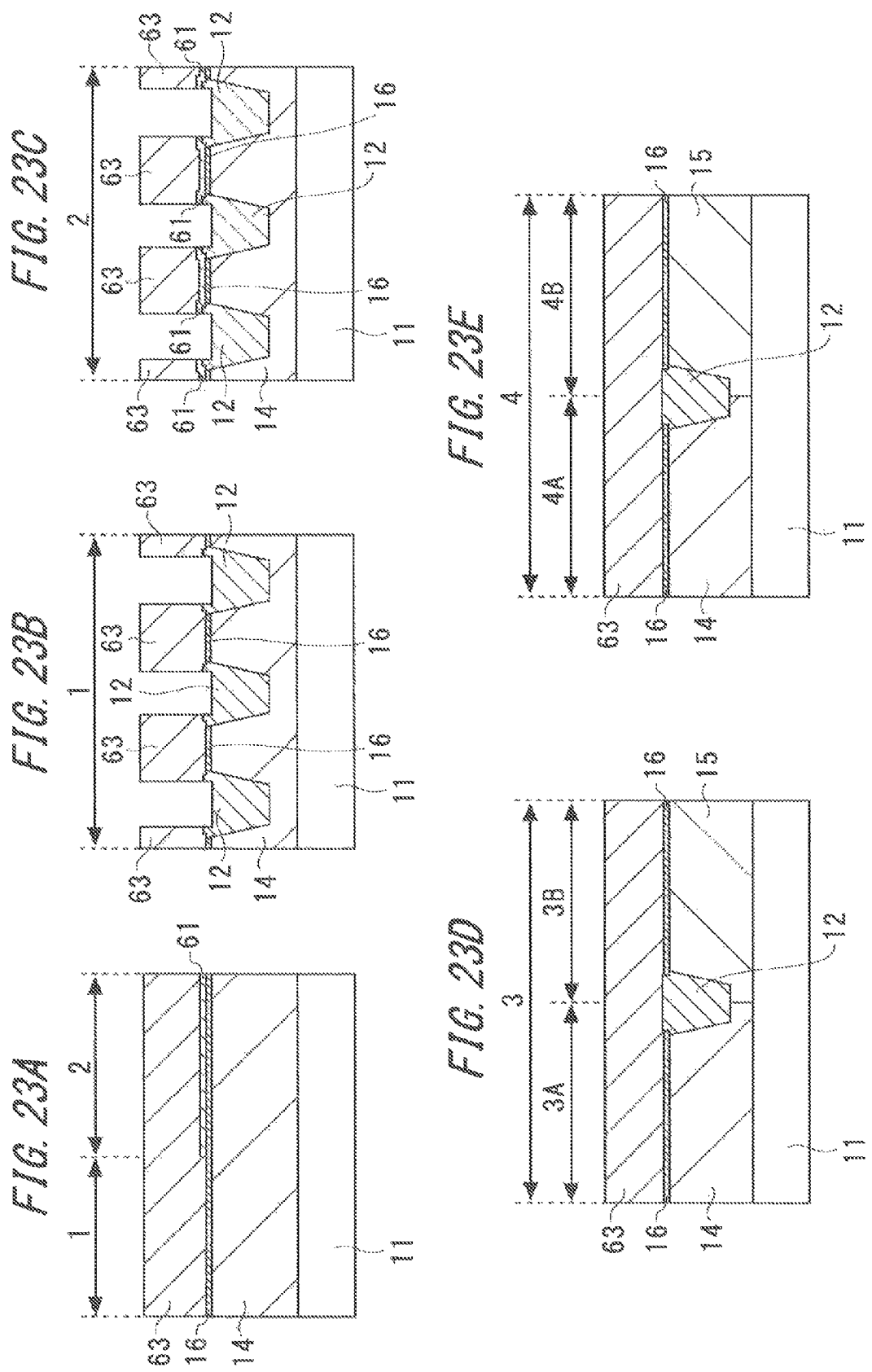

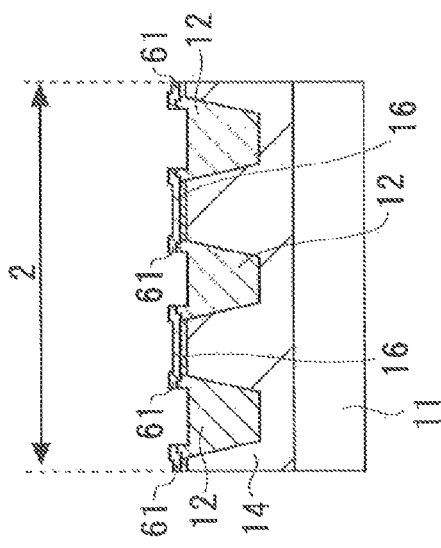
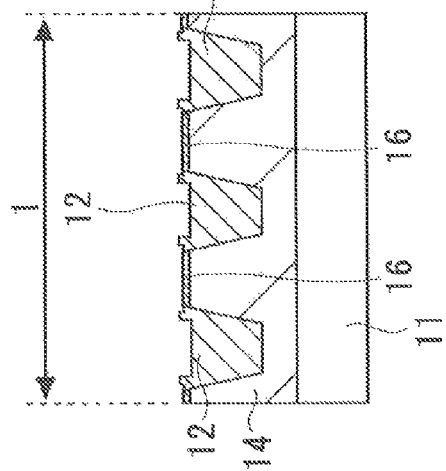
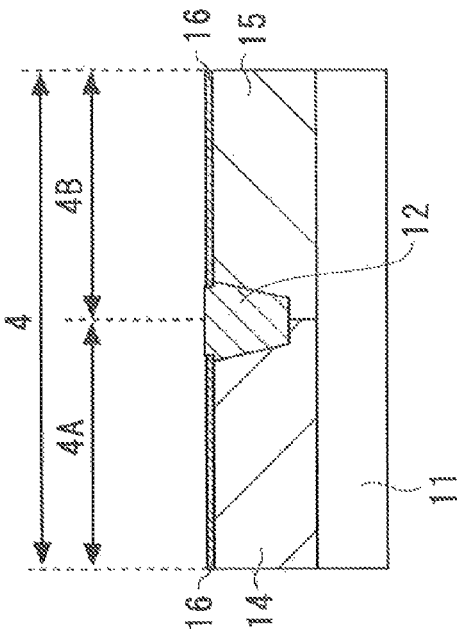
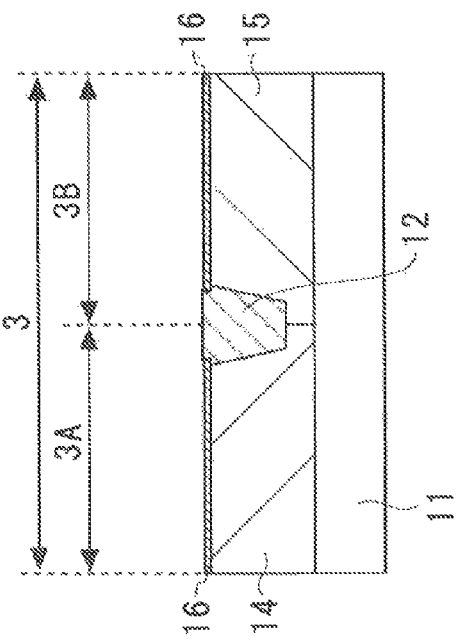

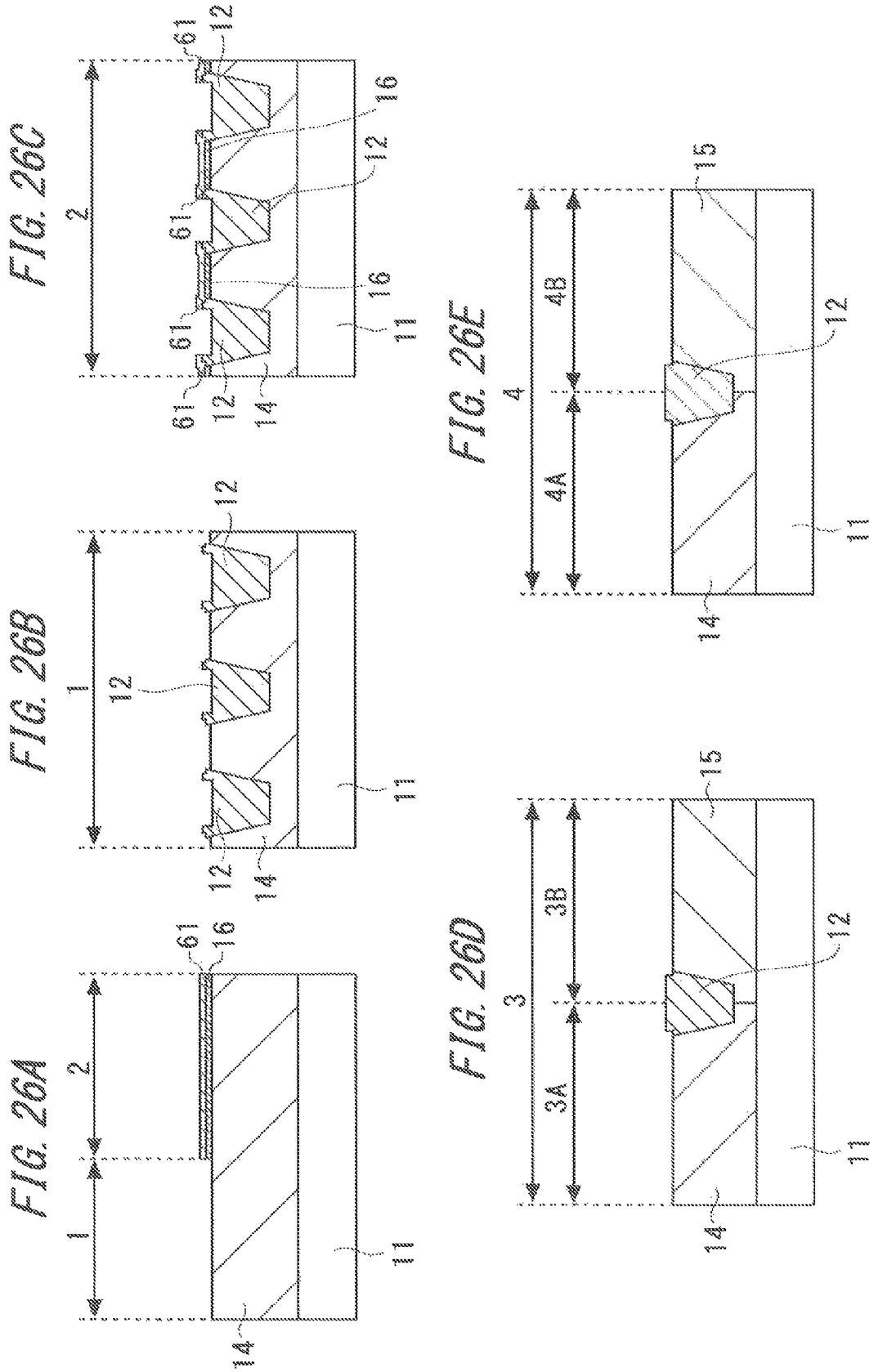

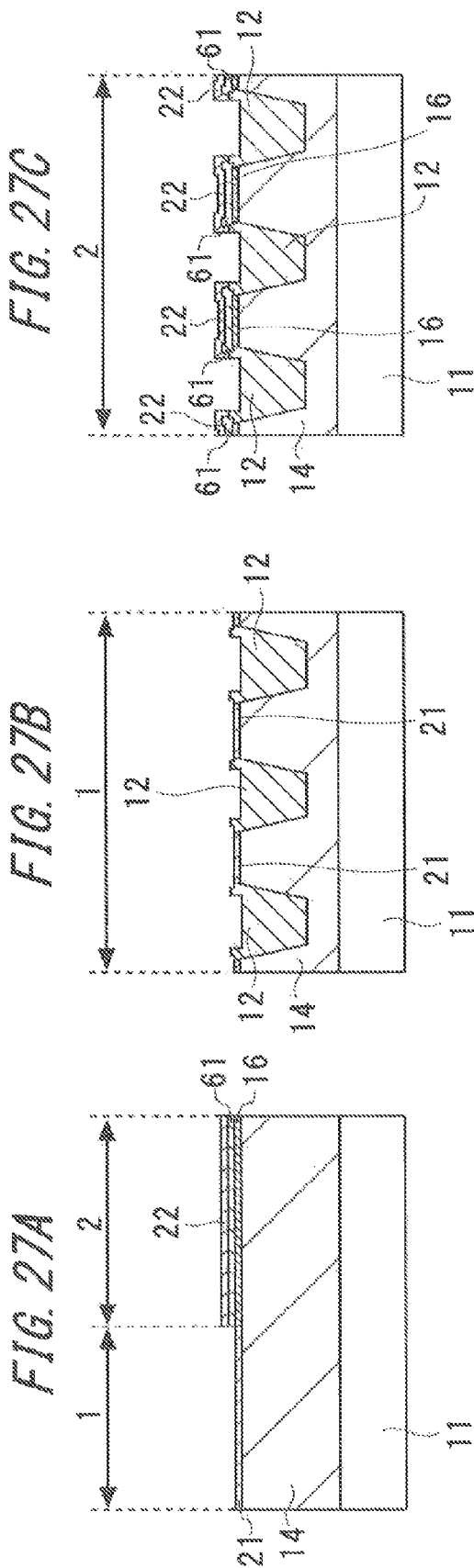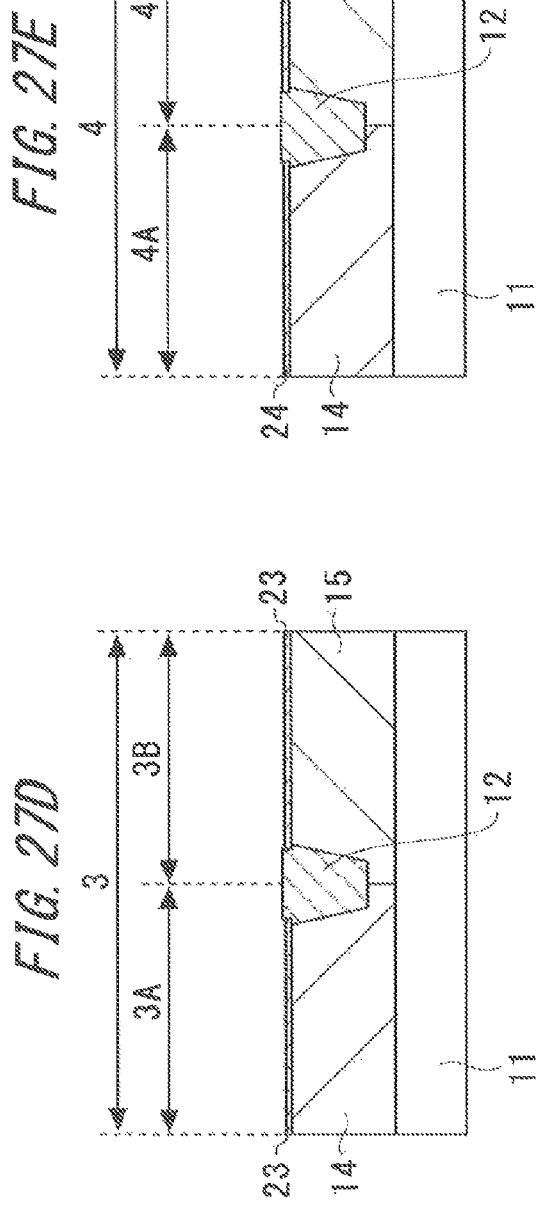

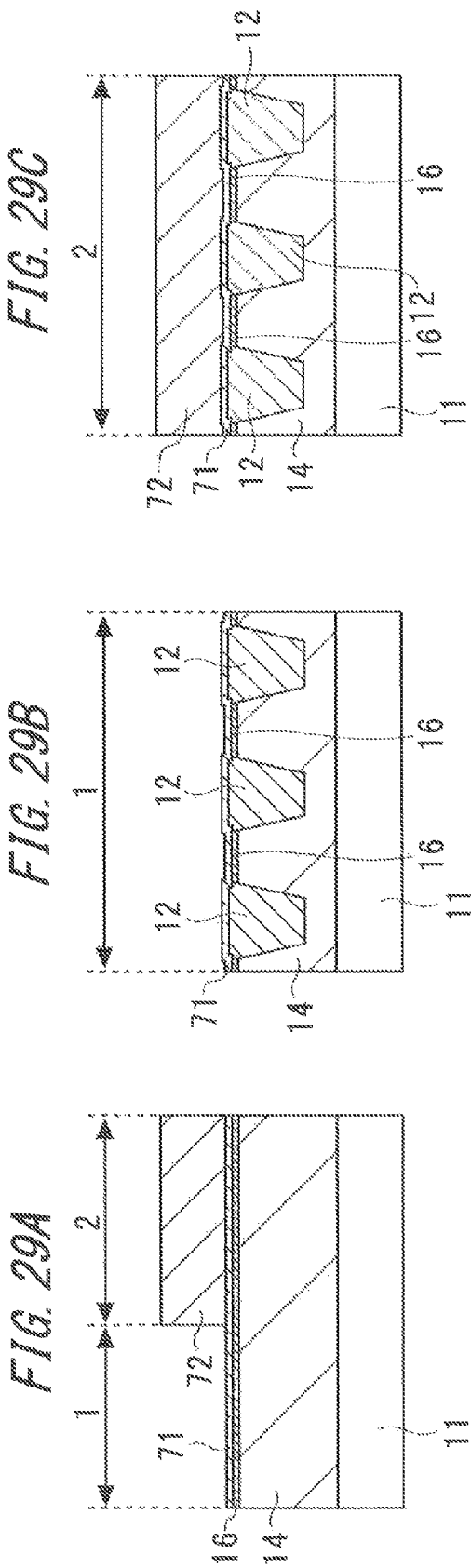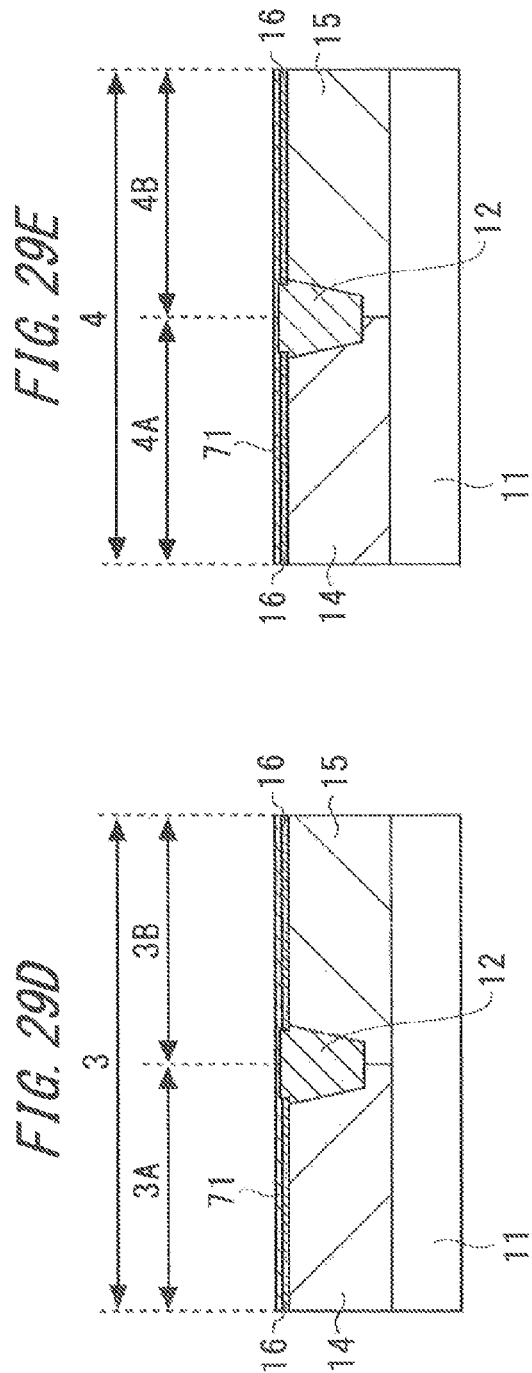

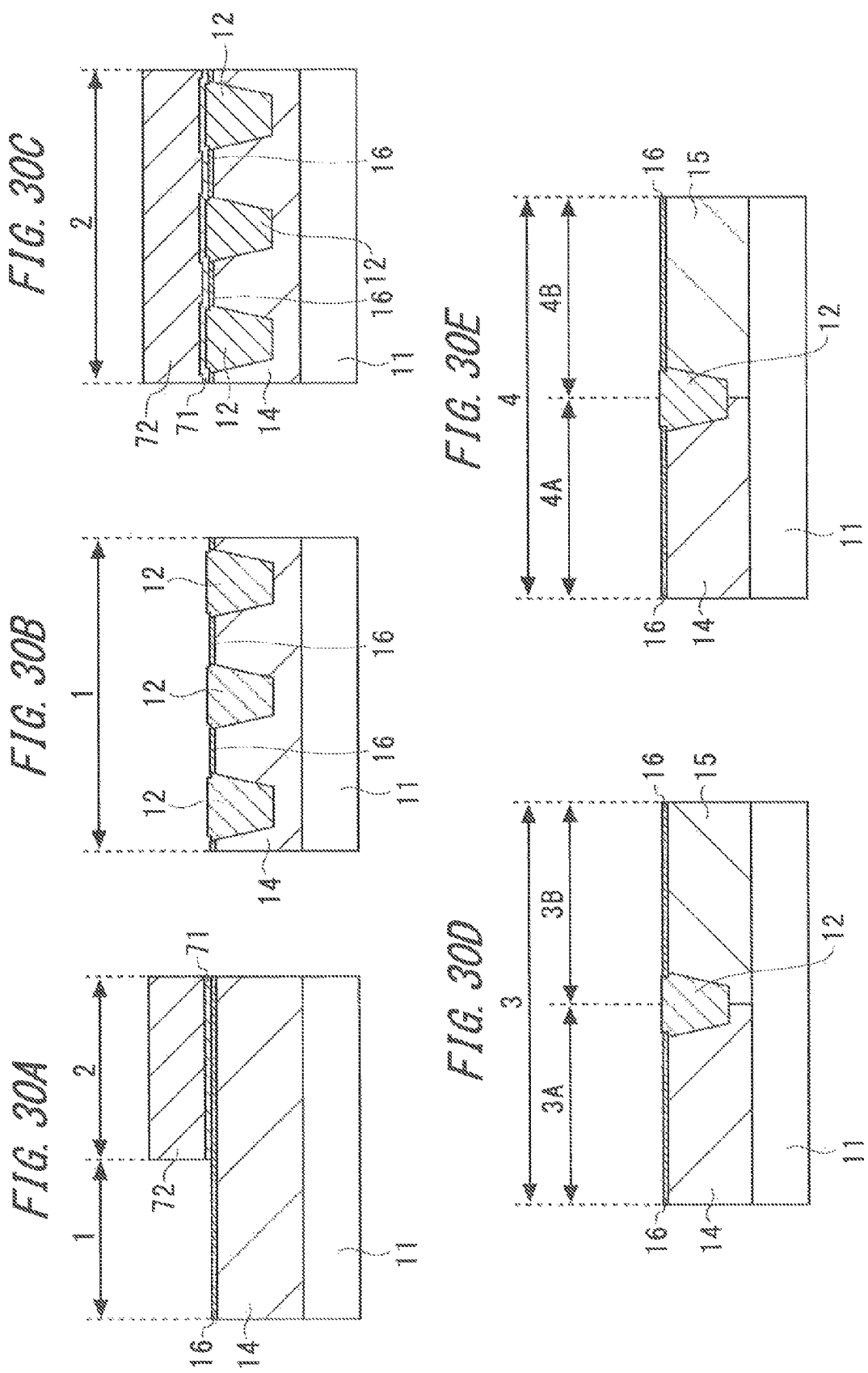

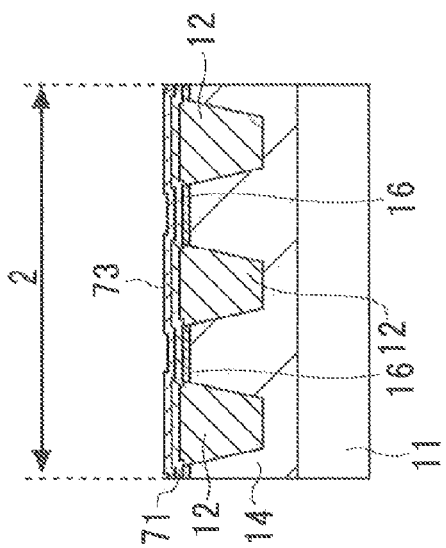
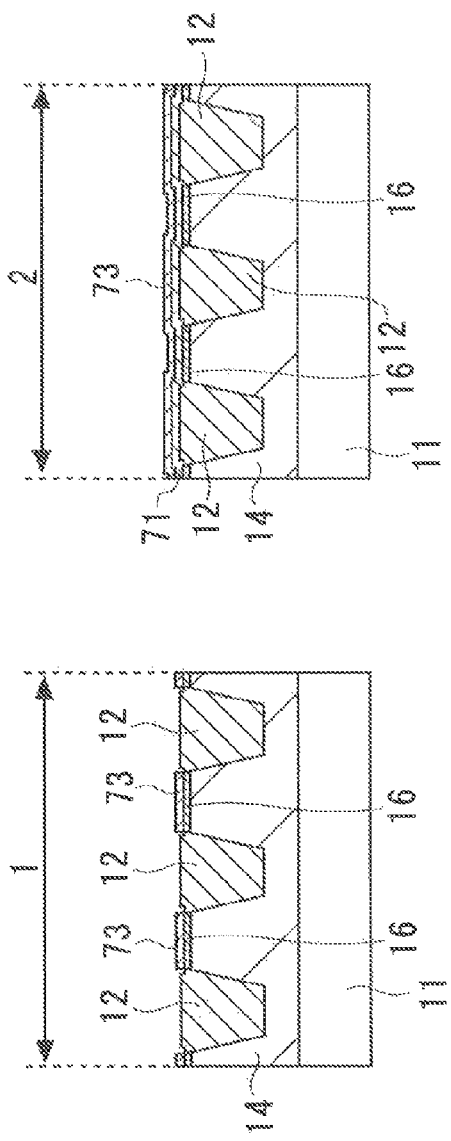
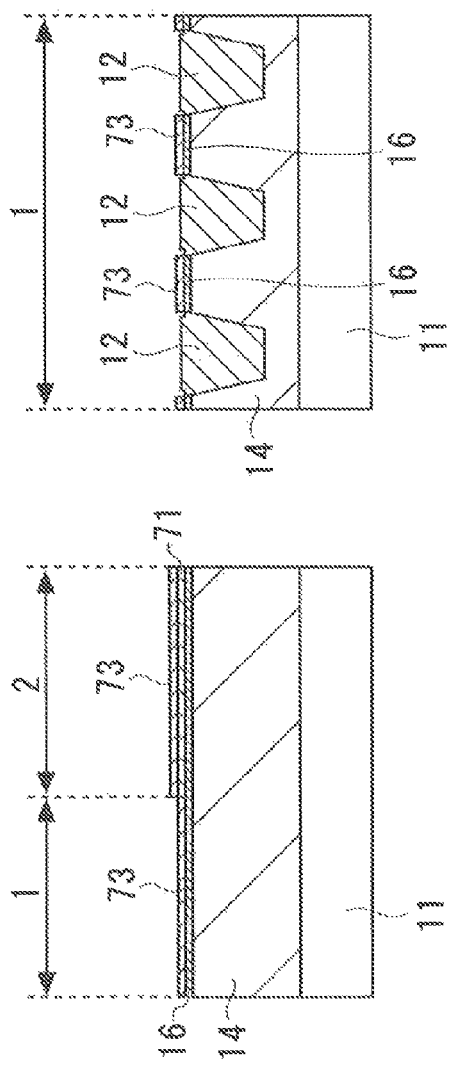
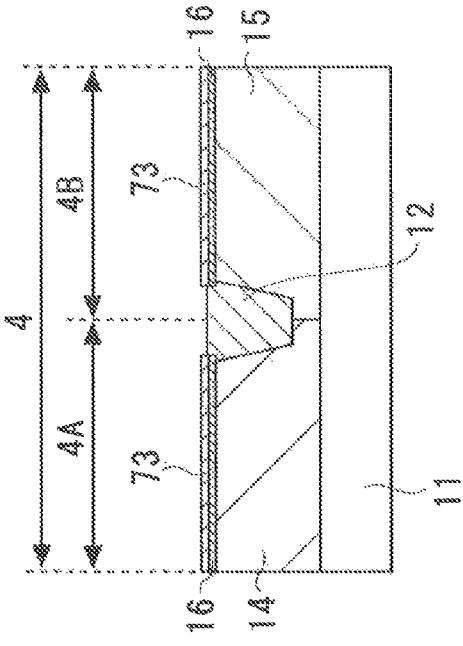
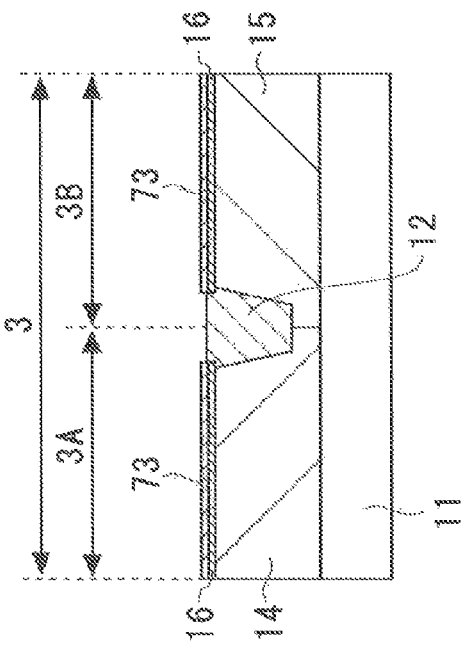

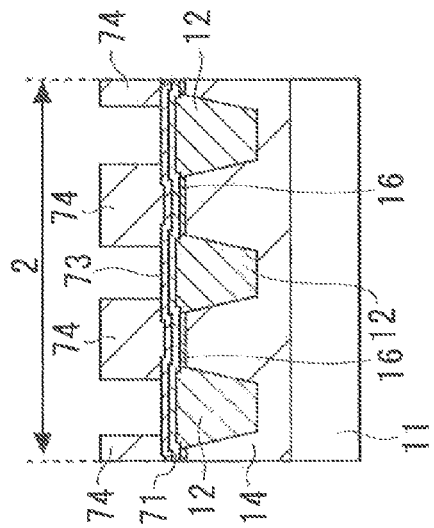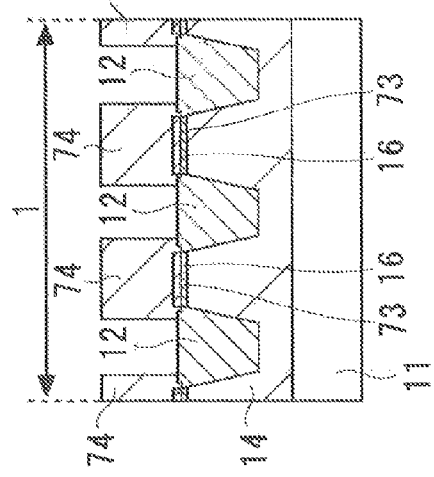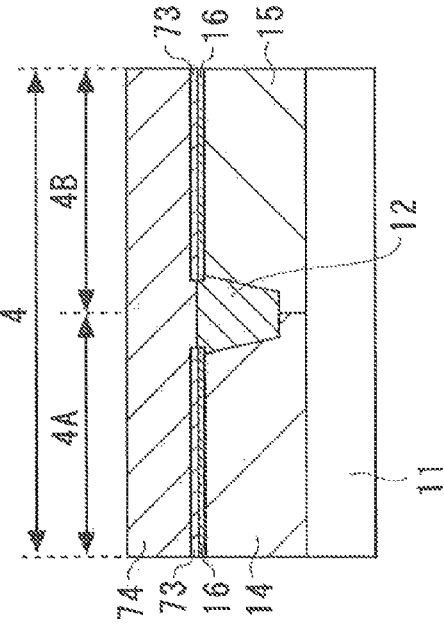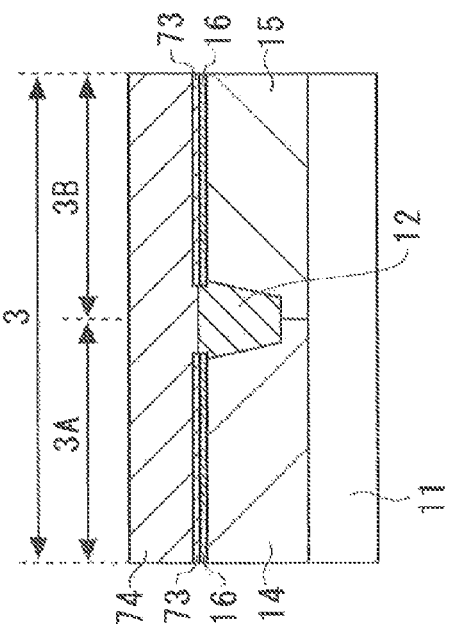

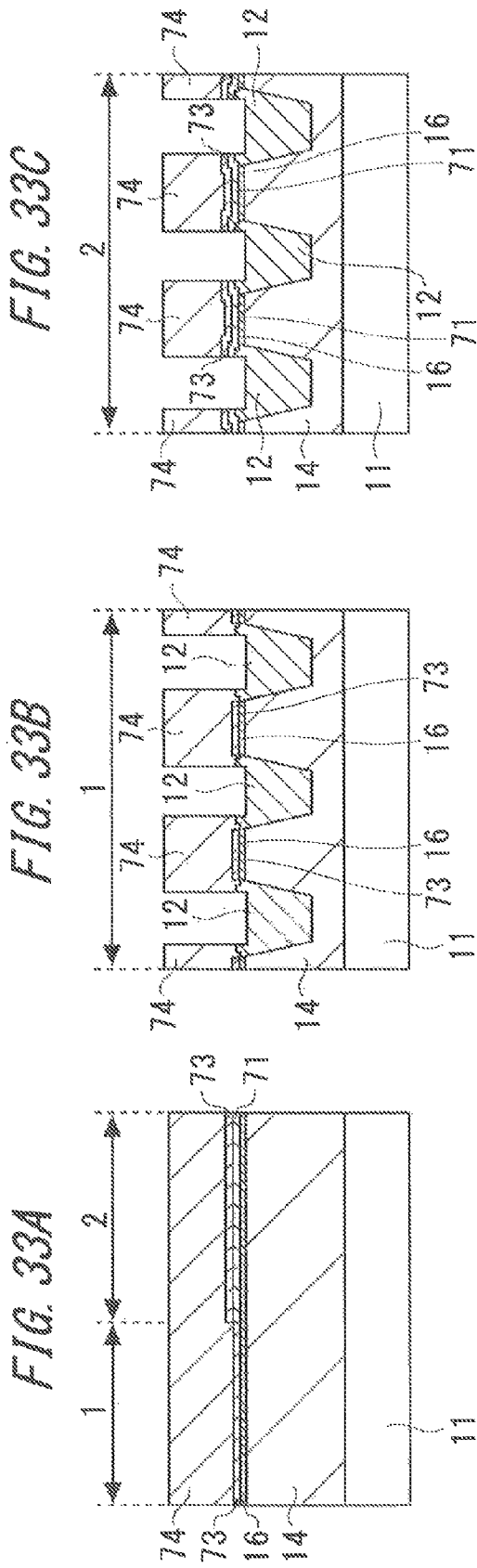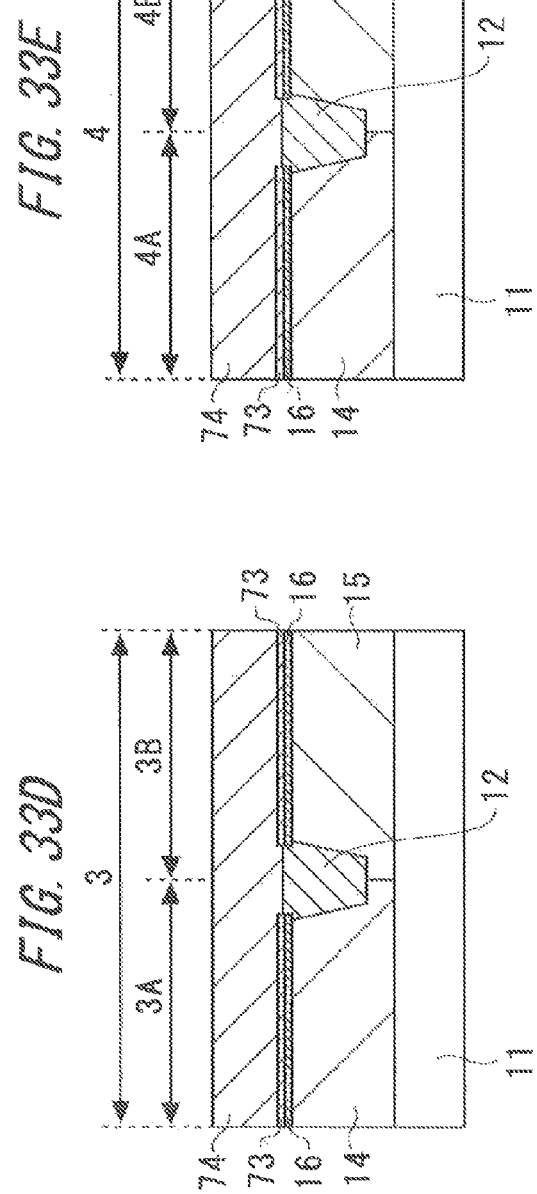

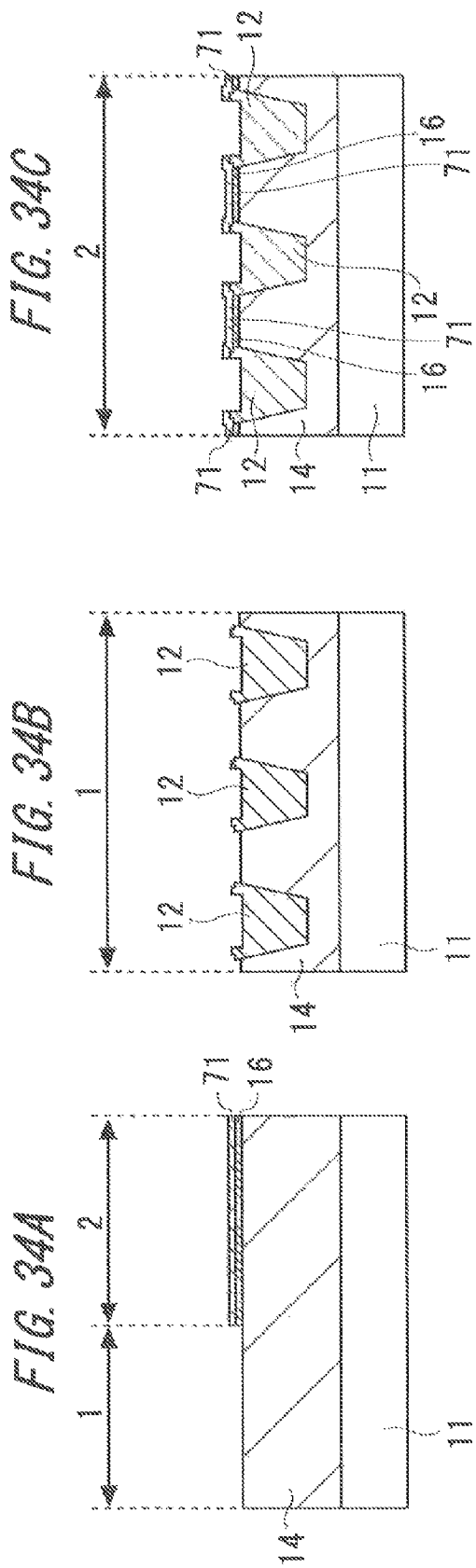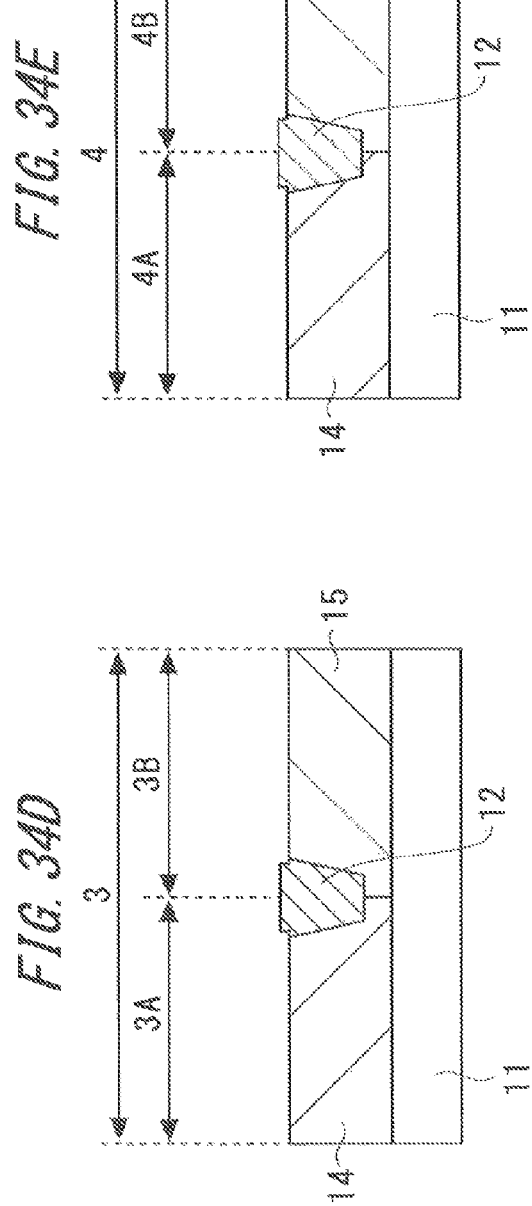

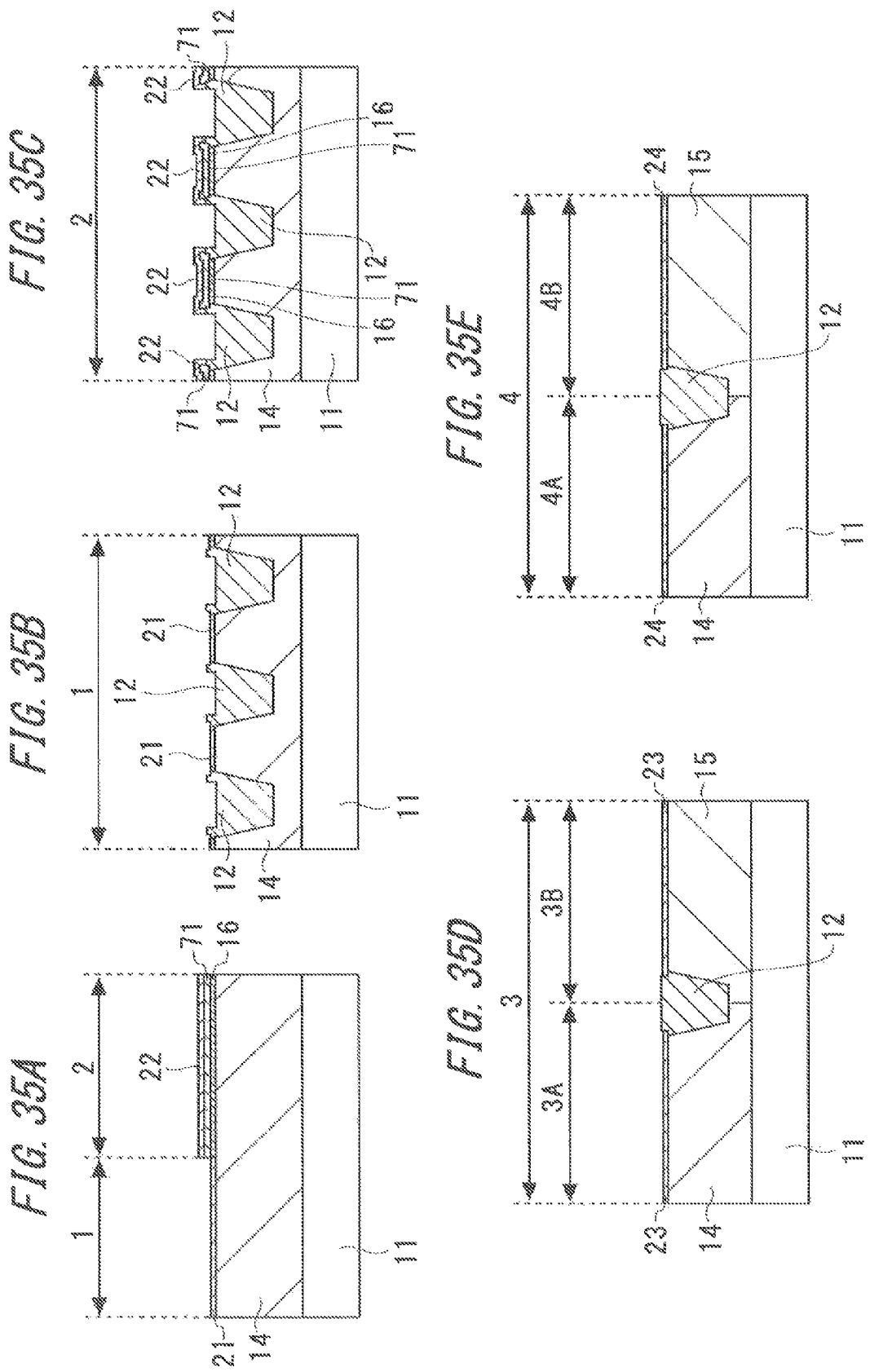

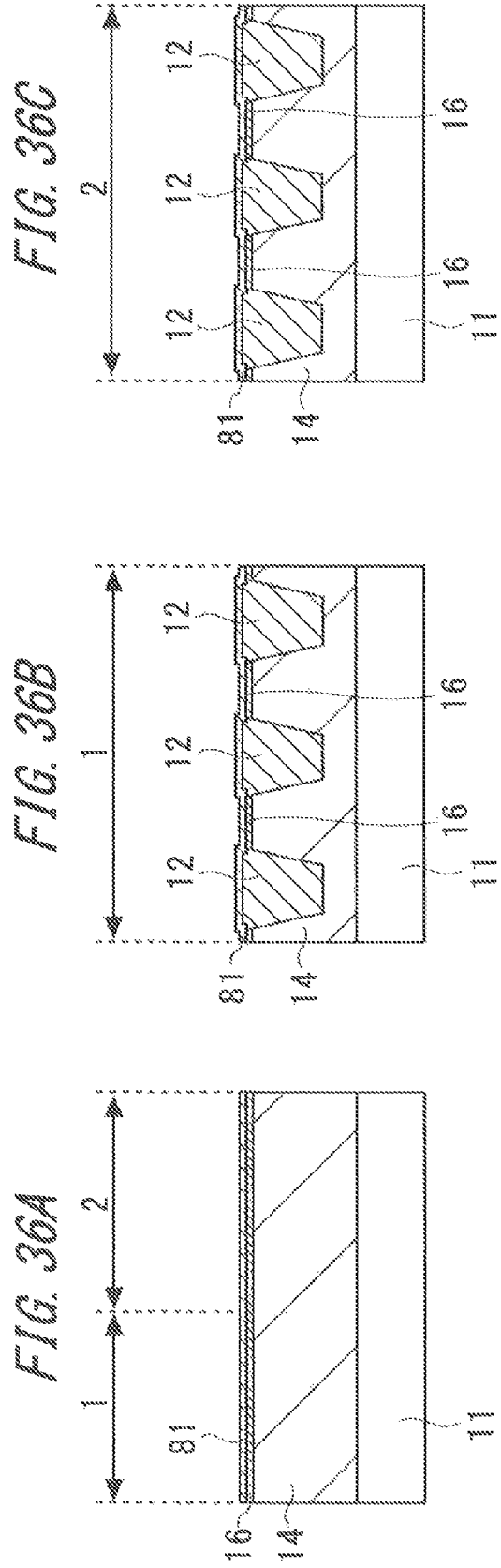

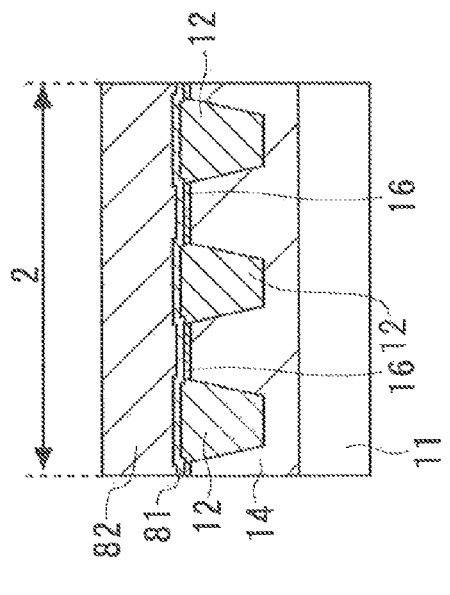
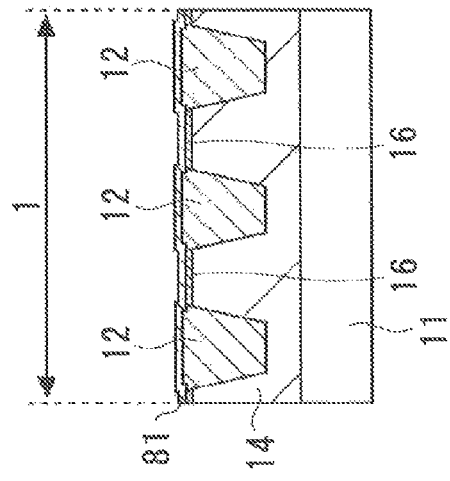
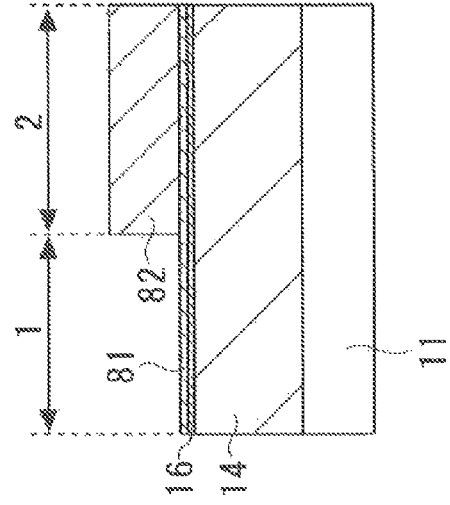
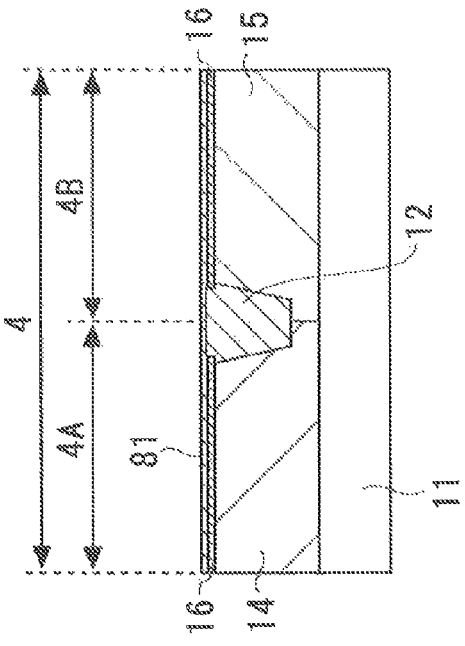
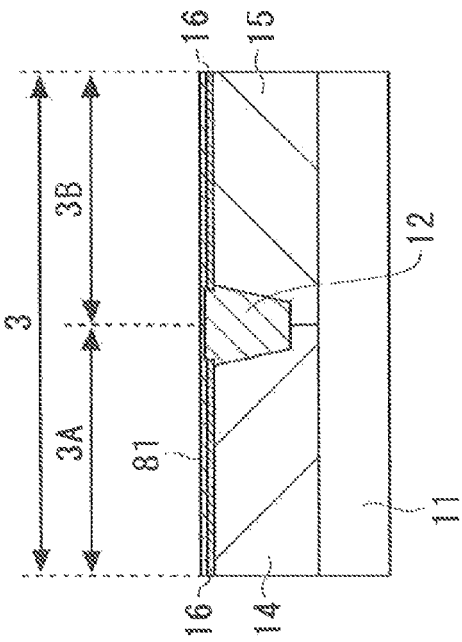

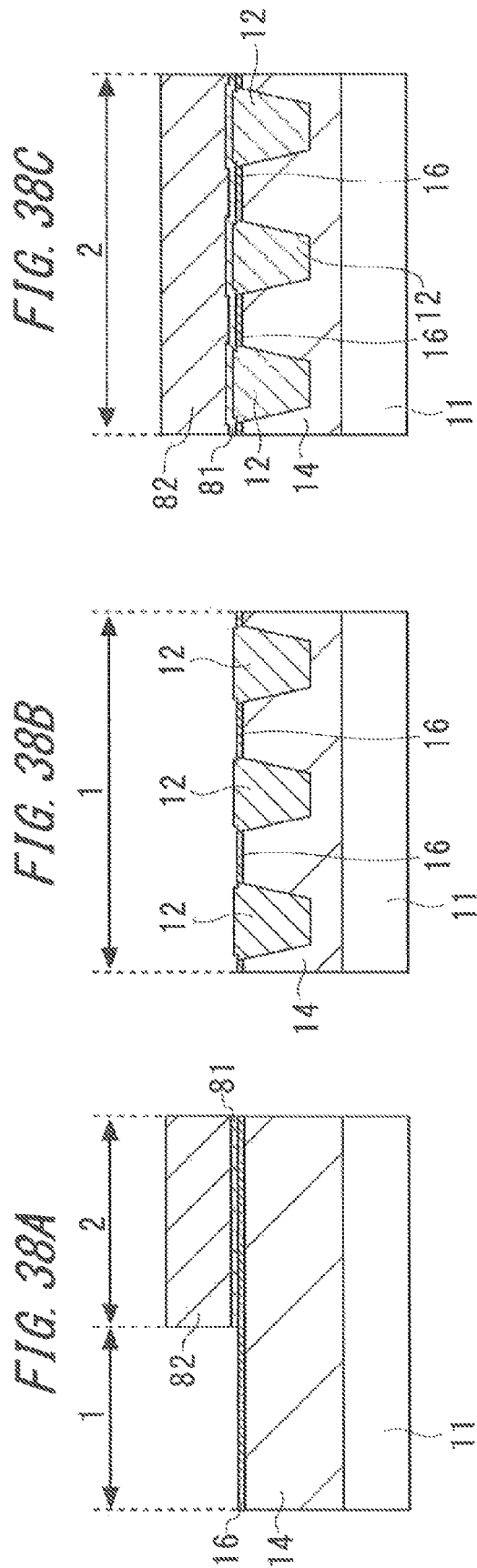
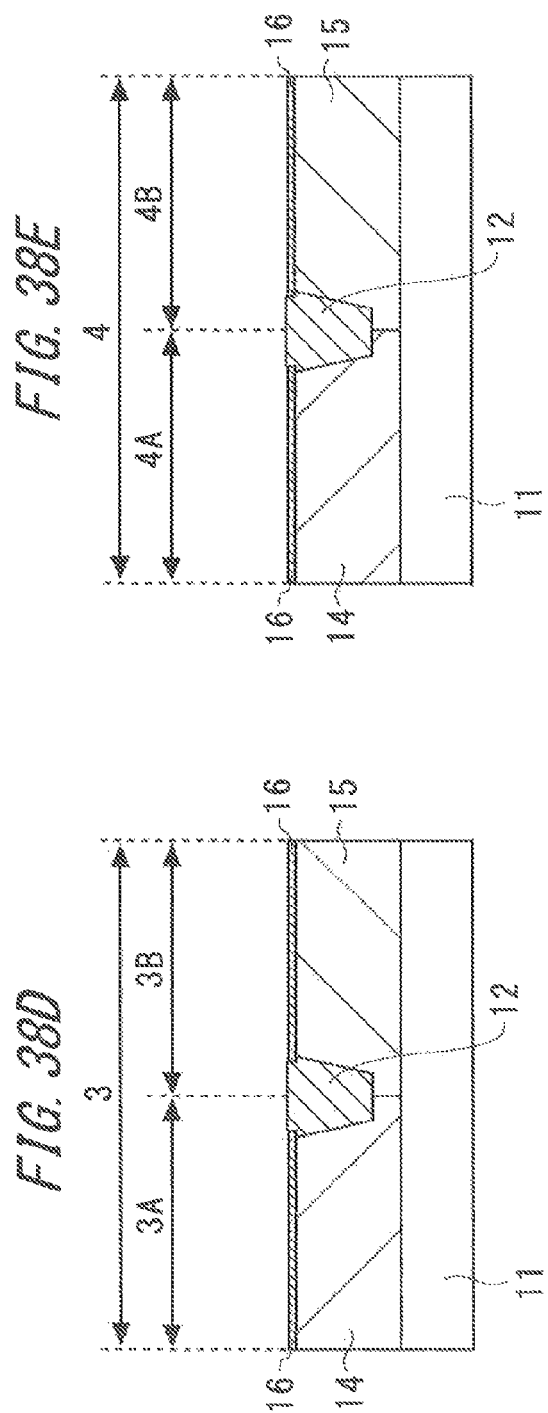

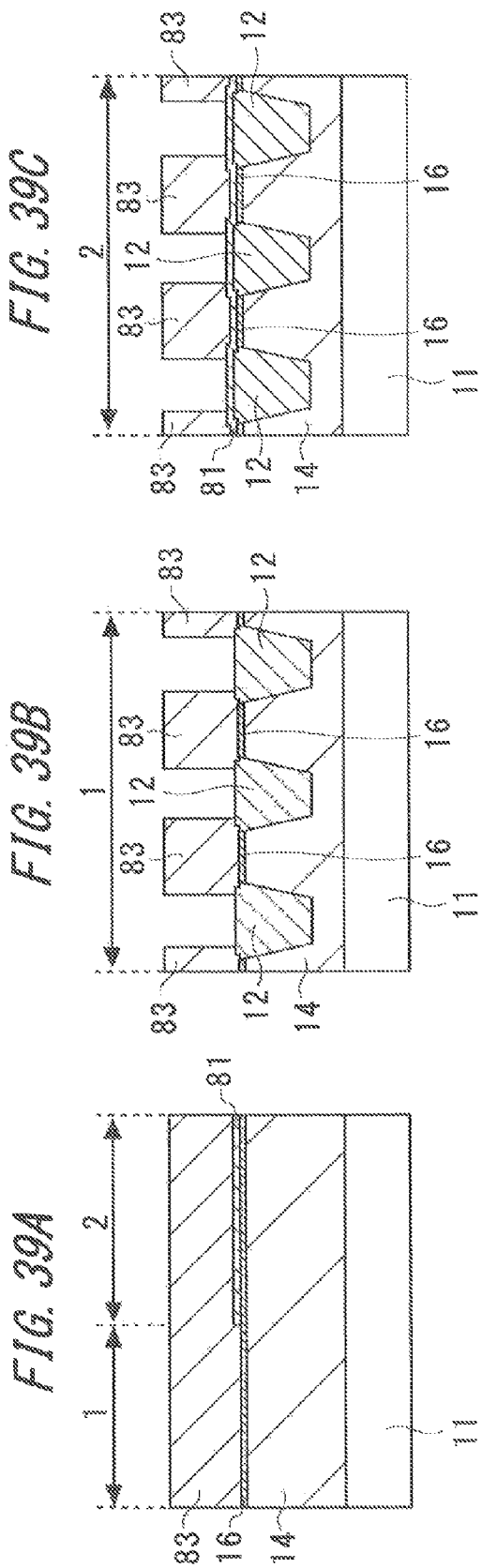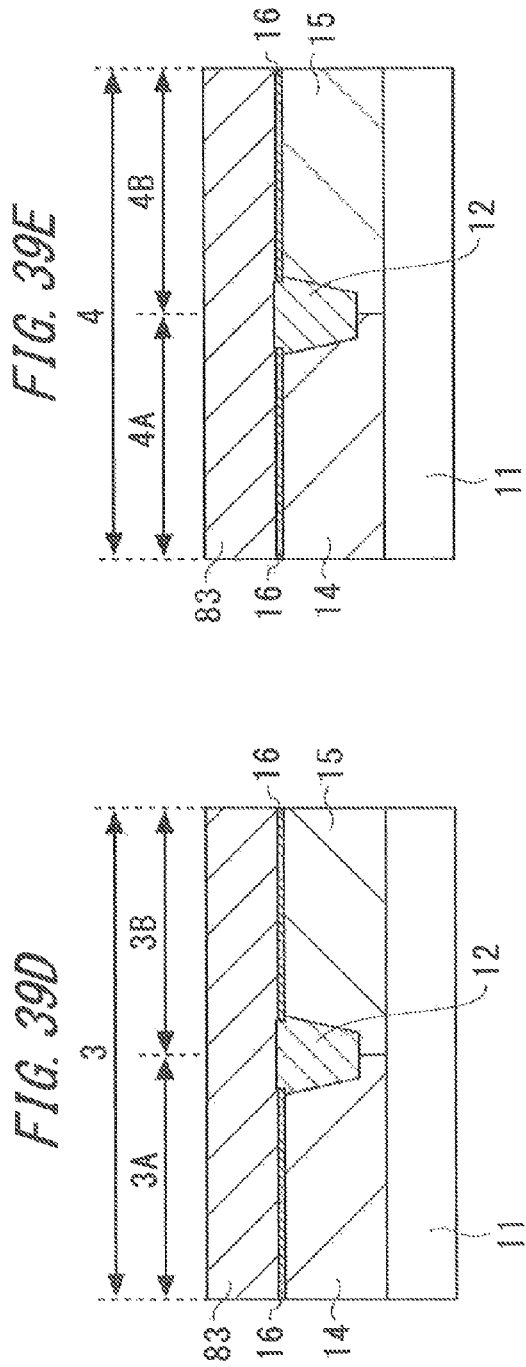

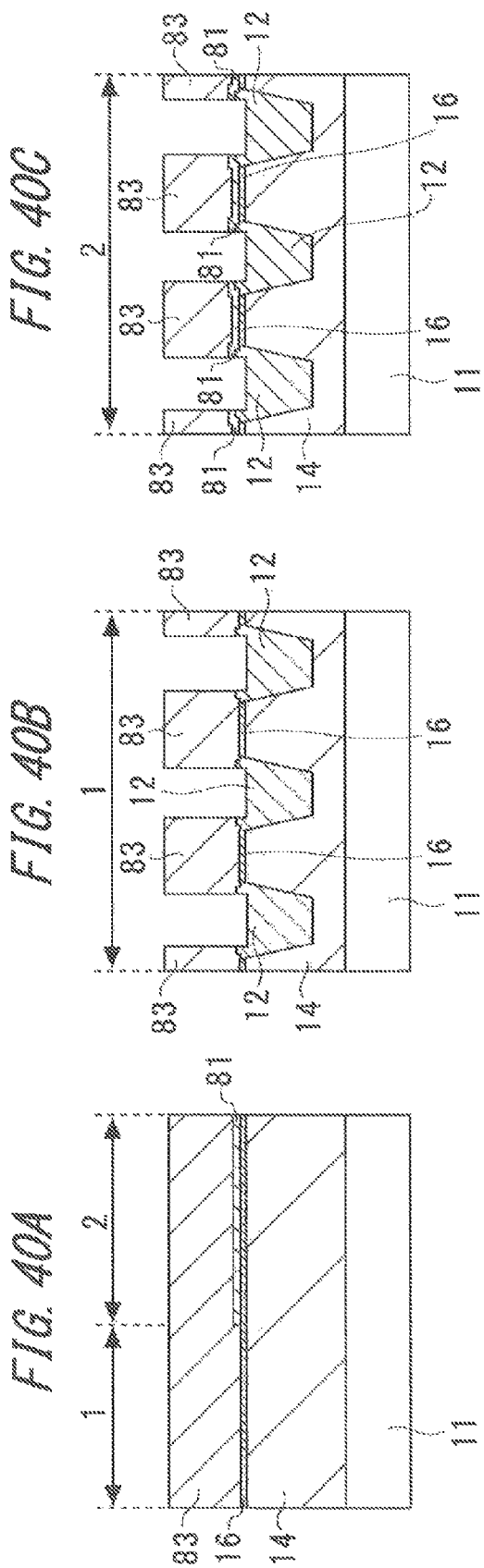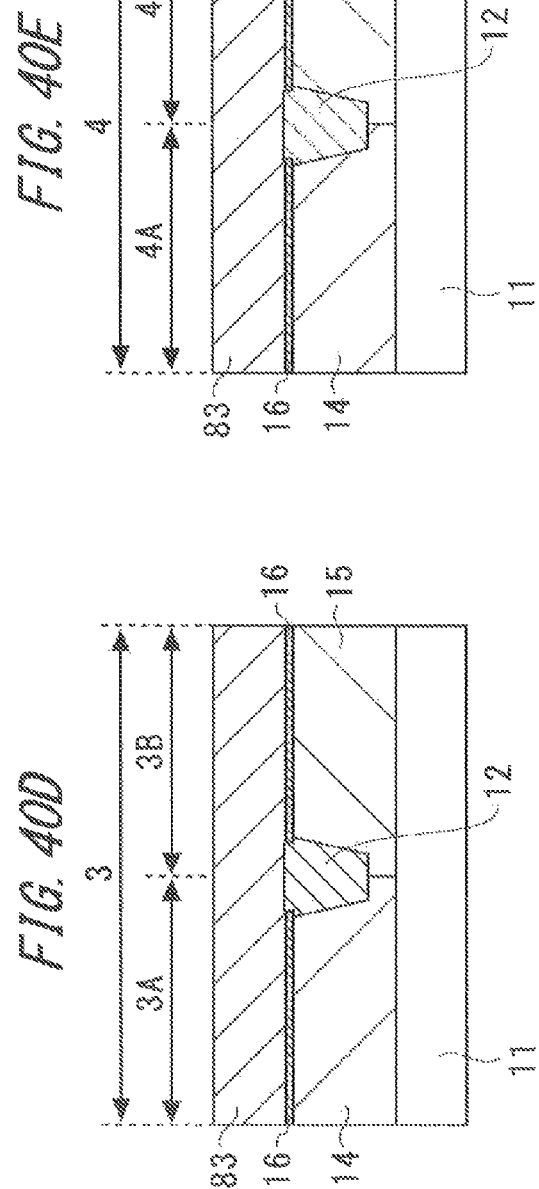

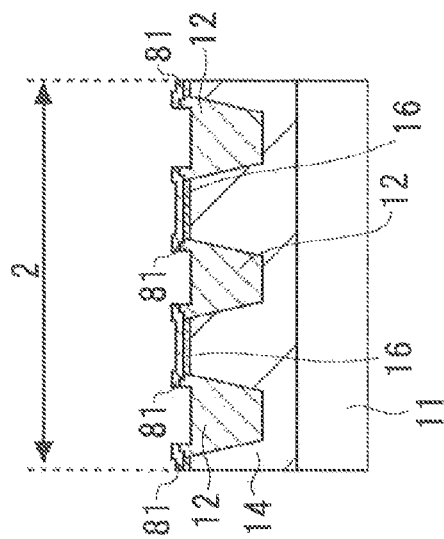
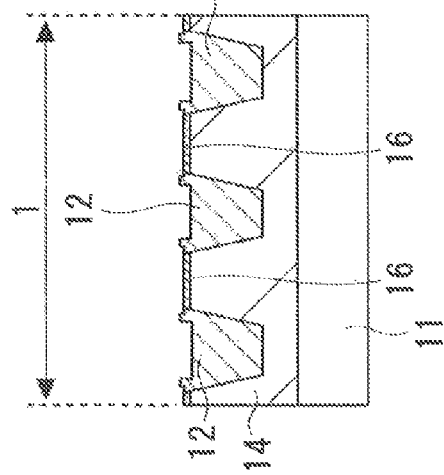
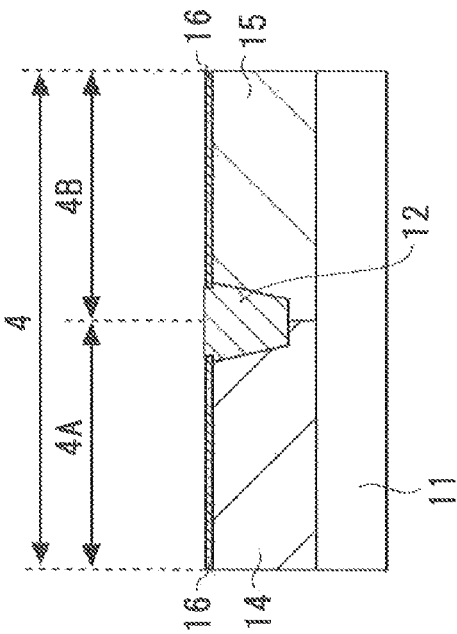
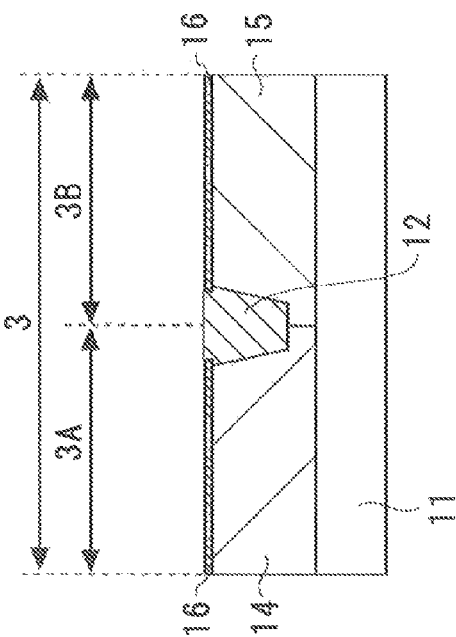

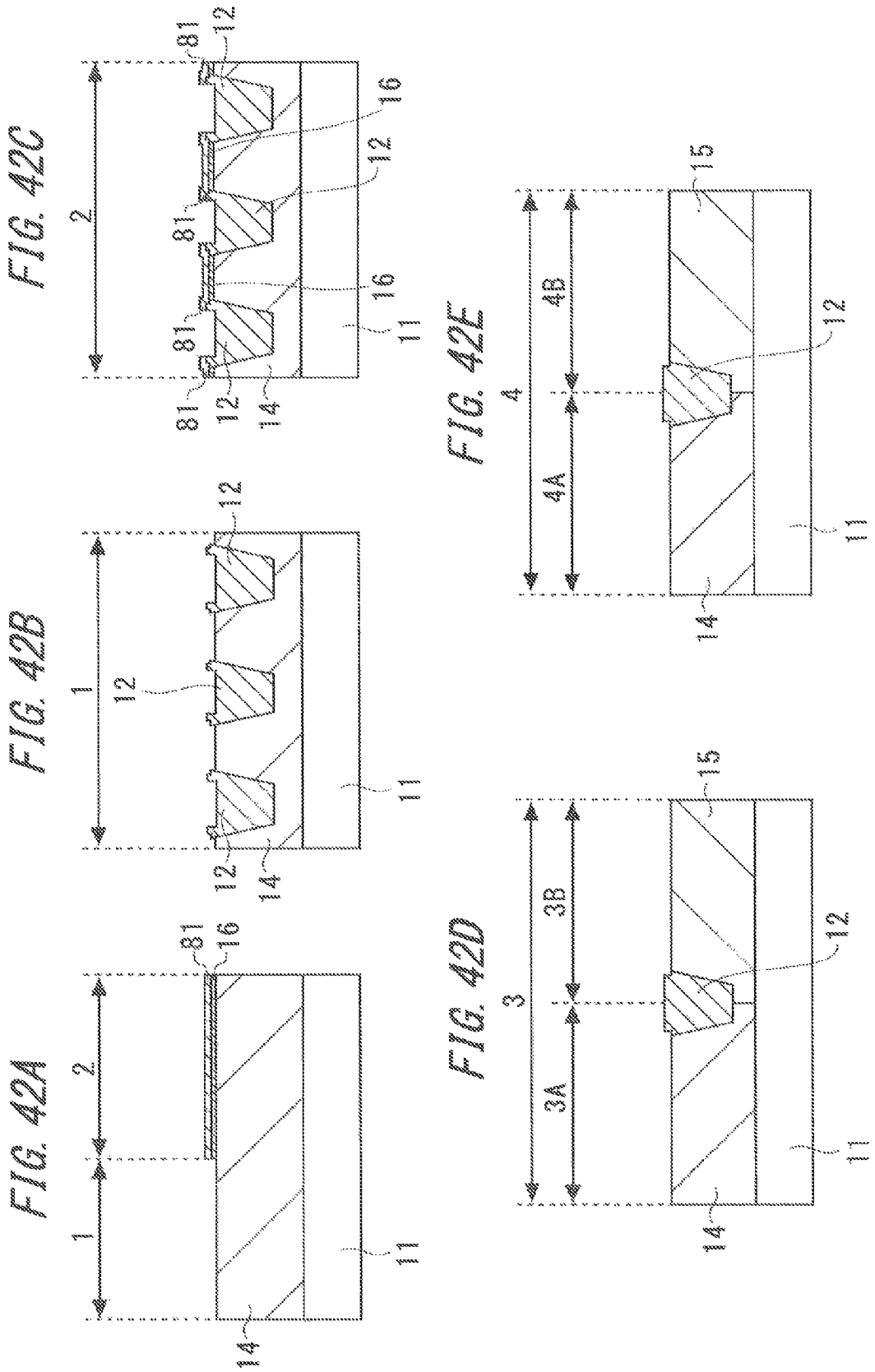

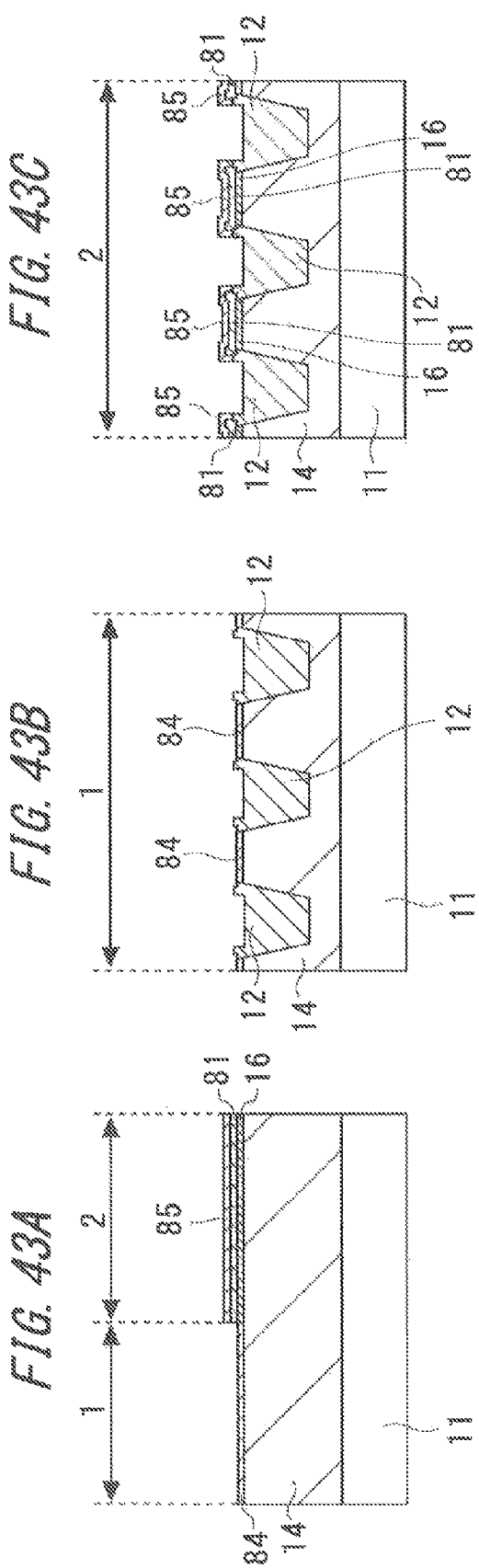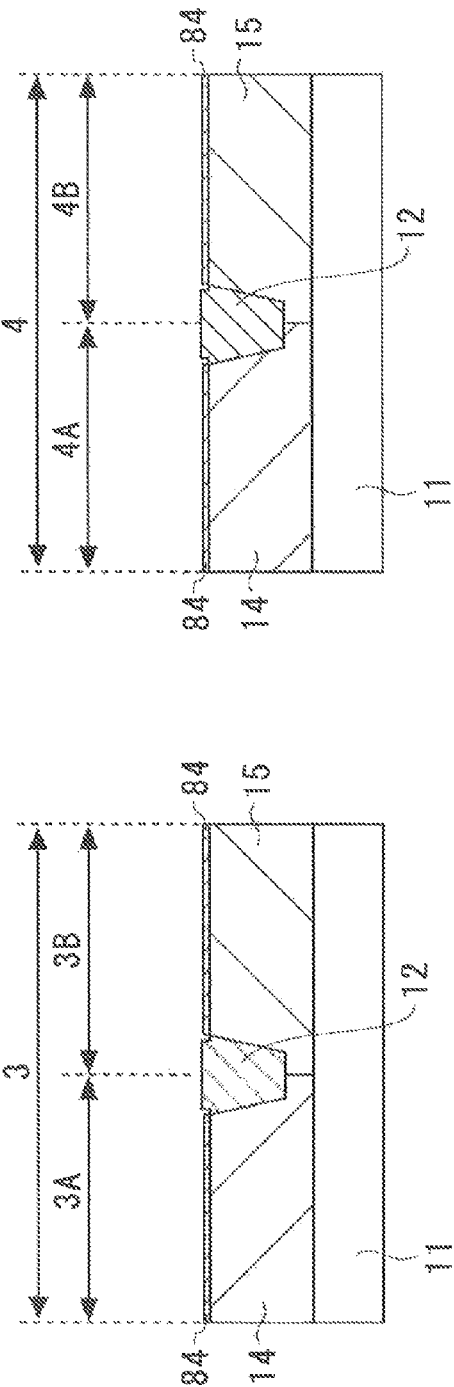

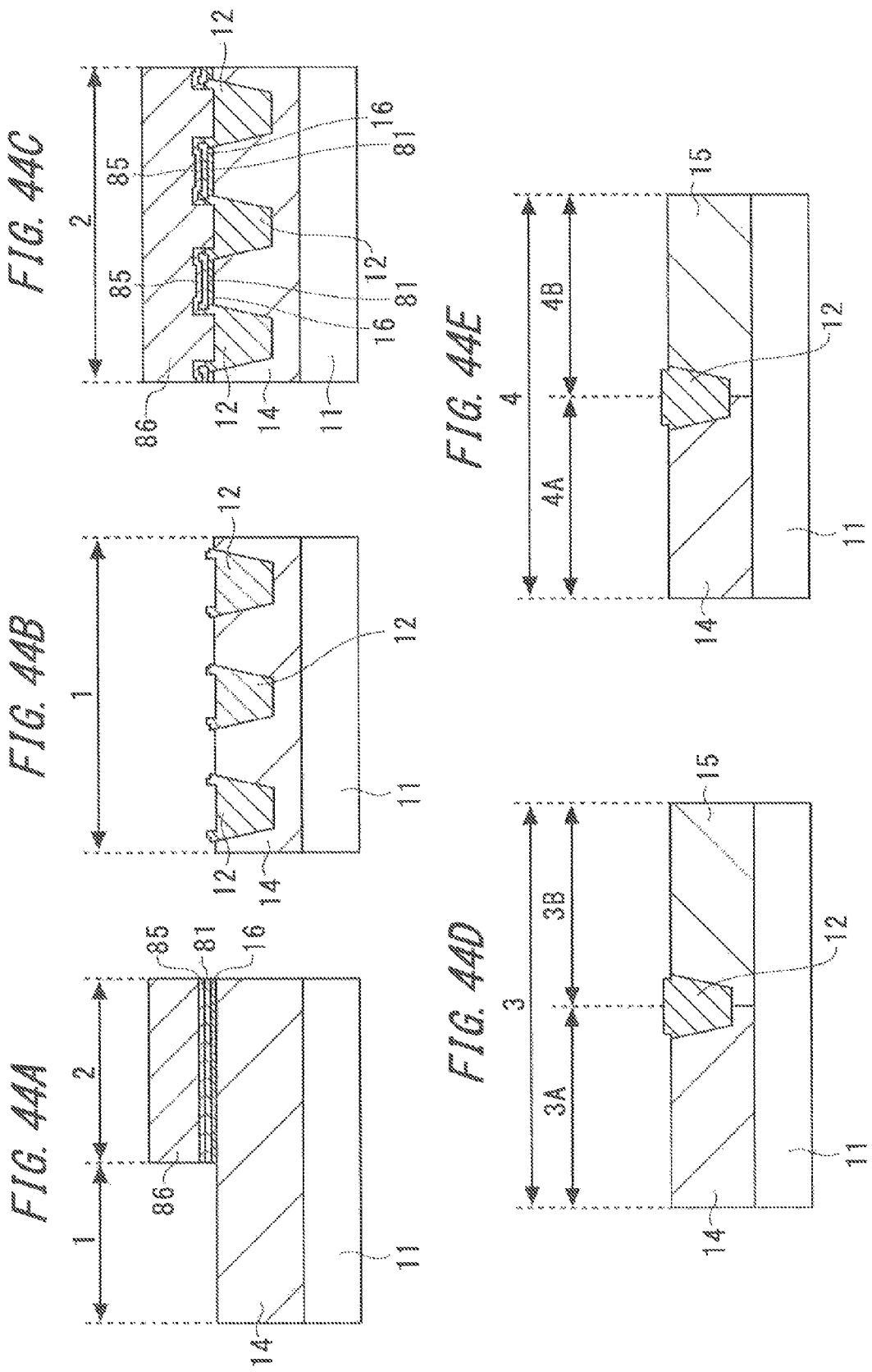

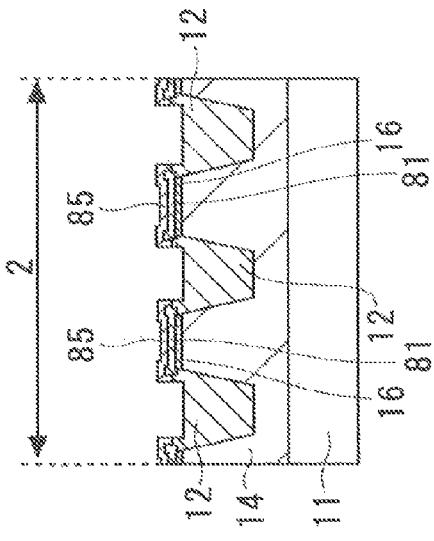
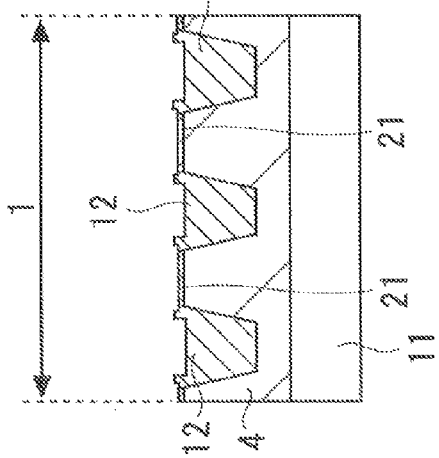
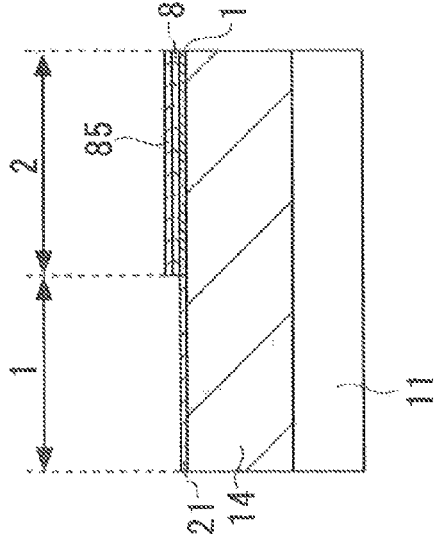
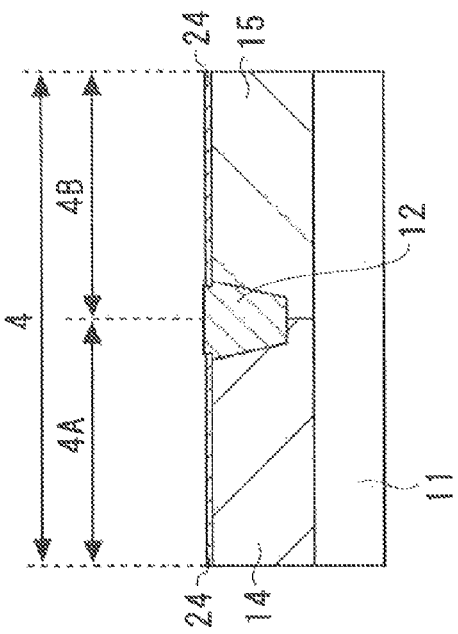
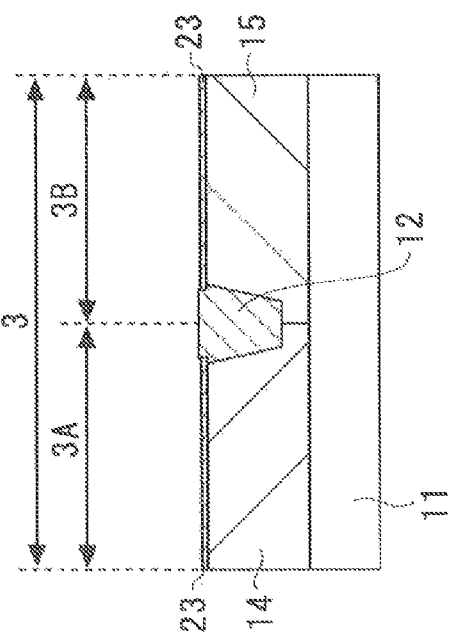

SEMICONDUCTOR DEVICE MANUFACTURING METHOD AND SEMICONDUCTOR DEVICE

CROSS-REFERENCE TO RELATED APPLICATIONS

This application is based upon and claims the benefit of prior Japanese Patent Application No. 2013-240272 filed on Nov. 20, 2013, the entire contents of which are incorporated herein by reference.

FIELD

Embodiments relate to a semiconductor device manufacturing method and a semiconductor.

BACKGROUND

There have recently been proposed nonvolatile semiconductor storages, such as a flash memory including a memory cell with a select transistor and a memory transistor. As memory transistors, a floating gate type memory transistor and a SONOS (Silicon Oxide Nitride Oxide Silicon) type memory transistor are known.

In a SONOS type memory transistor, an insulating film having a structure, in which a lower insulating film, a charge storage film, and an upper insulating film are stacked, is used as a gate insulating film. In the SONOS type memory transistor, data storage or erasure is performed by loading or unloading charges into or from the charge storage film.

[Patent document] Japanese Laid-open Patent Publication No. 2010-258250

SUMMARY

According to an aspect of the embodiments, a semiconductor device manufacturing method includes: forming an element isolation insulating film in a semiconductor substrate; forming a first film on a surface of the semiconductor substrate; forming a second film on the element isolation insulating film and on the first film; forming a first resist pattern that includes a first open above the element isolation insulating film in a first region; removing the second film on the element isolation insulating film in the first region to separate the second film in the first region into a plurality of parts by performing first etching using the first resist pattern as a mask; forming a third film on the second film in the first region after removing the first resist pattern; forming a first gate electrode on the third film in the first region; and forming a first insulating film that includes the first film, the second film, and the third film under the first gate electrode by patterning the first film, the second film, and the third film using the first gate electrode as a mask.

The object and advantages of the embodiments will be realized and attained by means of the elements and combinations particularly pointed out in the claims. It is to be understood that both the foregoing general description and the following detailed description are exemplary and explanatory and are not restrictive of the embodiments, as claimed.

BRIEF DESCRIPTION OF DRAWINGS

FIG. 1 is a plan view illustrating a semiconductor device manufacturing process according to a first embodiment;

FIGS. 2A to 2E are cross-sectional views illustrating the semiconductor device manufacturing process according to the first embodiment;

FIGS. 3A to 3E are cross-sectional views illustrating the semiconductor device manufacturing process according to the first embodiment;

FIGS. 4A to 4E are cross-sectional views illustrating the semiconductor device manufacturing process according to the first embodiment;

FIGS. 5A to 5E are cross-sectional views illustrating the semiconductor device manufacturing process according to the first embodiment;

FIGS. 6A to 6E are cross-sectional views illustrating the semiconductor device manufacturing process according to the first embodiment;

FIGS. 7A to 7E are cross-sectional views illustrating the semiconductor device manufacturing process according to the first embodiment;

FIGS. 8A to 8E are cross-sectional views illustrating the semiconductor device manufacturing process according to the first embodiment;

FIGS. 9A to 9E are cross-sectional views illustrating the semiconductor device manufacturing process according to the first embodiment;

FIGS. 10A to 10E are cross-sectional views illustrating the semiconductor device manufacturing process according to the first embodiment;

FIGS. 11A to 11E are cross-sectional views illustrating the semiconductor device manufacturing process according to the first embodiment;

FIGS. 12A to 12E are cross-sectional views illustrating the semiconductor device manufacturing process according to the first embodiment;

FIGS. 13A to 13E are cross-sectional views illustrating the semiconductor device manufacturing process according to the first embodiment;

FIGS. 14A to 14E are cross-sectional views illustrating the semiconductor device manufacturing process according to the first embodiment;

FIGS. 15A to 15E are cross-sectional views illustrating the semiconductor device manufacturing process according to the first embodiment;

FIGS. 16A to 16E are cross-sectional views illustrating the semiconductor device manufacturing process according to the first embodiment;

FIGS. 17A to 17E are cross-sectional views illustrating the semiconductor device manufacturing process according to the first embodiment;

FIGS. 18A to 18E are cross-sectional views illustrating the semiconductor device manufacturing process according to the first embodiment;

FIGS. 19A to 19E are cross-sectional views illustrating a semiconductor device manufacturing process according to a second embodiment;

FIGS. 20A to 20E are cross-sectional views illustrating the semiconductor device manufacturing process according to the second embodiment;

FIGS. 21A to 21E are cross-sectional views illustrating the semiconductor device manufacturing process according to the second embodiment;

FIGS. 22A to 22E are cross-sectional views illustrating the semiconductor device manufacturing process according to the second embodiment;

FIGS. 23A to 23E are cross-sectional views illustrating the semiconductor device manufacturing process according to the second embodiment;

FIGS. 24A to 24E are cross-sectional views illustrating the semiconductor device manufacturing process according to the second embodiment;

FIGS. 26A to 26E are cross-sectional views illustrating the semiconductor device manufacturing process according to the second embodiment;

FIGS. 27A to 27E are cross-sectional views illustrating the semiconductor device manufacturing process according to the second embodiment;

FIGS. 29A to 29E are cross-sectional views illustrating the semiconductor device manufacturing process according to the third embodiment;

FIGS. 30A to 30E are cross-sectional views illustrating the semiconductor device manufacturing process according to the third embodiment;

FIGS. 31A to 31E are cross-sectional views illustrating the semiconductor device manufacturing process according to the third embodiment;

FIGS. 32A to 32E are cross-sectional views illustrating the semiconductor device manufacturing process according to the third embodiment;

FIGS. 33A to 33E are cross-sectional views illustrating the semiconductor device manufacturing process according to the third embodiment;

FIGS. 34A to 34E are cross-sectional views illustrating the semiconductor device manufacturing process according to the third embodiment;

FIGS. 35A to 35E are cross-sectional views illustrating the semiconductor device manufacturing process according to the third embodiment;

FIGS. 36A to 36E are cross-sectional views illustrating a semiconductor device manufacturing process according to a fourth embodiment;

FIGS. 37A to 37E are cross-sectional views illustrating the semiconductor device manufacturing process according to the fourth embodiment;

FIGS. 38A to 38E are cross-sectional views illustrating the semiconductor device manufacturing process according to the fourth embodiment;

FIGS. 39A to 39E are cross-sectional views illustrating the semiconductor device manufacturing process according to the fourth embodiment;

FIGS. 40A to 40E are cross-sectional views illustrating the semiconductor device manufacturing process according to the fourth embodiment;

FIGS. 41A to 41E are cross-sectional views illustrating the semiconductor device manufacturing process according to the fourth embodiment;

FIGS. 42A to 42E are cross-sectional views illustrating the semiconductor device manufacturing process according to the fourth embodiment;

FIGS. 43A to 43E are cross-sectional views illustrating the semiconductor device manufacturing process according to the fourth embodiment;

FIGS. 44A to 44E are cross-sectional views illustrating the semiconductor device manufacturing process according to the fourth embodiment; and FIGS. 45A to 45E are cross-sectional views illustrating the semiconductor device manufacturing process according to the fourth embodiment.

DESCRIPTION OF EMBODIMENT

Figure 25:
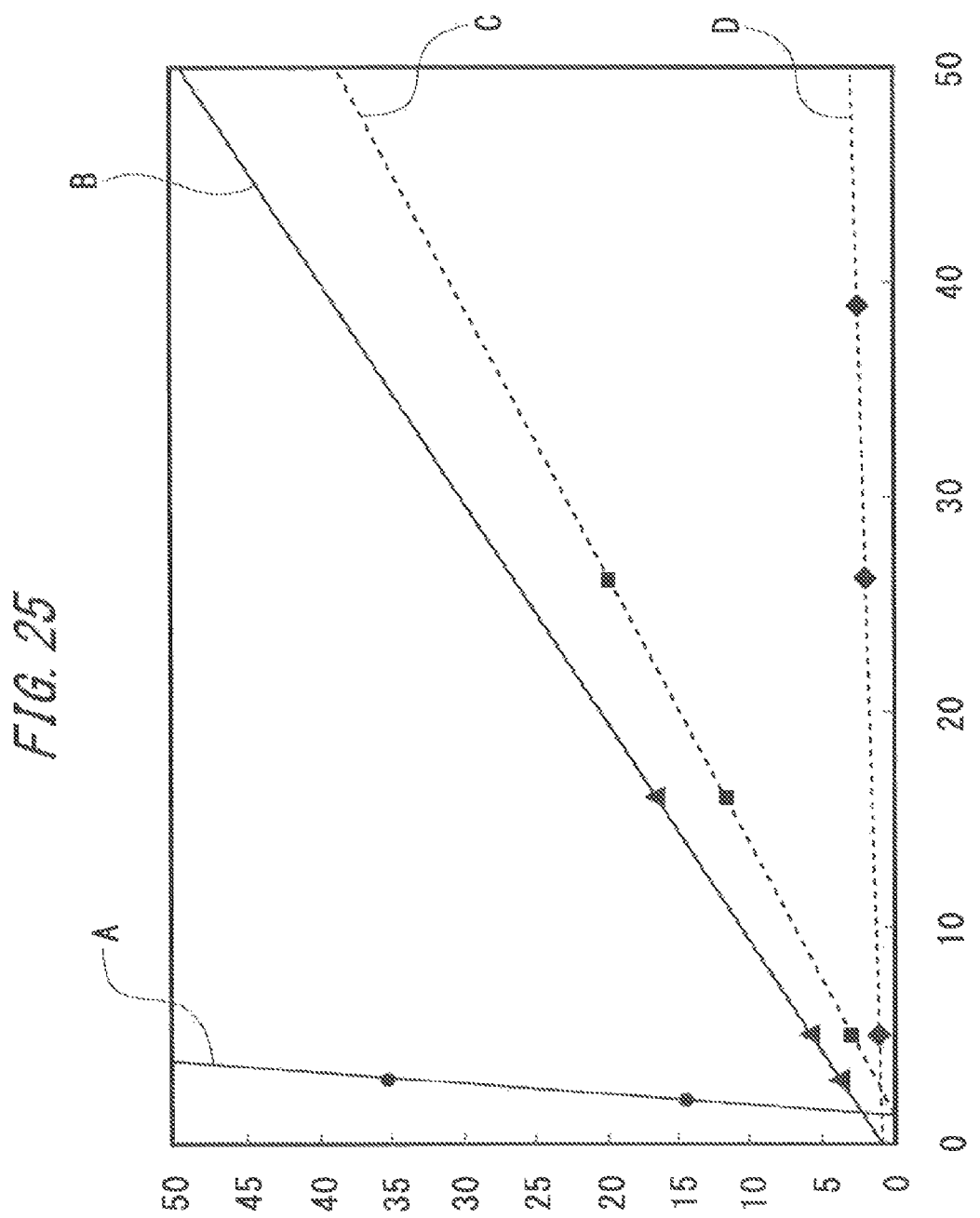
FIG. 25 is a graph illustrating an etching rate of a plasma silicon nitride film with respect to hydrofluoric acid.
Figures 28A, 28B, 28C:
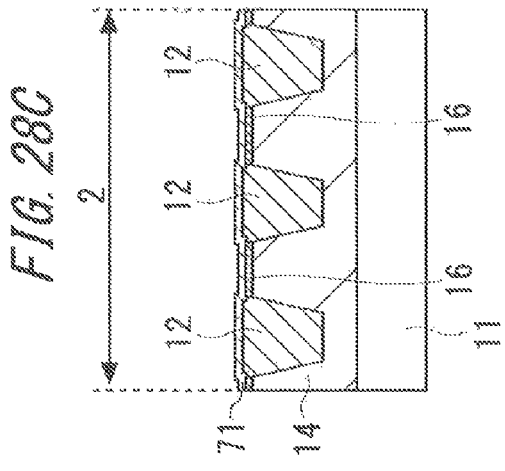
FIGS. 28A to 28E are cross-sectional views illustrating a semiconductor device manufacturing process according to a third embodiment.
Figure 28D:
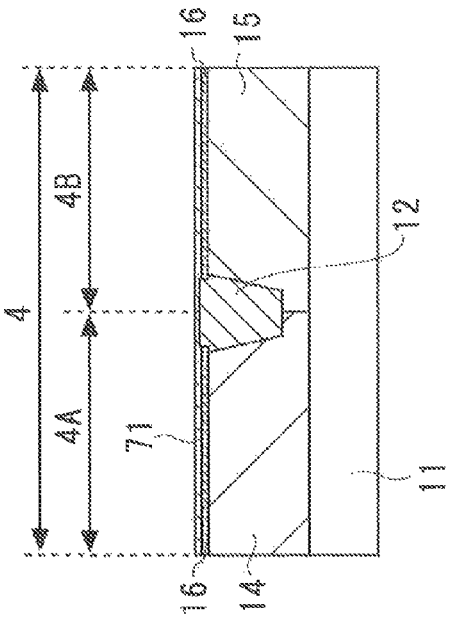
Figure 28E:
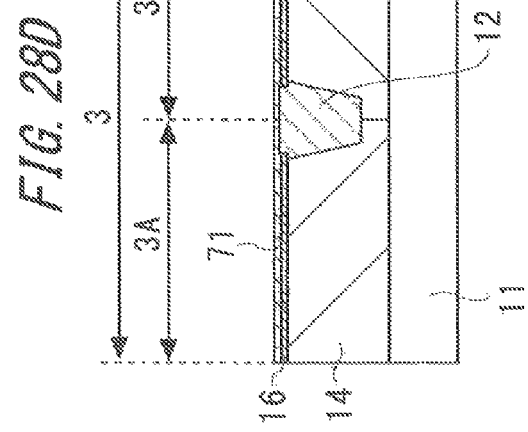

If the interval between adjacent ones of memory cells having a SONOS type memory transistor is short or if a charge storage film with high charge mobility is used in each memory cell, charges are exchanged between adjacent memory cells to decrease data retention. The term "data retention" refers to the time needed for stored data to be lost due to change in charges stored (held) in a charge storage film with time. A semiconductor device manufacturing method and a semiconductor device according to an embodiment will be described below with reference to the drawings. The configurations of the first to fourth embodiments below are illustrative only, and semiconductor device manufacturing methods and semiconductor devices according to embodiments are not limited to the configurations of the first to fourth embodiments.

First Embodiment

A semiconductor device manufacturing method and a semiconductor device according to a first embodiment will be described. The first embodiment will be described in the context of a semiconductor device having a flash memory and a logic circuit. FIG. 1 is a plan view illustrating a semiconductor device manufacturing process according to the first embodiment and a partial plan view of a select transistor region 1 and a memory transistor region 2 of a semiconductor device. The memory transistor region 2 is an example of a first region. The select transistor region 1 is an example of a second region.

FIGS. 2A, 2B, 2C, 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B and 18C are cross-sectional views illustrating the semiconductor device manufacturing process according to the first embodiment and partial sectional views of the select transistor region 1 and the memory transistor region 2 of the semiconductor device. FIGS. 2A, 3A, 4A, 5A, 6A, 7A, 8A, 9A, 10A, 11A, 12A, 13A, 14A, 15A, 16A, 17A and 18A correspond to a cross-section taken along alternate long and short dash line A-A' in FIG. 1. FIGS. 2B, 3B, 4B, 5B, 6B, 7B, 8B, 9B, 10B, 11B, 12B, 13B, 14B, 15B, 16B, 17B and 18B correspond to a cross-section taken along alternate long and short dash line B-B' in FIG. 1. FIGS. 2C, 3C, 4C, 5C, 6C, 7C, 8C, 9C, 10C, 11C, 12C, 13C, 14C, 15C, 16C, 17C and 18C correspond to a cross-section taken along alternate long and short dash line C-C' in FIG. 1. FIGS. 2D, 2E, 3D, 3E, 4D, 4E, 5D, 5E, 6D, 6E, 7D, 7E, 8D, 8E, 9D, 9E, 10D, 10E, 11D, 11E, 12D, 12E, 13D, 13E, 14D, 14E, 15D, 15E, 16D, 16E, 17D 17E 18D and 18E are cross-sectional views illustrating the semiconductor device manufacturing process according to the first embodiment and partial sectional views of a logic region of the semiconductor device.

The steps illustrated in FIGS. 2A to 2E will be described. A semiconductor substrate 11 is first prepared. The semiconductor substrate 11 is, for example, a P-type silicon substrate. The semiconductor substrate 11 includes a memory region where a flash memory cell is to be formed and a logic region. The memory region includes the select transistor region 1 and the memory transistor region 2. The logic region includes a first logic region 3 and a second logic region 4. The first logic region 3 has a P-type MOS (Metal Oxide Semiconductor) transistor formation region 3A and an N-type MOS transistor formation region 3B. The second logic region 4 has a P-type MOS transistor formation region 4A and an N-type MOS transistor formation region 4B.

Element isolation insulating films 12 are formed in the semiconductor substrate 11 by, for example, an STI (Shallow Trench Isolation) method. The element isolation insulating film 12 is, for example, a silicon oxide film (SiO$_2$ film). The element isolation insulating films 12 in the select transistor region 1 and the memory transistor region 2 are formed in the semiconductor substrate 11 so as to extend parallel to a bit line direction (gate length direction). In FIG. 1, the bit line direction is denoted by X while a word line direction (gate width direction) is denoted by Y. Sacrificial oxide films 13 are then formed on a surface of the semiconductor substrate 11 by, for example, a thermal oxidation method. The sacrificial oxide film 13 is, for example, a silicon oxide film.

The formation of the element isolation insulating films 12 and the sacrificial oxide films 13 may be performed by, for example, the method below. A silicon oxide film is formed on the semiconductor substrate 11 by a thermal oxidation method or a CVD (Chemical Vapor Deposition) method. A silicon nitride film is formed on the silicon oxide film by a CVD method. A resist film is formed on (applied to) the silicon nitride film. A mask pattern of a photomask for element isolation is exposure-transferred to the resist film using an exposure apparatus. A resist pattern is formed above the semiconductor substrate 11 by developing the resist film. A silicon nitride film pattern is formed by dry-etching the silicon nitride film using the resist pattern as a mask. Trenches are formed in the semiconductor substrate 11 by performing anisotropic dry etching using the silicon nitride film pattern as a mask. A silicon oxide film is formed in the trenches and on the silicon nitride film pattern by a high-density plasma CVD method. The silicon oxide film in the trenches and on the silicon nitride film pattern is planarized by a CMP (Chemical Mechanical Polishing) method using the silicon nitride film pattern as a polishing stopper, thereby forming the element isolation insulating films 12 in the semiconductor substrate 11. With the formation of the element isolation insulating films 12 in the semiconductor substrate 11, active regions (element formation regions) are delimited in the semiconductor substrate 11. The silicon oxide film in each element isolation insulating film is densified by annealing. The silicon nitride film pattern is removed by phosphoric acid boiling, and the silicon oxide films formed on the semiconductor substrate 11 are exposed. The exposed silicon oxide films are removed with hydrofluoric acid, and the sacrificial oxide films 13 are then formed on the semiconductor substrate 11 to a thickness of, e.g., 10 nm by, for example, a thermal oxidation method.

The steps illustrated in FIGS. 3A to 3E will be described. Impurities are ion-implanted into the semiconductor substrate 11, thereby forming N-type wells 14 and P-type wells 15 in the semiconductor substrate 11. The N-type wells 14 are formed in the semiconductor substrate 11 in the select transistor region 1, the memory transistor region 2, the P-type MOS transistor formation region 3A of the first logic region 3, and the P-type MOS transistor formation region 4A of the second logic region 4. The P-type wells 15 are formed in the semiconductor substrate 11 in the N-type MOS transistor formation region 3B of the first logic region 3 and the N-type MOS transistor formation region 4B of the second logic region 4. An impurity for threshold voltage control is ion-implanted into the semiconductor substrate 11. Note that a whole region except an N-type impurity implantation region is covered with a resist pattern at the time of ion implantation of an N-type impurity. The whole region except a P-type impurity implantation region is covered with a resist pattern at the time of ion implantation of a P-type impurity. The separate ion implantation operations for the impurities are also performed on each occasion of ion implantation (to be described below).

The steps illustrated in FIGS. 4A to 4E will be described. After the sacrificial oxide films 13 are removed by wet etching using hydrofluoric acid (HF), tunnel oxide films (lower insulating films) 16 are formed on the surface of the semiconductor substrate 11. The tunnel oxide film 16 is an example of a first film. The tunnel oxide films 16 are formed by, for example, a thermal oxidation method, a radical oxidation method, a plasma oxidation method, or a CVD method. The tunnel oxide film 16 is, for example, a silicon oxide film. The thickness of the tunnel oxide film 16 is, for example, about not less than 2 nm and not more than 15 nm. A charge storage film 17 is formed on the element isolation insulating films 12 and on the tunnel oxide films 16 by a CVD method. The charge storage film 17 is an example of a second film. The charge storage film 17 is, for example, a silicon nitride film (SiN film). The thickness of the charge storage film 17 is, for example, about not less than 5 nm and not more than 30 nm. A surface oxide film (not illustrated) may be formed on the charge storage film 17 by, for example, a plasma oxidation method. The formation of the surface oxide film is dispensable and may be omitted.

The steps illustrated in FIGS. 5A to 5E will be described. A resist pattern 18 which covers the memory transistor region 2 and is open in the select transistor region 1, the first logic region 3, and the second logic region 4 is formed above the semiconductor substrate 11 by, for example, photolithography. The resist pattern 18 is an example of a second resist pattern. The thickness of the resist pattern 18 is, for example, about not less than 300 nm and not more than 1000 nm. An anti-reflection film may be formed under or on the resist pattern 18.

The steps illustrated in FIGS. 6A to 6E will be described. Anisotropic dry etching is performed using the resist pattern 18 as a mask under an etching condition with a high selection ratio (selectivity), thereby etching the charge storage film 17. With this etching, the charge storage films 17 in the select transistor region 1, the first logic region 3, and the second logic region 4 are removed. The anisotropic dry etching under the etching condition with the high selection ratio in each step illustrated in FIG. 6A to 6E is an example of second etching. If a surface oxide film is formed on each charge storage film 17, the surface oxide film and the charge storage film 17 are removed. The etching condition with the high selection ratio is that the etching rate of a silicon nitride film is higher than that of an oxide film. An etching gas is, for example, (1) CH$_x$F$_y$ (x and y are the numbers of atoms), a gaseous mixture of Ar and O$_2$, (2) a gaseous mixture of SF$_6$, Ar, and O$_2$, (3) a gaseous mixture of SF$_6$, He, and O$_2$, (4) a gaseous mixture of NF$_3$ and O$_2$, (5) a gaseous mixture of CF$_4$ and O$_2$, or (6) a gaseous mixture of CF$_4$, HBr, and O$_2$. Since the tunnel oxide films 16 function as etching stopper films, the etching stops at the tunnel oxide films 16, which inhibits damage to the semiconductor substrate 11.

Under the etching condition with the high selection ratio, the etching gas includes O$_2$ to improve the selection ratio of a nitride film to an oxide film. In this case, reaction between O$_2$ and the resist pattern 18 etches the resist pattern 18, which causes the resist pattern 18 to retreat. Note that since the thickness of the resist pattern 18 is sufficiently large, even if the anisotropic dry etching is performed under the etching condition with the high selection ratio, the resist pattern 18 that covers the memory transistor region 2 remains. The resist pattern 18 is then removed by, for example, chemical solution treatment using a sulfuric acid-hydrogen peroxide mixture (SPM) and an ammonia-hydrogen peroxide mixture (APM).

The steps illustrated in FIGS. 7A to 7E will be described. A resist pattern 19 which is open above the element isolation insulating films 12 in the select transistor region 1 and the memory transistor region 2 is formed above the semiconductor substrate 11 by, for example, photolithography. The resist pattern 19 is an example of a first resist pattern. An anti-reflection film may be formed under or on the resist pattern 19. The element isolation insulating films 12 in the select transistor region 1 and the memory transistor region 2 are formed so as to extend parallel to the bit line direction. Thus, the resist pattern 19 has openings which extend parallel to the bit line direction. The resist pattern 19 covers the select transistor region 1 and the memory transistor region 2 except the element isolation insulating films 12, the first logic region 3, and the second logic region 4.

The steps illustrated in FIGS. 8A to 8E will be described. Anisotropic dry etching is performed using the resist pattern 19 as a mask under an etching condition with a low selection ratio, thereby etching the charge storage film 17. With this etching, the charge storage films 17 on the element isolation insulating films 12 in the memory transistor region 2 are removed. The anisotropic dry etching under the etching condition with the low selection ratio in each step illustrated in FIGS. 8A to 8E is an example of first etching. If a surface oxide film is formed on each charge storage film 17, the surface oxide film and the charge storage film 17 are removed.

The element isolation insulating films 12 in the select transistor region 1 and the memory transistor region 2 are formed so as to extend parallel to the bit line direction. Thus, the removal of the charge storage films 17 on the element isolation insulating films 12 in the memory transistor region 2 separates the charge storage film 17 in the memory transistor region 2 into a plurality of parts in the word line direction. Upper portions of the element isolation insulating films 12 in the select transistor region 1 and the memory transistor region 2 are partially removed.

The etching condition with the low selection ratio is that the etching rate of a silicon nitride film is lower than that of an oxide film. An etching gas is, for example, (1) $CF_4$ gas, (2) $SF_6$ gas, (3) $NF_3$ gas, (4) $Cl_2$ gas, (5) a gaseous mixture of $CF_4$, Ar, and $O_2$, (6) a gaseous mixture of $SF_6$, Ar, and $O_2$, (7) a gaseous mixture of $NF_3$, Ar, and $O_2$, and (8) a gaseous mixture of $Cl_2$, Ar, and $O_2$.

The openings of the resist pattern 19 are located above the element isolation insulating films 12. For this reason, although the element isolation insulating films 12 are shaved after the removal of the charge storage films 17, the semiconductor substrate 11 is not shaved. Thus, damage to the semiconductor substrate 11 is inhibited at the time of the removal of the charge storage films 17 on the element isolation insulating films 12 in the memory transistor region 2.

Under the etching condition with the low selection ratio, the etching gas does not include $O_2$ or the concentration of $O_2$ to be included in the etching gas is set to be low. This inhibits the resist pattern 19 from retreating due to the etching. In the case of, for example, a gaseous mixture of $CF_4$, Ar, and $O_2$, if the concentration of $O_2$ is not more than that of $CF_4$, the resist pattern 19 is inhibited from retreating due to the etching. The resist pattern 19 is then removed by, for example, chemical solution treatment using a sulfuric acid-hydrogen peroxide mixture (SPM) and an ammonia-hydrogen peroxide mixture (APM).

The steps illustrated in FIGS. 9A to 9E will be described. The tunnel oxide films 16 in the select transistor region 1, the first logic region 3, and the second logic region 4 are removed by performing wet etching using hydrofluoric acid. The wet etching using hydrofluoric acid in each step illustrated in FIGS. 9A to 9E is an example of third etching. If a surface oxide film is formed on each charge storage film 17, the tunnel oxide films 16 and the surface oxide films in the select transistor region 1, the first logic region 3, and the second logic region 4 are removed. Since the etching rate of a silicon nitride film with respect to hydrofluoric acid is low, if the charge storage film 17 is a silicon nitride film, the charge storage film 17 is not removed. Since the charge storage film 17 is formed on each tunnel oxide film 16 in the memory transistor region 2, the tunnel oxide films 16 in the memory transistor region 2 are not removed.

The steps illustrated in FIGS. 10A to 10E will be described. An oxide film is formed by, for example, a radical oxidation method using $H_2$ gas and $O_2$ gas at a temperature of about not less than 400° C. and not more than 1100° C. The thickness of the oxide film is, for example, about not less than 5 nm and not more than 15 nm.

This oxide film formation causes gate oxide films (gate insulating films) 21 to be formed on the surface of the semiconductor substrate 11 in the select transistor region 1 and top oxide films (upper insulating films) 22 to be formed on the charge storage films 17 in the memory transistor region 2. The top oxide film 22 is an example of a third film. The gate oxide film 21 is an example of a fourth film. The gate oxide film 21 and the top oxide film 22 are, for example, silicon oxide films. The oxide film formation also causes gate oxide films (gate insulating films) 23 to be formed on the surface of the semiconductor substrate 11 in the first logic region 3 and gate oxide films (gate insulating films) 24 to be formed on the surface of the semiconductor substrate 11 in the second logic region 4. The gate oxide films 23 and 24 are, for example, silicon oxide films. The oxide film formation further causes sidewalls of each charge storage film 17 in the memory transistor region 2 to be oxidized.

The oxide films may be formed by a plasma oxidation method instead of the radical oxidation method. The radical oxidation method or the plasma oxidation method is used to oxidize the surface of the semiconductor substrate 11 and the charge storage films 17 in the same step. The use of the radical oxidation method or the plasma oxidation method makes oxidation of the charge storage films 17 easier than use of another oxidation method, such as a thermal oxidation method.

The steps illustrated in FIGS. 11A to 11E will be described. A resist pattern 25 which is open in the first logic region 3 is formed above the semiconductor substrate 11 by performing, for example, photolithography. An anti-reflection film may be formed under or on the resist pattern 25. The gate oxide films 23 in the first logic region 3 are removed using the resist pattern 25 as a mask by wet etching using hydrofluoric acid.

The steps illustrated in FIGS. 12A to 12E will be described. The resist pattern 25 is removed by, for example, chemical solution treatment using a sulfuric acid-hydrogen peroxide mixture (SPM) and an ammonia-hydrogen peroxide mixture (APM). Gate oxide films (gate insulating films) 26 are formed on the surface of the semiconductor substrate 11 in the first logic region 3 by, for example, a thermal oxidation method. The thickness of the gate oxide film 26 is, for example, about not less than 1 nm and not more than 3 nm. With this thermal oxidation method, the gate oxide films 21 in the select transistor region 1 and the gate oxide films 24 in the second logic region 4 grow. The thicknesses of the gate oxide film 21 and the gate oxide film 24 become about 8 nm.

The steps illustrated in FIGS. 13A to 13E will be described. Polysilicon 27 which covers the select transistor region 1, the memory transistor region 2, the first logic region 3, and the second logic region 4 is formed by, for example, a CVD method.

The steps illustrated in FIGS. 14A to 14E will be described. A resist pattern (not illustrated) is formed on the polysilicon 27 by, for example, photolithography. Anisotropic dry etching is then performed using the resist pattern formed on the polysilicon 27 as a mask, thereby patterning the polysilicon 27. The patterning of the polysilicon 27 causes a gate electrode 31 to be formed on the gate oxide films 21 in the select transistor region 1 and a gate electrode 32 to be formed on the top oxide films 22 in the memory transistor region 2. The gate electrode 32 is an example of a first gate electrode. The gate electrode 31 is an example of a second gate electrode. The patterning of the polysilicon 27 also causes gate electrodes 33 to be formed on the gate oxide films 26 in the first logic region 3 and gate electrodes 34 to be formed on the gate oxide films 24 in the second logic region 4.

The steps illustrated in FIGS. 15A to 15E will be described. Wet etching using hydrofluoric acid is performed using the gate electrodes 31 to 34 as masks, thereby patterning the gate oxide films 21, 24, and 26 and the top oxide films 22. With this patterning, the gate oxide films 21, 24, and 26 and the top oxide films 22 in regions not covered with the gate electrodes 31 to 34 are removed. Thus, the gate oxide films 21 remain under the gate electrode 31, and the top oxide films 22 remain under the gate electrode 32. The gate oxide film 21 formed under the gate electrode 31 is an example of a second insulating film. The gate oxide films 26 remain under the gate electrodes 33 while the gate oxide films 24 remain under the gate electrodes 34.

The steps illustrated in FIGS. 16A to 16E will be described. A resist pattern 35 which is open in the select transistor region 1 and the memory transistor region 2 is formed above the semiconductor substrate 11 by performing, for example, photolithography. Anisotropic dry etching is performed using the gate electrodes 31 and 32 and the resist pattern 35 as masks, thereby patterning the charge storage films 17 in the memory transistor region 2. With the patterning of the charge storage films 17, the charge storage films 17 in regions not covered with the gate electrode 32 are removed. Wet etching using hydrofluoric acid is performed using the gate electrodes 31 and 32 and the resist pattern 35 as masks, thereby patterning the tunnel oxide films 16 in the memory transistor region 2. The resist pattern 35 is then removed by, for example, chemical solution treatment using a sulfuric acid-hydrogen peroxide mixture (SPM) and an ammonia-hydrogen peroxide mixture (APM).

With the patterning of the tunnel oxide films 16, the tunnel oxide films 16 in regions not covered with the gate electrode 32 are removed. The patterning of the tunnel oxide films 16 and the charge storage films 17 causes gate insulating films (ONO films), each having the tunnel oxide film 16, the charge storage film 17, and the top oxide film 22, to be formed (delimited) under the gate electrode 32 in the memory transistor region 2. The tunnel oxide films 16, the charge storage films 17, and the top oxide films 22 are patterned using the gate electrode 32 as a mask. For this reason, each gate insulating film having the tunnel oxide film 16, the charge storage film 17, and the top oxide film 22 is formed to be self-aligned with the gate electrode 32. The gate insulating film having the tunnel oxide film 16, the charge storage film 17, and the top oxide film 22 is an example of a first insulating film.

The steps illustrated in FIGS. 17A to 17E will be described. Formation of a resist pattern (not illustrated) by, for example, photolithography, ion implantation of impurities, and removal of the resist pattern are appropriately repeated. With the repetition, P-type LDD (Lightly Doped Drain) regions 36 are formed in the select transistor region 1 and the memory transistor region 2. P-type LDD regions 37 are formed in the P-type MOS transistor formation region 3A while N-type LDD regions 38 are formed in the N-type MOS transistor formation region 3B. P-type LDD regions 39 are formed in the P-type MOS transistor formation region 4A while N-type LDD regions 40 are formed in the N-type MOS transistor formation region 4B.

The steps illustrated in FIGS. 18A to 18E will be described. An oxide film is formed across the surface of the semiconductor substrate 11 by, for example, a CVD method, and etchback is performed, thereby forming sidewalls 41 on side surfaces of the gate electrodes 31 to 34. Formation of a resist pattern (not illustrated) by, for example, photolithography, ion implantation of impurities, and removal of the resist pattern are then appropriately repeated. With the repetition, P-type source-drain regions 42 are formed in the select transistor region 1 and the memory transistor region 2. P-type source-drain regions 43 are formed in the P-type MOS transistor formation region 3A while N-type source-drain regions 44 are formed in the N-type MOS transistor formation region 3B. P-type source-drain regions 45 are formed in the P-type MOS transistor formation region 4A while N-type source-drain regions 46 are formed in the N-type MOS transistor formation region 4B. A metal film of, for example, Ni (nickel), Ti (titanium), or Co (cobalt) is then formed on the semiconductor substrate 11, and heat treatment is performed. With these operations, silicides 47 are formed on the gate electrodes 31 to 34, on the P-type source-drain regions 42, 43, and 45, and on the N-type source-drain regions 44 and 46.

A plurality of select transistors 51 are formed in the select transistor region 1 while a plurality of memory transistors 52 are formed in the memory transistor region 2. The memory transistor 52 is an example of a first transistor. The select transistor 51 is an example of a second transistor. A plurality of P-type MOS transistors 53 are formed in the P-type MOS transistor formation region 3A while a plurality of N-type MOS transistors 54 are formed in the N-type MOS transistor formation region 3B. The P-type MOS transistor 53 and the N-type MOS transistor 54 are, for example, MOS transistors which are driven at, for example, 1.2 V. A plurality of P-type MOS transistors 55 are formed in the P-type MOS transistor formation region 4A while a plurality of N-type MOS transistors 56 are formed in the N-type MOS transistor formation region 4B. The P-type MOS transistor 55 and the N-type MOS transistor 56 are, for example, MOS transistors which are driven at, for example, 3.3 V. After an interlayer insulating film, contact holes, contact plugs, and a piece of wiring, and the like are formed, desired back-end processing is performed, thereby manufacturing the semiconductor device.

According to the first embodiment, the charge storage film 17 is separated into a plurality of parts in the word line direction. That is, the charge storage films 17 of the memory transistors 52 adjacent in the word line direction are separate, and the charge storage films 17 of the memory transistors 52 adjacent in the word line direction are not connected to each other. Additionally, the sidewalls of the charge storage film 17 of each memory transistor 52 are oxidized, and the top oxide film 22 is formed so as to cover the charge storage film 17. With this configuration, charges are inhibited from being transferred between the charge storage films 17 of the memory transistors 52 adjacent in the word line direction. Thus, charges stored (retained) in the charge storage film 17 of the memory transistor 52 are inhibited from changing, which allows inhibition of decrease in data retention. For example, even if the interval between the memory transistors 52 adjacent in the word line direction is short or if the charge storage film 17 with high charge mobility is used, charges stored in the charge storage film 17 are inhibited from changing, which allows inhibition of decrease in data retention.

The structure of the memory transistor 52 according to the first embodiment will be described. The tunnel oxide films 16, the charge storage films 17, and the top oxide films 22 of the memory transistors 52 adjacent in the word line direction are not connected to each other, respectively. Thus, the gate insulating films (the tunnel oxide films 16, the charge storage films 17, and the top oxide films 22) of the memory transistors 52 adjacent in the word line direction are separate from each other. The gate electrodes 32 of the memory transistors 52 adjacent in the word line direction are connected to each other. The gate electrode 32 is formed between the memory transistors 52 adjacent in the word line direction. An upper portion of each element isolation insulating film 12 in the memory transistor region 2 is partially removed. For this reason, the gate electrodes 32 are formed so as to cover side surfaces of the tunnel oxide films 16, the charge storage films 17, and the top oxide films 22 in the word line direction.

The structure of the select transistor 51 according to the first embodiment will be described. The gate oxide films 21 of the select transistors 51 adjacent in the word line direction are not connected to each other. The gate electrodes 31 of the select transistors 51 adjacent in the word line direction are connected to each other.

In the case of a floating gate type memory transistor, an impurity may not be implanted into a gate electrode of a select transistor at the time of source-drain region formation, and a sufficient amount of impurity may not be implanted into the gate electrode of the select transistor. For this reason, a floating gate type memory transistor may cause the problem of depletion of a gate electrode of a select transistor.

The gate electrode 31 of each select transistor 51 and the gate electrode 32 of each memory transistor 52 are formed in the same layer. For this reason, when the P-type source-drain regions 42 are to be formed in the select transistor region 1 and the memory transistor region 2, an impurity can be implanted into the gate electrodes 31 of the select transistors 51 and the gate electrodes 32 of the memory transistors 52. Thus, the impurity concentration in the gate electrode 31 of each select transistor 51 can be increased, and the gate electrode 31 of each select transistor 51 can be inhibited from being depleted. As a result, the threshold voltage of each select transistor 51 can be decreased, which allows decrease in the operating voltage of each select transistor 51.

Modification of First Embodiment

The first embodiment may be modified in the manner below. The steps illustrated in FIGS. 5A to 6E and the steps illustrated in FIGS. 7A to 8E may be interchanged. That is, the steps illustrated in FIGS. 7A to 8E may be performed after the steps illustrated in FIGS. 4A to 4E are performed, and the steps illustrated in FIGS. 5A to 6E may then be performed.

Second Embodiment

A semiconductor device manufacturing method and a semiconductor device according to a second embodiment will be described. The second embodiment will be described in the context of a semiconductor device having a flash memory and a logic circuit. As the process leading to steps of forming N-type wells 14 and P-type wells 15 in a semiconductor substrate 11 and ion-implanting an impurity for threshold voltage control into the semiconductor substrate 11 in the semiconductor device manufacturing method according to the second embodiment, the same steps as those illustrated in FIGS. 1 to 3E in the first embodiment are performed. Since the steps illustrated in FIGS. 1 to 3E in the first embodiment have already been described, a description thereof will be omitted.

FIGS. 19A, 19B, 19C, 20A, 20B, 20C, 21A, 21B, 21C, 22A, 22B, 22C, 23A, 23B, 23C, 24A, 24B, 24C, 26A, 26B, 26C, 27A, 27B, and 27C are cross-sectional views illustrating a semiconductor device manufacturing process according to the second embodiment and partial sectional views of a select transistor region 1 and a memory transistor region 2 of a semiconductor device. FIGS. 19A, 20A, 21A, 22A, 23A, 24A, 26A, and 27A correspond to a cross-section taken along alternate long and short dash line A-A' in FIG. 1. FIGS. 19B, 20B, 21B, 22B, 23B, 24B, 26B, and 27B correspond to a cross-section taken along alternate long and short dash line B-B' in FIG. 1. FIGS. 19C, 20C, 21C, 22C, 23C, 24C, 26C, and 27C correspond to a cross-section taken along alternate long and short dash line C-C' in FIG. 1. FIGS. 19D, 19E, 20D, 20E, 21D, 21E, 22D, 22E, 23D, 23E, 24D, 24E, 26D, 26E, 27D, and 27E are cross-sectional views illustrating the semiconductor device manufacturing process according to the second embodiment and partial sectional views of a logic region of the semiconductor device.

The steps illustrated in FIGS. 19A to 19E will be described. After sacrificial oxide films 13 are removed by wet etching using hydrofluoric acid (HF), tunnel oxide films (lower insulating films) 16 are formed on a surface of the semiconductor substrate 11. The tunnel oxide films 16 are formed by, for example, a thermal oxidation method, a radical oxidation method, a plasma oxidation method, or a CVD method. The tunnel oxide film 16 is, for example, a silicon oxide film. The thickness of the tunnel oxide film 16 is, for example, about not less than 2 nm and not more than 15 nm. A charge storage film 61 is formed on element isolation insulating films 12 and on the tunnel oxide films 16 by a plasma CVD method. The charge storage film 61 is an example of a second film. The charge storage film 61 is, for example, a plasma silicon nitride film (P—SiN film). The thickness of the charge storage film 61 is, for example, about not less than 5 nm and not more than 30 nm. The plasma CVD method is preferably such that, for example, a gaseous mixture of $SiH_4$, $NH_3$, and $N_2$ is used and such that the ratio of $SiH_4$ to $NH_3$ ($SiH_4/NH_3$) is not less than 0.1 and not more than 0.4. Alternatively, the plasma CVD method may use, for example, a gaseous mixture of $SiH_4$ and $N_2$ or a gaseous mixture of $SiH_4$ and $NH_3$. A surface oxide film (not illustrated) may then be formed on the charge storage film 61 by, for example, a plasma oxidation method. The formation of the surface oxide film is dispensable and may be omitted.

The steps illustrated in FIGS. 20A to 20E will be described. A resist pattern 62 which covers the memory transistor region 2 and is open in the select transistor region 1, a first logic region 3, and a second logic region 4 is formed above the semiconductor substrate 11 by, for example, photolithography. The resist pattern 62 is an example of a second resist pattern. An anti-reflection film may be formed under or on the resist pattern 62.

The steps illustrated in FIGS. 21A to 21E will be described. Wet etching using hydrofluoric acid is performed using the resist pattern 62 as a mask, thereby etching the charge storage film 61. With this etching, the charge storage films 61 in the select transistor region 1, the first logic region 3, and the second logic region 4 are removed. The wet etching using hydrofluoric acid in each step illustrated in FIGS. 21A to 21E is an example of second etching. Since the etching rate of a plasma silicon nitride film is high in the wet etching using hydrofluoric acid, the charge storage film 61 can be easily removed by the wet etching using hydrofluoric acid. The resist pattern 62 is then removed by, for example, chemical solution treatment using a sulfuric acid-hydrogen peroxide mixture (SPM) and an ammonia-hydrogen peroxide mixture (APM).

The steps illustrated in FIGS. 22A to 22E will be described. A resist pattern 63 which is open above the element isolation insulating films 12 in the select transistor region 1 and the memory transistor region 2 is formed above the semiconductor substrate 11 by, for example, photolithography. The resist pattern 63 is an example of a first resist pattern. An antireflection film may be formed under or on the resist pattern 63. The element isolation insulating films 12 in the select transistor region 1 and the memory transistor region 2 are formed so as to extend parallel to a bit line direction. Thus, the resist pattern 63 has openings which extend parallel to the bit line direction. The resist pattern 63 covers the select transistor region 1 and the memory transistor region 2 except the element isolation insulating films 12, the first logic region 3, and the second logic region 4.

The steps illustrated in FIGS. 23A to 23E will be described. Anisotropic dry etching is performed using the resist pattern 63 as a mask under an etching condition with a low selection ratio, thereby etching the charge storage film 61. With this etching, the charge storage films 61 on the element isolation insulating films 12 in the memory transistor region 2 are removed. The anisotropic dry etching under the etching condition with the low selection ratio in each step illustrated in FIGS. 23A to 23E is an example of first etching. If a surface oxide film is formed on each charge storage film 61, the surface oxide film and the charge storage film 61 are removed. The element isolation insulating films 12 in the select transistor region 1 and the memory transistor region 2 are formed so as to extend parallel to the bit line direction. Thus, the removal of the charge storage films 61 on the element isolation insulating films 12 in the memory transistor region 2 separates the charge storage film 61 in the memory transistor region 2 into a plurality of parts in a word line direction. Additionally, upper portions of the element isolation insulating films 12 in the select transistor region 1 and the memory transistor region 2 are partially removed. The etching condition with the low selection ratio and the type of an etching gas are the same as those in the first embodiment.

The openings of the resist pattern 63 are located above the element isolation insulating films 12. For this reason, although the element isolation insulating films 12 are shaved after the removal of the charge storage films 61, the semiconductor substrate 11 is not shaved. Thus, damage to the semiconductor substrate 11 is inhibited at the time of the removal of the charge storage films 61 on the element isolation insulating films 12 in the memory transistor region 2.

Under the etching condition with the low selection ratio, the etching gas does not include $O_2$ or the concentration of $O_2$ to be included in the etching gas is set to be low. This inhibits the resist pattern 63 from retreating due to the etching. In the case of, for example, a gaseous mixture of $CF_4$, Ar, and $O_2$, if the concentration of $O_2$ is not more than that of $CF_4$, the resist pattern 63 is inhibited from retreating due to the etching. The resist pattern 63 is then removed by, for example, chemical solution treatment using a sulfuric acid-hydrogen peroxide mixture (SPM) and an ammonia-hydrogen peroxide mixture (APM).

The steps illustrated in FIGS. 24A to 24E will be described. Annealing is performed, for example, under the condition in an atmosphere of nitrogen ($N_2$) at about 750° C. for about 90 seconds. Alternatively, the annealing may be performed under the condition in an atmosphere of nitrogen at about 800° C. for about 30 seconds. A thermal oxidation method, a radical oxidation method, or a plasma oxidation method may be performed instead of the annealing. Heat treatment through the annealing, the thermal oxidation method, the radical oxidation method, or the plasma oxidation method decreases the etching rate of a plasma silicon nitride film with respect to hydrofluoric acid.

FIG. 25 is a graph illustrating the etching rate of a plasma silicon nitride film with respect to hydrofluoric acid. The ordinate represents the amount of etching of a plasma silicon nitride film while the abscissa represents the amount of hydrofluoric acid. The amount of hydrofluoric acid is expressed in terms of the amount of etching of a thermal oxide film. A solid line A indicates the etching rate of a plasma silicon nitride film which is formed using a gaseous mixture of $SiH_4$, $NH_3$ and $N_2$ with the ratio $SiH_4/NH_3$ set to 0.1 with respect to hydrofluoric acid. A solid line B indicates the etching rate of a plasma silicon nitride film which is formed using a gaseous mixture of $SiH_4$, $NH_3$ and $N_2$ with the ratio $SiH_4/NH_3$ set to 0.33 with respect to hydrofluoric acid. A dotted line C indicates the etching rate of a plasma silicon nitride film which is obtained after a plasma silicon nitride film having the film quality indicated by the solid line A is annealed with respect to hydrofluoric acid. A dotted line D indicates the etching rate of a plasma silicon nitride film which is obtained after a plasma silicon nitride film having the film quality indicated by the solid line B is annealed with respect to hydrofluoric acid. The annealing is performed under the condition in an atmosphere of nitrogen at 750° C. for 90 seconds.

As illustrated in FIG. 25, the etching rate of a plasma silicon nitride film with respect to hydrofluoric acid decreases with increase in the ratio $SiH_4/NH_3$ in a gaseous mixture of $SiH_4$, $NH_3$ and $N_2$. Additionally, as illustrated in FIG. 25, the etching rate of a plasma silicon nitride film with respect to hydrofluoric acid is different between before annealing and after annealing. After annealing, the etching rate of a plasma silicon nitride film with respect to hydrofluoric acid is lower. For example, if the ratio $SiH_4/NH_3$ in a gaseous mixture of $SiH_4$, $NH_3$ and $N_2$ is 0.33, annealing greatly decreases the etching rate of a plasma silicon nitride film with respect to hydrofluoric acid.

The steps illustrated in FIGS. 26A to 26E will be described. The tunnel oxide films 16 in the select transistor region 1, the first logic region 3, and the second logic region 4 are removed by performing wet etching using hydrofluoric acid. The wet etching using hydrofluoric acid in each step illustrated in FIGS. 26A to 26E is an example of third etching. If a surface oxide film is formed on each charge storage film 61, the tunnel oxide films 16 and the surface oxide films in the select transistor region 1, the first logic region 3, and the second logic region 4 are removed. The heat treatment has been performed in each step illustrated in FIGS. 24A to 24E. Since the charge storage film 61 has a decreased etching rate with respect to hydrofluoric acid, the charge storage films 61 in the memory transistor region 2 are not removed. Additionally, since the charge storage film 61 is formed on each tunnel oxide film 16 in the memory transistor region 2, the tunnel oxide films 16 in the memory transistor region 2 are not removed.

The steps illustrated in FIGS. 27A to 27E will be described. An oxide film is formed by, for example, a radical oxidation method using $H_2$ gas and $O_2$ gas at a temperature of about not less than 400° C. and not more than 1100° C. The thickness of the oxide film is, for example, about not less than 5 nm and not more than 15 nm.

This oxide film formation causes gate oxide films (gate insulating films) 21 to be formed on the surface of the semiconductor substrate 11 in the select transistor region 1 and top oxide films (upper insulating films) 22 to be formed on the charge storage films 61 in the memory transistor region 2. The gate oxide film 21 and the top oxide film 22 are, for example, silicon oxide films. The oxide film formation also causes gate oxide films (gate insulating films) 23 to be formed on the surface of the semiconductor substrate 11 in the first logic region 3 and gate oxide films (gate insulating films) 24 to be formed on the surface of the semiconductor substrate 11 in the second logic region 4. The gate oxide films 23 and 24 are, for example, silicon oxide films. The oxide film formation further causes sidewalls of each charge storage film 61 in the memory transistor region 2 to be oxidized.

The oxide films may be formed by a plasma oxidation method instead of the radical oxidation method. The radical oxidation method or the plasma oxidation method is used to oxidize the surface of the semiconductor substrate 11 and the charge storage films 61 in the same step. The use of the radical oxidation method or the plasma oxidation method makes oxidation of the charge storage films 61 easier than use of another oxidation method, such as a thermal oxidation method. After the steps illustrated in FIGS. 27A to 27E, the same steps as those illustrated in FIGS. 11A to 18E in the first embodiment are performed. Since the steps illustrated in FIGS. 11A to 18E in the first embodiment have already been described, a description thereof will be omitted. Additionally, since the structure of a select transistor 51 and the structure of a memory transistor 52 in the second embodiment are the same as those in the first embodiment, a description thereof will be omitted.

According to the second embodiment, the charge storage film 61 is separated into a plurality of parts in the word line direction. That is, the charge storage films 61 of the adjacent memory transistors 52 are separate, and the charge storage films 61 of the adjacent memory transistors 52 are not connected to each other. Additionally, the sidewalls of the charge storage film 61 of each memory transistor 52 are oxidized, and the top oxide film 22 is formed so as to cover the charge storage film 61. With this configuration, charges are inhibited from being transferred between the charge storage films 61 of the adjacent memory transistors 52. Thus, charges stored (retained) in the charge storage film 61 of the memory transistor 52 are inhibited from changing, which allows inhibition of decrease in data retention. For example, even if the interval between the adjacent memory transistors 52 is short or if the charge storage film 61 with high charge mobility is used, charges stored in the charge storage film 61 are inhibited from changing, which allows inhibition of decrease in data retention.

The second embodiment may be modified in the manner below.

First Modification of Second Embodiment

The steps illustrated in FIGS. 20A to 21E and the steps illustrated in FIGS. 22A to 23E may be interchanged. That is, the steps illustrated in FIGS. 22A to 23E may be performed after the steps illustrated in FIGS. 19A to 19E are performed, and the steps illustrated in FIGS. 20A to 21E may then be performed.

Second Modification of Second Embodiment

The steps illustrated in FIGS. 22A to 23E and the steps illustrated in FIGS. 24A to 24E may be interchanged. That is, the steps illustrated in FIGS. 24A to 24E may be performed after the steps illustrated in FIGS. 21A to 21E is performed, and the steps illustrated in FIGS. 22A to 23E may then be performed.

Third Embodiment

A semiconductor device manufacturing method and a semiconductor device according to a third embodiment will be described. The third embodiment will be described in the context of a semiconductor device having a flash memory and a logic circuit. As the process leading to steps of forming N-type wells 14 and P-type wells 15 in a semiconductor substrate 11 and ion-implanting an impurity for threshold voltage control into the semiconductor substrate 11 in the semiconductor device manufacturing method according to the third embodiment, the same steps as those illustrated in FIGS. 1 to 3E in the first embodiment are performed. Since the steps illustrated in FIGS. 1 to 3E in the first embodiment have already been described, a description thereof will be omitted.

FIGS. 28A, 28B, 28C, 29A, 29B, 29C, 30A, 30B, 30C, 31A, 31B, 31C, 32A, 32B, 32C, 33A, 33B, 33C, 34A, 34B, 34C, 35A, 35B, and 35C are cross-sectional views illustrating a semiconductor device manufacturing process according to the third embodiment and partial sectional views of a select transistor region 1 and a memory transistor region 2 of a semiconductor device. FIGS. 28A, 29A, 30A, 31A, 32A, 33A, 34A, and 35A correspond to a cross-section taken along alternate long and short dash line A-A' in FIG. 1. FIGS. 28B, 29B, 30B, 31B, 32B, 33B, 34B, and 35B correspond to a cross-section taken along alternate long and short dash line B-B' in FIG. 1. FIGS. 28C, 29C, 30C, 31C, 32C, 33C, 34C, and 35C correspond to a cross-section taken along alternate long and short dash line C-C' in FIG. 1. FIGS. 28D, 28E, 29D, 29E, 30D, 30E, 31D, 31E, 32D, 32E, 33D, 33E, 34D, 34E, 35D, and 35E are cross-sectional views illustrating the semiconductor device manufacturing process according to the third embodiment and partial sectional views of a logic region of the semiconductor device.

The steps illustrated in FIGS. 28A to 28E will be described. After sacrificial oxide films 13 are removed by wet etching using hydrofluoric acid (HF), tunnel oxide films (lower insulating films) 16 are formed on a surface of the semiconductor substrate 11. The tunnel oxide films 16 are formed by, for example, a thermal oxidation method, a radical oxidation method, a plasma oxidation method, or a CVD method. The tunnel oxide film 16 is, for example, a silicon oxide film. The thickness of the tunnel oxide film 16 is, for example, about not less than 2 nm and not more than 15 nm. A charge storage film 71 is formed on element isolation insulating films 12 and on the tunnel oxide films 16 by a plasma CVD method. The charge storage film 71 is an example of a second film. The charge storage film 71 is, for example, a plasma silicon nitride film (P—SiN film). The thickness of the charge storage film 71 is, for example, about not less than 5 nm and not more than 30 nm. The plasma CVD method uses, for example, a gaseous mixture of $SiH_4$, $NH_3$, and $N_2$. The plasma CVD method may use, for example, a gaseous mixture of $SiH_4$ and $N_2$ or a gaseous mixture of $SiH_4$ and $NH_3$. Alternatively, a surface oxide film (not illustrated) may then be formed on the charge storage film 71 by, for example, a plasma oxidation method. The formation of the surface oxide film is dispensable and may be omitted.

The steps illustrated in FIGS. 29A to 29E will be described. A resist pattern 72 which covers the memory transistor region 2 and is open in the select transistor region 1, a first logic region 3, and a second logic region 4 is formed above the semiconductor substrate 11 by, for example, photolithography. The resist pattern 72 is an example of a second resist pattern. The thickness of the resist pattern 72 is, for example, about not less than 300 nm and not more than 1000 nm. An anti-reflection film may be formed under or on the resist pattern 72.

The steps illustrated in FIGS. 30A to 30E will be described. Anisotropic dry etching is performed using the resist pattern 72 as a mask under an etching condition with a high selection ratio, thereby etching the charge storage film 71. With this etching, the charge storage films 71 in the select transistor region 1, the first logic region 3, and the second logic region 4 are removed. The anisotropic dry etching under the etching condition with the high selection ratio in each step illustrated in FIGS. 30A to 30E is an example of second etching. If a surface oxide film is formed on each charge storage film 71, the surface oxide film and the charge storage film 71 are removed. The etching condition with the high selection ratio and the type of an etching gas are the same as those in the first embodiment. Since the tunnel oxide films 16 function as etching stopper films, the etching stops at the tunnel oxide films 16, which inhibits damage to the semiconductor substrate 11.

Under the etching condition with the high selection ratio, the etching gas includes $O_2$ to improve the selection ratio of a nitride film to an oxide film. In this case, reaction between $O_2$ and the resist pattern 72 etches the resist pattern 72, which causes the resist pattern 72 to retreat. Note that since the thickness of the resist pattern 72 is sufficiently large, even if the anisotropic dry etching is performed under the etching condition with the high selection ratio, the resist pattern 72 that covers the memory transistor region 2 remains. The resist pattern 72 is then removed by, for example, chemical solution treatment using a sulfuric acid-hydrogen peroxide mixture (SPM) and an ammonia-hydrogen peroxide mixture (APM).

The steps illustrated in FIGS. 31A to 31E will be described. Sacrificial oxide films 73 are formed on the tunnel oxide films 16 and on the charge storage film 71 by, for example, a radical oxidation method or a plasma oxidation method. The sacrificial oxide film 73 is an example of a second oxide film. The sacrificial oxide film 73 is, for example, a silicon oxide film. Heat treatment through the radical oxidation method or the plasma oxidation method repairs damage to the semiconductor substrate 11. Damage to the semiconductor substrate 11 is repaired by oxidizing a damaged part of the semiconductor substrate 11 by the radical oxidation method or the plasma oxidation method and removing the oxidized part in a subsequent step using hydrofluoric acid. For example, if the semiconductor substrate 11 has been damaged in the steps illustrated in FIGS. 30A to 30E or another step, heat treatment is performed through the radical oxidation method or the plasma oxidation method, thereby repairing the damage to the semiconductor substrate 11. The heat treatment decreases the etching rate of the charge storage film 71 with respect to hydrofluoric acid.

The steps illustrated in FIGS. 32A to 32E will be described. A resist pattern 74 which is open above the element isolation insulating films 12 in the select transistor region 1 and the memory transistor region 2 is formed above the semiconductor substrate 11 by, for example, photolithography. The resist pattern 74 is an example of a first resist pattern. An anti-reflection film may be formed under or on the resist pattern 74. The element isolation insulating films 12 in the select transistor region 1 and the memory transistor region 2 are formed so as to extend parallel to a bit line direction. Thus, the resist pattern 74 has openings which extend parallel to the bit line direction. The resist pattern 74 covers the select transistor region 1 and the memory transistor region 2 except the element isolation insulating films 12, the first logic region 3, and the second logic region 4.

The steps illustrated in FIGS. 33A to 33E will be described. Anisotropic dry etching is performed using the resist pattern 74 as a mask under an etching condition with a low selection ratio, thereby etching the charge storage film 71. With this etching, the sacrificial oxide films 73 above the element isolation insulating films 12 in the memory transistor region 2 and the charge storage films 71 on the element isolation insulating films 12 in the memory transistor region 2 are removed. The anisotropic dry etching under the etching condition with the low selection ratio in each step illustrated in FIGS. 33A to 33E is an example of first etching. If a surface oxide film is formed on each charge storage film 71, the surface oxide film and the charge storage film 71 are removed.

The element isolation insulating films 12 in the select transistor region 1 and the memory transistor region 2 are formed so as to extend parallel to the bit line direction. Thus, the removal of the charge storage films 71 and the sacrificial oxide films 73 on the element isolation insulating films 12 in the memory transistor region 2 separates each of the charge storage film 71 and the sacrificial oxide film 73 in the memory transistor region 2 into a plurality of parts in a word line direction. Upper portions of the element isolation insulating films 12 in the select transistor region 1 and the memory transistor region 2 are partially removed. The etching condition with the low selection ratio and the type of an etching gas are the same as those in the first embodiment.

The openings of the resist pattern 74 are located above the element isolation insulating films 12. For this reason, although the element isolation insulating films 12 are shaved after the removal of the charge storage films 71 and the sacrificial oxide films 73, the semiconductor substrate 11 is not shaved. Thus, damage to the semiconductor substrate 11 is inhibited at the time of the removal of the charge storage films 71 on the element isolation insulating films 12 in the memory transistor region 2.

Under the etching condition with the low selection ratio, the etching gas does not include $O_2$ or the concentration of $O_2$ to be included in the etching gas is set to be low. This inhibits the resist pattern 74 from retreating due to the etching. In the case of, for example, a gaseous mixture of $CF_4$, Ar, and $O_2$, if the concentration of $O_2$ is not more than that of $CF_4$, the resist pattern 74 is inhibited from retreating due to the etching. The resist pattern 74 is then removed by, for example, chemical solution treatment using a sulfuric acid-hydrogen peroxide mixture (SPM) and an ammonia-hydrogen peroxide mixture (APM).

The steps illustrated in FIGS. 34A to 34E will be described. By performing wet etching using hydrofluoric acid, the tunnel oxide films 16 and the sacrificial oxide films 73 in the select transistor region 1, the first logic region 3, and the second logic region 4 are removed, and the sacrificial oxide films 73 in the memory transistor region 2 are removed. The wet etching using hydrofluoric acid in each step illustrated in FIGS. 34A to 34E is an example of third etching. If a surface oxide film is formed on each charge storage film 71, the tunnel oxide films 16 and the sacrificial oxide films 73 in the select transistor region 1, the first logic region 3, and the second logic region 4 and the sacrificial oxide films 73 and the surface oxide films in the memory transistor region 2 are removed. The heat treatment has been performed in each step illustrated in FIGS. 31A to 31E. Since the charge storage film 71 has a decreased etching rate with respect to hydrofluoric acid, the charge storage films 71 in the memory transistor region 2 are not removed. Additionally, since the charge storage film 71 is formed on each tunnel oxide film 16 in the memory transistor region 2, the tunnel oxide films 16 in the memory transistor region 2 are not removed.

The steps illustrated in FIGS. 35A to 35E will be described. An oxide film is formed by, for example, a radical oxidation method using $H_2$ gas and $O_2$ gas at a temperature of about not less than 400° C. and not more than 1100° C. The thickness of the oxide film is, for example, about not less than 5 nm and not more than 15 nm.

This oxide film formation causes gate oxide films (gate insulating films) 21 to be formed on the surface of the semiconductor substrate 11 in the select transistor region 1 and top oxide films (upper insulating films) 22 to be formed on the charge storage films 71 in the memory transistor region 2. The gate oxide film 21 and the top oxide film 22 are, for example, silicon oxide films. The oxide film formation also causes gate oxide films (gate insulating films) 23 to be formed on the surface of the semiconductor substrate 11 in the first logic region 3 and gate oxide films (gate insulating films) 24 to be formed on the surface of the semiconductor substrate 11 in the second logic region 4. The gate oxide films 23 and 24 are, for example, silicon oxide films. The oxide film formation further causes sidewalls of each charge storage film 71 in the memory transistor region 2 to be oxidized.

The oxide films may be formed by a plasma oxidation method instead of the radical oxidation method. The radical oxidation method or the plasma oxidation method is used to oxidize the surface of the semiconductor substrate 11 and the charge storage films 71 in the same step. The use of the radical oxidation method or the plasma oxidation method makes oxidation of the charge storage films 71 easier than use of another oxidation method, such as a thermal oxidation method. After the steps illustrated in FIGS. 35A to 35E, the same steps as those illustrated in FIGS. 11A to 18E in the first embodiment are performed. Since the steps illustrated in FIGS. 11A to 18E in the first embodiment have already been described, a description thereof will be omitted. Additionally, since the structure of a select transistor 51 and the structure of a memory transistor 52 in the third embodiment are the same as those in the first embodiment, a description thereof will be omitted.

According to the third embodiment, the charge storage film 71 is separated into a plurality of parts in the word line direction. That is, the charge storage films 71 of the adjacent memory transistors 52 are separate, and the charge storage films 71 of the adjacent memory transistors 52 are not connected to each other. Additionally, the sidewalls of the charge storage film 71 of each memory transistor 52 are oxidized, and the top oxide film 22 is formed so as to cover the charge storage film 71. With this configuration, charges are inhibited from being transferred between the charge storage films 71 of the adjacent memory transistors 52. Thus, charges stored (retained) in the charge storage film 71 of the memory transistor 52 are inhibited from changing, which allows inhibition of decrease in data retention. For example, even if the interval between the adjacent memory transistors 52 is short or if the charge storage film 71 with high charge mobility is used, charges stored in the charge storage film 71 are inhibited from changing, which allows inhibition of decrease in data retention.

The third embodiment may be modified in the manner below. A combination of the first to fourth modifications below may be applied to the semiconductor device manufacturing method and the semiconductor device according to the third embodiment.

First Modification of Third Embodiment

The steps illustrated in FIGS. 29A to 30E and the steps illustrated in FIGS. 32A to 33E may be interchanged. That is, the steps illustrated in FIGS. 32A to 33E may be performed after the steps illustrated in FIGS. 28A to 28E are performed, and the steps illustrated in FIGS. 29A to 30E may then be performed.

Second Modification of Third Embodiment

The steps illustrated in FIGS. 31A to 31E and the steps illustrated in FIGS. 32A to 33E may be interchanged. That is, the steps illustrated in FIGS. 32A to 33E may be performed after the steps illustrated in FIGS. 30A to 30E are performed, and the steps illustrated in FIGS. 31A to 31E may then be performed.

Third Modification of Third Embodiment

In the steps illustrated in FIGS. 30A to 30E, the charge storage film 71 may be etched by performing wet etching using hydrofluoric acid instead of anisotropic dry etching under the etching condition with the high selection ratio. That is, in the steps illustrated in FIGS. 30A to 30E, the charge storage films 71 in the select transistor region 1, the first logic region 3, and the second logic region 4 may be removed by performing wet etching using hydrofluoric acid, using the resist pattern 72 as a mask. Since the etching rate of a plasma silicon nitride film is high in the wet etching using hydrofluoric acid, the charge storage film 71 can be easily removed by the wet etching using hydrofluoric acid.

Fourth Modification of Third Embodiment

In the steps illustrated in FIGS. 28A to 28E, the charge storage film 71 may be formed on the element isolation insulating films 12 and on the tunnel oxide films 16 by a CVD method. In this case, the charge storage film 71 is a silicon nitride film. If the charge storage film 71 is a silicon nitride film, even when the heat treatment is performed by the radical oxidation method or the plasma oxidation method in the steps illustrated in FIGS. 31A to 31E, the etching rate of the charge storage film 71 with respect to hydrofluoric acid changes little. Note that since the etching rate of a silicon nitride film with respect to hydrofluoric acid is low, the charge storage films 71 in the memory transistor region 2 are not removed at the time of the wet etching using hydrofluoric acid in the steps illustrated in FIGS. 34A to 34E.

Fourth Embodiment

A semiconductor device manufacturing method and a semiconductor device according to a fourth embodiment will be described. The fourth embodiment will be described in the context of a semiconductor device having a flash memory and a logic circuit. As the process leading to steps of forming N-type wells 14 and P-type wells 15 in a semiconductor substrate 11 and ion-implanting an impurity for threshold voltage control into the semiconductor substrate 11 in the semiconductor device manufacturing method according to the fourth embodiment, the same steps as those illustrated in FIGS. 1 to 3E in the first embodiment are performed. Since the steps illustrated in FIGS. 1 to 3E in the first embodiment have already been described, a description thereof will be omitted.

FIGS. 36A, 36B, 36C, 37A, 37B, 37C, 38A, 38B, 38C, 39A, 39B, 39C, 40A, 40B, 40C, 41A, 41B, 41C, 42A, 42B, 42C, 43A, 43B, 43C, 44A, 44B, 44C, 45A, 45B, and 45C are cross-sectional views illustrating a semiconductor device manufacturing process according to the fourth embodiment and partial sectional views of a select transistor region 1 and a memory transistor region 2 of a semiconductor device. FIGS. 36A, 37A, 38A, 39A, 40A, 41A, 42A, 43A, 44A, and 45A correspond to a cross-section taken along alternate long and short dash line A-A' in FIG. 1. FIGS. 36B, 37B, 38B, 39B, 40B, 41B, 42B, 43B, 44B, and 45B correspond to a cross-section taken along alternate long and short dash line B-B' in FIG. 1. FIGS. 36C, 37C, 38C, 39C, 40C, 41C, 42C, 43C, 44C, and 45C correspond to a cross-section taken along alternate long and short dash line C-C' in FIG. 1. FIGS. 36D, 36E, 37D, 37E, 38D, 38E, 39D, 39E, 40D, 40E, 41D, 41E, 42D, 42E, 43D, 43E, 44D, 44E, 45D, and 45E are cross-sectional views illustrating the semiconductor device manufacturing process according to the fourth embodiment and partial sectional views of a logic region of the semiconductor device.

The steps illustrated in FIGS. 36A to 36E will be described. After sacrificial oxide films 13 are removed by wet etching using hydrofluoric acid (HF), tunnel oxide films (lower insulating films) 16 are formed on a surface of the semiconductor substrate 11. The tunnel oxide films 16 are formed by, for example, a thermal oxidation method, a radical oxidation method, a plasma oxidation method, or a CVD method. The tunnel oxide film 16 is, for example, a silicon oxide film. The thickness of the tunnel oxide film 16 is, for example, about not less than 2 nm and not more than 15 nm. A charge storage film 81 is formed on element isolation insulating films 12 and on the tunnel oxide films 16 by a plasma CVD method. The charge storage film 81 is an example of a second film. The charge storage film 81 is, for example, a plasma silicon nitride film (P—SiN film). The thickness of the charge storage film 81 is, for example, about not less than 5 nm and not more than 30 nm. The plasma CVD method uses, for example, a gaseous mixture of $SiH_4$, $NH_3$, and $N_2$. The plasma CVD method may use, for example, a gaseous mixture of $SiH_4$ and $N_2$ or a gaseous mixture of $SiH_4$ and $NH_3$. Alternatively, a surface oxide film (not illustrated) may then be formed on the charge storage film 81 by, for example, a plasma oxidation method. The formation of the surface oxide film is dispensable and may be omitted.

The steps illustrated in FIGS. 37A to 37E will be described. A resist pattern 82 which covers the memory transistor region 2 and is open in the select transistor region 1, a first logic region 3, and a second logic region 4 is formed above the semiconductor substrate 11 by, for example, photolithography. The resist pattern 82 is an example of a second resist pattern. The thickness of the resist pattern 82 is, for example, about not less than 300 nm and not more than 1000 nm. An anti-reflection film may be formed under or on the resist pattern 82.

The steps illustrated in FIGS. 38A to 38E will be described. Anisotropic dry etching is performed using the resist pattern 82 as a mask under an etching condition with a high selection ratio, thereby etching the charge storage film 81. With this etching, the charge storage films 81 in the select transistor region 1, the first logic region 3, and the second logic region 4 are removed. The anisotropic dry etching under the etching condition with the high selection ratio in each step illustrated in FIGS. 38A to 38E is an example of second etching. If a surface oxide film is formed on each charge storage film 81, the surface oxide film and the charge storage film 81 are removed. The etching condition with the high selection ratio and the type of an etching gas are the same as those in the first embodiment. Since the tunnel oxide films 16 function as etching stopper films, the etching stops at the tunnel oxide films 16, which inhibits damage to the semiconductor substrate 11. The resist pattern 82 is then removed by, for example, chemical solution treatment using a sulfuric acid-hydrogen peroxide mixture (SPM) and an ammonia-hydrogen peroxide mixture (APM).

The steps illustrated in FIGS. 39A to 39E will be described. A resist pattern 83 which is open above the element isolation insulating films 12 in the select transistor region 1 and the memory transistor region 2 is formed above the semiconductor substrate 11 by, for example, photolithography. The resist pattern 83 is an example of a first resist pattern. An anti-reflection film may be formed under or on the resist pattern 83. The element isolation insulating films 12 in the select transistor region 1 and the memory transistor region 2 are formed so as to extend parallel to a bit line direction. Thus, the resist pattern 83 has openings which extend parallel to the bit line direction. The resist pattern 83 covers the select transistor region 1 and the memory transistor region 2 except the element isolation insulating films 12, the first logic region 3, and the second logic region 4.

The steps illustrated in FIGS. 40A to 40E will be described. Anisotropic dry etching is performed using the resist pattern 83 as a mask under an etching condition with a low selection ratio, thereby etching the charge storage film 81. With this etching, the charge storage films 81 on the element isolation insulating films 12 in the memory transistor region 2 are removed. The anisotropic dry etching under the etching condition with the low selection ratio in each step illustrated in FIGS. 40A to 40E is an example of first etching. If a surface oxide film is formed on each charge storage film 81, the surface oxide film and the charge storage film 81 are removed.

The element isolation insulating films 12 in the select transistor region 1 and the memory transistor region 2 are formed so as to extend parallel to the bit line direction. Thus, the removal of the charge storage films 81 on the element isolation insulating films 12 in the memory transistor region 2 separates the charge storage film 81 in the memory transistor region 2 into a plurality of parts in a word line direction. Upper portions of the element isolation insulating films 12 in the select transistor region 1 and the memory transistor region 2 are partially removed. The etching condition with the low selection ratio and the type of an etching gas are the same as those in the first embodiment.

The openings of the resist pattern 83 are located above the element isolation insulating films 12. For this reason, although the element isolation insulating films 12 are shaved after the removal of the charge storage film 81, the semiconductor substrate 11 is not shaved. Thus, damage to the semiconductor substrate 11 is inhibited at the time of the removal of the charge storage films 81 on the element isolation insulating films 12 in the memory transistor region 2.

Under the etching condition with the low selection ratio, the etching gas does not include $O_2$ or the concentration of $O_2$ to be included in the etching gas is set to be low. This inhibits the resist pattern 83 from retreating due to the etching. In the case of, for example, a gaseous mixture of $CF_4$, Ar, and $O_2$, if the concentration of $O_2$ is not more than that of $CF_4$, the resist pattern 83 is inhibited from retreating due to the etching. The resist pattern 83 is then removed by, for example, chemical solution treatment using a sulfuric acid-hydrogen peroxide mixture (SPM) and an ammonia-hydrogen peroxide mixture (APM).

The steps illustrated in FIGS. 41A to 41E will be described. Annealing is performed, for example, under the condition in an atmosphere of nitrogen ($N_2$) at about 750° C. for about 90 seconds. Alternatively, the annealing may be performed under the condition in an atmosphere of nitrogen at about 800° C. for about 30 seconds. A thermal oxidation method, a radical oxidation method, or a plasma oxidation method may be performed instead of the annealing. Heat treatment through the annealing, the thermal oxidation method, the radical oxidation method, or the plasma oxidation method decreases the etching rate of a plasma silicon nitride film with respect to hydrofluoric acid.

The steps illustrated in FIGS. 42A to 42E will be described. The tunnel oxide films 16 in the select transistor region 1, the first logic region 3, and the second logic region 4 are removed by performing wet etching using hydrofluoric acid. If a surface oxide film is formed on each charge storage film 81, the tunnel oxide films 16 and the surface oxide films in the select transistor region 1, the first logic region 3, and the second logic region 4 are removed. The heat treatment has been performed in each step illustrated in FIGS. 41A to 41E. Since the charge storage film 81 has a decreased etching rate with respect to hydrofluoric acid, the charge storage films 81 in the memory transistor region 2 are not removed. Additionally, since the charge storage film 81 is formed on each tunnel oxide film 16 in the memory transistor region 2, the tunnel oxide films 16 in the memory transistor region 2 are not removed.

The steps illustrated in FIGS. 43A to 43E will be described. An oxide film is formed by a radical oxidation method or a plasma oxidation method with the semiconductor substrate 11 set to a high temperature. The oxide film thus formed at a high temperature is also called an HTO (High Temperature Oxide). As a film formation gas, TEOS (Tetraethyl Orthosilicate) gas may be used. The oxide film may be formed by a CVD method, instead of the radical oxidation method or the plasma oxidation method. This oxide film formation causes gate oxide films (gate insulating films) 84 to be formed on the surface of the semiconductor substrate 11 in the select transistor region 1. The oxide film formation also causes top oxide films (upper insulating films) 85 to be formed on the charge storage films 81 in the memory transistor region 2 and oxide films to be formed at sidewalls of each charge storage film 81 in the memory transistor region 2. The top oxide film 85 is an example of a third film. The oxide film formation further causes the oxide films 84 to be formed on the surface of the semiconductor substrate 11 in the first logic region 3 and on the surface of the semiconductor substrate 11 in the second logic region 4. If such oxide films are formed using the CVD method, the oxide films 84 are also formed on the element isolation insulating films 12 in the select transistor region 1, the memory transistor region 2, the first logic region 3, and the second logic region 4. The oxide film 84 is an example of a first oxide film.

The steps illustrated in FIGS. 44A to 44E will be described. A resist pattern 86 which covers the memory transistor region 2 and is open in the select transistor region 1, the first logic region 3, and the second logic region 4 is formed above the semiconductor substrate 11 by, for example, photolithography. An anti-reflection film may be formed under or on the resist pattern 86. The oxide films 84 in the select transistor region 1, the first logic region 3, and the second logic region 4 are removed by performing wet etching using hydrofluoric acid, using the resist pattern 86 as a mask. The resist pattern 86 is then removed by, for example, chemical solution treatment using a sulfuric acid-hydrogen peroxide mixture (SPM) and an ammonia-hydrogen peroxide mixture (APM).

The steps illustrated in FIGS. 45A to 45E will be described. An oxide film is formed by, for example, a radical oxidation method using $H_2$ gas and $O_2$ gas at a temperature of about not less than 400° C. and not more than 1100° C. The thickness of the oxide film is, for example, about not less than 1 nm and not more than 15 nm.

This oxide film formation causes gate oxide films (gate insulating films) 21 to be formed on the surface of the semiconductor substrate 11 in the select transistor region 1. The gate oxide film 21 is, for example, a silicon oxide film. The oxide film formation also causes gate oxide films (gate insulating films) 23 to be formed on the surface of the semiconductor substrate 11 in the first logic region 3 and gate oxide films (gate insulating films) 24 to be formed on the surface of the semiconductor substrate 11 in the second logic region 4. The gate oxide films 23 and 24 are, for example, silicon oxide films. The oxide films may be formed by a plasma oxidation method instead of the radical oxidation method. After the steps illustrated in FIGS. 45A to 45E, the same steps as those illustrated in FIGS. 11A to 18E in the first embodiment are performed. Since the steps illustrated in FIGS. 11A to 18E in the first embodiment have already been described, a description thereof will be omitted. Additionally, since the structure of a select transistor 51 and the structure of a memory transistor 52 in the fourth embodiment are the same as those in the first embodiment, a description thereof will be omitted.

According to the fourth embodiment, the charge storage film 81 is separated into a plurality of parts in the word line direction. That is, the charge storage films 81 of the adjacent memory transistors 52 are separate, and the charge storage films 81 of the adjacent memory transistors 52 are not connected to each other. Additionally, the sidewalls of the charge storage film 81 of each memory transistor 52 are oxidized, and the top oxide film 85 is formed so as to cover the charge storage film 81. With this configuration, charges are inhibited from being transferred between the charge storage films 81 of the adjacent memory transistors 52. Thus, charges stored (retained) in the charge storage film 81 of the memory transistor 52 are inhibited from changing, which allows inhibition of decrease in data retention. For example, even if the interval between the adjacent memory transistors 52 is short or if the charge storage film 81 with high charge mobility is used, charges stored in the charge storage film 81 are inhibited from changing, which allows inhibition of decrease in data retention.

According to the fourth embodiment, the thickness of the gate oxide film 21 of the select transistor 51 and the thickness of the top oxide film 85 of the memory transistor 52 can be made independent of each other. That is, according to the fourth embodiment, the thickness of the gate oxide film 21 of the select transistor 51 and the thickness of the top oxide film 85 of the memory transistor 52 can be controlled to different values.

The fourth embodiment may be modified in the manner below. A combination of the first to fourth modifications below may be applied to the semiconductor device manufacturing method and the semiconductor device according to the fourth embodiment.

First Modification of Fourth Embodiment

The steps illustrated in FIGS. 37A to 38E and the steps illustrated in FIGS. 39A to 40E may be interchanged. That is, the steps illustrated in FIGS. 39A to 40E may be performed after the steps illustrated in FIGS. 36A to 36E are performed, and the steps illustrated in FIGS. 37A to 38E may then be performed.

Second Modification of Fourth Embodiment

The steps illustrated in FIGS. 39A to 40E and the steps illustrated in FIGS. 41A to 41E may be interchanged. That is, the steps illustrated in FIGS. 41A to 41E may be performed after the steps illustrated in FIGS. 38A to 38E are performed, and the steps illustrated in FIGS. 39A to 40E may then be performed.

Third Modification of Fourth Embodiment

In the steps illustrated in FIGS. 38A to 38E, the charge storage film 81 may be etched by performing wet etching using hydrofluoric acid instead of anisotropic dry etching under the etching condition with the high selection ratio. That is, in the steps illustrated in FIGS. 38A to 38E, the charge storage films 81 in the select transistor region 1, the first logic region 3, and the second logic region 4 may be removed by performing wet etching using hydrofluoric acid, using the resist pattern 82 as a mask. Since the etching rate of a plasma silicon nitride film is high in the wet etching using hydrofluoric acid, the charge storage film 81 can be easily removed by the wet etching using hydrofluoric acid.

Fourth Modification of Fourth Embodiment

In the steps illustrated in FIGS. 36A to 36E, the charge storage film 81 may be formed on the element isolation insulating films 12 and on the tunnel oxide films 16 by a CVD method. In this case, the charge storage film 81 is a silicon nitride film. If the charge storage film 81 is a silicon nitride film, even when the heat treatment is performed by the annealing, the thermal oxidation method, the radical oxidation method, or the plasma oxidation method in the steps illustrated in FIGS. 41A to 41E, the etching rate of the charge storage film 81 with respect to hydrofluoric acid changes little. Note that since the etching rate of a silicon nitride film with respect to hydrofluoric acid is low, the charge storage films 81 in the memory transistor region 2 are not removed at the time of the wet etching using hydrofluoric acid in the steps illustrated in FIGS. 42A to 42E.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

What is claimed is:

1. A semiconductor device manufacturing method comprising:
    forming an element isolation insulating film in a semiconductor substrate;
    forming a first film on a surface of the semiconductor substrate;
    forming a second film on the element isolation insulating film and on the first film;
    forming a first resist pattern that includes a first open above the element isolation insulating film in a first region;
    removing the second film on the element isolation insulating film in the first region to separate the second film in the first region into a plurality of parts by performing first etching using the first resist pattern as a mask;
    forming a third film on the second film in the first region after removing the first resist pattern;
    forming a first gate electrode on the third film in the first region; and
    forming a first insulating film that includes the first film, the second film, and the third film under the first gate electrode by patterning the first film, the second film, and the third film using the first gate electrode as a mask.

2. The semiconductor device manufacturing method according to claim 1, further comprising:
    forming a second resist pattern that covers the first region and includes a second open in a second region after the forming the second film and before the forming the third film;
    removing the second film in the second region by performing second etching using the second resist pattern as a mask; and
    removing the first film in the second region by performing third etching after removing the second resist pattern,
    wherein a fourth film is formed on the surface of the semiconductor substrate in the second region in the forming the third film, and
    a second gate electrode is formed on the fourth film in the second region in the forming the first gate electrode.

3. The semiconductor device manufacturing method according to claim 1, wherein a first oxide film is formed on the surface of the semiconductor substrate in a second region in the forming the third film, the semiconductor device manufacturing method further comprising:
    forming a second resist pattern which covers the first region and is open in the second region after the forming the second film and before the forming the third film;
    removing the second film in the second region by performing second etching using the second resist pattern as a mask;
    removing the first film in the second region by performing third etching after removing the second resist pattern;
    forming a third resist pattern which covers the first region and that includes second open in the second region after the forming the third film;
    removing the first oxide film in the second region by performing fourth etching using the third resist pattern as a mask; and
    forming a fourth film on the surface of the semiconductor substrate in the second region,
    wherein a second gate electrode is formed on the fourth film in the second region in the forming the first gate electrode.

4. The semiconductor device manufacturing method according to claim 2, wherein the second etching is performed under an etching condition with an etching rate of the second film higher than an etching rate of the first film.

5. The semiconductor device manufacturing method according to claim 2, further comprising:
    performing heat treatment after the removing the second film in the second region and before the removing the first film in the second region,
    wherein the second film includes a silicon nitride film that is formed by a plasma CVD method, and
    the second etching and the third etching are each wet etching using hydrofluoric acid.

6. The semiconductor device manufacturing method according to claim 2, further comprising:
    forming a second oxide film on the first film and on the second film after the removing the second film in the second region and before the removing the first film in the second region.

7. The semiconductor device manufacturing method according to claim 1, wherein the first etching is performed under an etching condition with an etching rate of the second film higher than an etching rate of the first film.

8. The semiconductor device manufacturing method according to claim 1, wherein the first etching is performed under an etching condition with a first selection ratio that is an etching rate of the second film to an etching rate of the first film,
 the second etching is performed under an etching condition with a second selection ratio that is an etching rate of the second film to an etching rate of the first film, and
 the first selection ratio is smaller than the second selection ratio.

* * * * *